(12) United States Patent
Honda

(10) Patent No.: US 7,677,905 B2
(45) Date of Patent: Mar. 16, 2010

(54) ELECTRONIC DEVICE AND MANUFACTURING METHOD OF THE SAME

(75) Inventor: Takayoshi Honda, Nagoya (JP)

(73) Assignee: DENSO CORPORATION, Kariya (JP)

( * ) Notice: Subject to any disclaimer, the term of this patent is extended or adjusted under 35 U.S.C. 154(b) by 147 days.

(21) Appl. No.: 11/979,968

(22) Filed: Nov. 13, 2007

(65) Prior Publication Data

US 2008/0146051 A1    Jun. 19, 2008

(30) Foreign Application Priority Data

Dec. 13, 2006  (JP)  ............................. 2006-336153
Jan. 8, 2007   (JP)  ............................. 2007-000888
Feb. 15, 2007  (JP)  ............................. 2007-035330
Jun. 4, 2007   (JP)  ............................. 2007-148613

(51) Int. Cl.
*H01R 12/00* (2006.01)

(52) U.S. Cl. ........................................ 439/83; 439/567

(58) Field of Classification Search .................. 439/79, 439/83, 567

See application file for complete search history.

(56) References Cited

U.S. PATENT DOCUMENTS

| 4,436,358 A | * | 3/1984 | Coldren et al. ................. 439/83 |
| 4,632,475 A | * | 12/1986 | Tomita ............................ 439/1 |
| 4,978,307 A | * | 12/1990 | Billman et al. ................. 439/83 |
| 5,076,795 A | * | 12/1991 | Krupp et al. ................... 439/79 |
| 5,078,611 A | * | 1/1992 | Tanigawa et al. .............. 439/78 |
| 5,451,158 A | | 9/1995 | Lin et al. |
| 5,647,749 A | | 7/1997 | Atoh et al. |
| 6,081,998 A | | 7/2000 | Terauchi et al. |
| 6,409,523 B1 | * | 6/2002 | Shih ............................... 439/83 |
| 6,655,990 B2 | * | 12/2003 | Terauchi et al. ............. 439/567 |
| 7,192,313 B2 | | 3/2007 | Sai |
| 7,207,809 B2 | | 4/2007 | Sasaki et al. |
| 7,341,462 B2 | | 3/2008 | Matsuoka et al. |
| 7,367,818 B2 | | 5/2008 | Sakamoto |
| 7,578,681 B2 | * | 8/2009 | Honda et al. ................... 439/83 |

(Continued)

FOREIGN PATENT DOCUMENTS

JP   U-59-084831   6/1984

(Continued)

OTHER PUBLICATIONS

U.S. Appl. No. 11/979,972, filed Nov. 13, 2007, Honda.

(Continued)

*Primary Examiner*—Truc T Nguyen
(74) *Attorney, Agent, or Firm*—Posz Law Group, PLC

(57) ABSTRACT

An electronic device includes a printed circuit board with multiple lands and through holes and an electronic element with multiple terminals on the board. Each terminal is coupled with the land through a solder. The lands include a surface land on the board and an insertion land on a sidewall of the through hole. The terminals include a branch terminal having an insertion member and a surface member. The insertion member is coupled with the insertion land through the solder. The surface member is coupled with the surface land through the solder. The surface member is parallel to the printed circuit board. The insertion member is perpendicular to the printed circuit board. The insertion member extends from a part of the surface member, which faces the surface land and disposed above the through hole.

34 Claims, 34 Drawing Sheets

U.S. PATENT DOCUMENTS

2007/0193774 A1    8/2007    Ito et al.

FOREIGN PATENT DOCUMENTS

| JP | A-07-153508 | 6/1995 |
|---|---|---|
| JP | A-09-069371 | 3/1997 |
| JP | A-11-317265 | 11/1999 |
| JP | A-2000-077120 | 3/2000 |
| JP | A-2000-164273 | 6/2000 |
| JP | A-2005-327643 | 11/2005 |
| JP | A-2006-100408 | 4/2006 |

OTHER PUBLICATIONS

Office Action dated Nov. 17, 2008 in related U.S. patent application No. 11/979,972.

Notice of Allowance dated Mar. 31, 2009 in related U.S. Appl. No. 11/979,972.

* cited by examiner

FIG. 11A
FIG. 11B
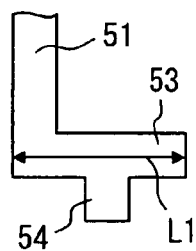
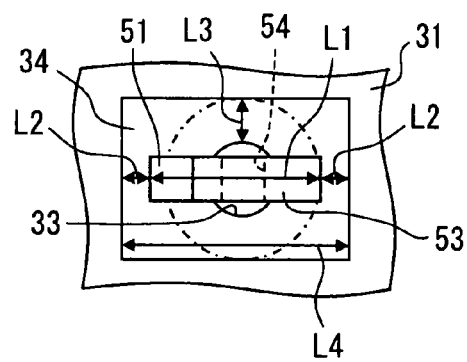
FIG. 12A
FIG. 12B
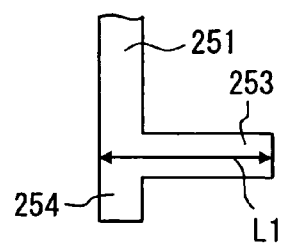
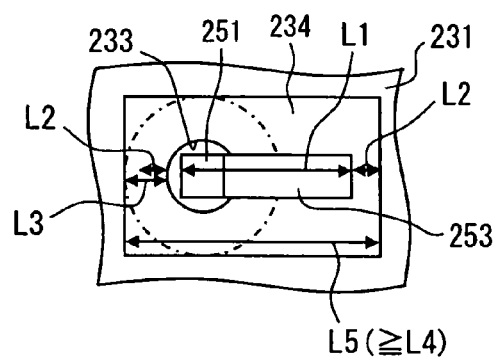
FIG. 13
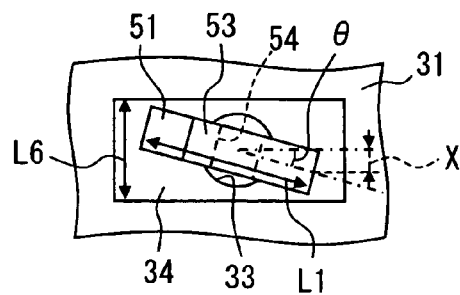

ELECTRONIC DEVICE AND MANUFACTURING METHOD OF THE SAME

CROSS REFERENCE TO RELATED APPLICATIONS

This application is based on Japanese Patent Applications No. 2006-232602 filed on Aug. 29, 2006, No. 2006-336153 filed on Dec. 13, 2006, No. 2007-888 filed on Jan. 8, 2007, No. 2007-35330 filed on Feb. 15, 2007 and No. 2007-148613 filed on Jun. 4, 2007, the disclosures of which are incorporated herein by reference. This application is also related to U.S. application Ser. No. 11/979,972, entitled "ELECTRONIC DEVICE," filed simultaneously on Nov. 13, 2007 with the present application.

FIELD OF THE INVENTION

The present invention relates to an electronic device and a method for manufacturing an electronic device.

BACKGROUND OF THE INVENTION

Conventionally, as an electronic device manufactured by mounting electronic components such as a connector on a printed circuit board, a device having an insertion-mounting structure is known. In this structure, a terminal of an electronic component is inserted in a through hole of a printed circuit board, and the terminal is solder-bonded to a land provided on a wall surface and a periphery of the opening of the through hole, for example, disclosed in JP-2005-327643A. Further, an electronic device having a surface mounting structure is known. In this structure, a terminal of an electronic component is solder-bonded to a land provided on the surface of a printed circuit board, for example, disclosed in JP-2006-256448A corresponding to U.S. Pat. No. 7,192,313, FIG. 12.

In the case of an electronic device having the insertion-mounting structure, it is necessary to perform flow soldering (including local flow) using molten solder jet flow. In the printed circuit board, on the rear surface of electronic component mounting surface, an area exposed to the molten solder and an area interfering with a nozzle to jet-flow the molten solder are not employed as an electronic component mounting area. That is, as the area in which electronic-component mounting is disabled is large, the electronic component packaging density cannot be improved without difficulty in the whole (both surfaces) of the printed circuit board.

In the case of the electronic device having the surface mounting structure, as flow soldering is not required, the electronic component packaging density can be improved. However, as reflow process is performed while a terminal is placed on a corresponding land, in a status before the solder is cooled and solidified (molten solder status), a positional shift often occurs between the terminal and the corresponding land. For example, upon reflow process, when deformation (warp or the like) occurs in the printed circuit board (housing of the electronic component) due to a difference between linear expansion coefficients of the printed circuit board and the electronic component, there is a probability of positional shift between a terminal and a land or falling of the terminal from the land. Further, in accordance with increase in the number of terminals, it becomes difficult to ensure co-planarity in connection portions between the terminals and the lands. Further, it is further difficult to ensure connection all the terminals and corresponding lands due to the influence of warp of the printed circuit board or the like. That is, this structure has a problem in the point of connection reliability.

On the other hand, JP-11-111407A corresponding to U.S. Pat. No. 6,081,998 (especially in FIGS. 14 to 17) discloses a connector which has a lead pin (branch terminal) having an end (insertion member) which can be inserted in a hole (through hole) in a printed circuit board and a soldering member (surface member) formed in a position away from the end by a predetermined distance. Further, JP-11-317265A discloses a print wiring board mounting structure integrally having a horizontal projection (surface member) bonded to the surface of a lead connecting land (surface land) of a printed wiring board (printed circuit board) and a vertical projection (insertion member) inserted in a through hole of the printed wiring board, at an end of a lead (branch terminal) of an electronic component. In these applications, reflowing on the insertion member is not required. The surface member is solder-bonded to the corresponding surface land while the insertion member is inserted in the through hole.

However, in JP-11-111407A and JP-11-317265A, in the terminal, an end area of a portion extended from the connector housing in approximately vertical state with respect to the printed circuit board is employed as the insertion member, and a portion extending from the portion approximately vertical to the printed circuit board, in approximately parallel to the flat surface of the printed circuit board is employed as the surface member. That is, the surface member forming the branch terminal and the insertion member form an L-shaped structure. In this L-shaped structure, a side fillet is formed only in one position of the end of the surface member. Further, the amount of positional shift with the insertion member as a rotational axis is large. To ensure connection reliability, the packaging density may be lowered.

Further, in JP-11-111407A, as the insertion member is not solder-bonded, to ensure desired connection reliability, it is necessary to increase the surface member to increase a contact area with respect to the solder. Accordingly, in the point of electronic component packaging density on the electronic component mounting side, by extension, in the point of entire (both surfaces) circuit board, the electronic component packaging density cannot be improved without difficulty.

Further, in JP-11-317265A, the inner surface of the through hole is coated with conductive material, and the insertion member is inserted in the through hole such that the end of the insertion member is exposed on the rear surface side of the connector mounting surface of the printed circuit board. In this structure, a large amount of solder on the surface land flows in the through hole by the capillary phenomenon. Accordingly, a fillet (side fillet) cannot be excellently formed on the surface member in accordance with size of the surface land. Further, voids (bubbles) might be formed in the solder flowed in the through hole. To avoid this problem (to ensure connection reliability), it is necessary to increase the surface land (surface member). Also, the electronic component packaging density cannot be improved without difficulty.

Thus, it is required for the electronic device capable of improvement in connection reliability and packaging density.

Further, an electronic device, in which electronic components such as a connector having plural terminals arrayed along the surface of a printed circuit board are reflow-mounted on the printed circuit board having lands with respect to a main body formed of insulating material, is known. As such electronic device, JP-11-317265A and JP-7-153508A (including FIG. 4) disclose an electronic device in which electronic components are reflow-mounted on a printed circuit board having plural lines of lands provided along an array direction of terminals. By using this structure, the main body can be downsized in the array direction of the terminals.

However, according to JP-11-317265A and JP-7-153508A, a terminal connected with a land positioned away from the main body disturbs supply of reflowing heat to a terminal connected with a land positioned closer to the main body (junction with the land) than the above land. For example, in the structure disclosed in JP-7-153508A, the terminal has a structure where a portion on the side connected with the land is extended approximately parallel to the printed circuit board from the main body, and the end of the parallel portion is bent to be vertical to the surface of the printed circuit board, and a portion mounted on the land is provided at the end of the vertical portion. Further, the height of the parallel portion of the terminal connected with the land positioned away from the main body is high from the surface of the printed circuit board, and the length of extension from the main body is long. Accordingly, upon reflowing, the terminal connected with the land positioned away from the main body blocks heat to the terminal connected with the land closer to the main body, and connection reliability may be lowered in the junction (soldering failure may occur). Especially, in the array direction of the terminals, as the interval between adjacent terminals is narrow, the connection reliability may be lowered. Thus, it is required to improve connection reliability.

SUMMARY OF THE INVENTION

In view of the above-described problem, it is an object of the present disclosure to provide an electronic device. It is another object of the present disclosure to provide a method for manufacturing an electronic device.

According to a first aspect of the present disclosure, an electronic device includes: a printed circuit board having a first side and a second side; and an electronic element having a body and a plurality of terminals. The plurality of terminals is aligned along with an alignment direction. The electronic element is disposed on the first side of the printed circuit board. The printed circuit board further includes a plurality of through holes and a plurality of lands. Each through hole penetrates the printed circuit board from the first side to the second side. Each terminal is coupled with a corresponding land through a solder. The plurality of lands includes at least one surface land disposed on the first side and an insertion land integrally disposed on a sidewall of the through hole and on a periphery around the through hole. The plurality of terminals includes a branch terminal having an insertion member and a surface member. The insertion member is inserted in the through hole in such a manner that the insertion member is coupled with the insertion land through the solder, which is supplied from the first side. The surface member is coupled with the surface land through the solder. The surface member is substantially parallel to a surface of the printed circuit board. The insertion member is perpendicular to the surface of the printed circuit board. The insertion member extends from a part of the surface member, which faces the surface land and disposed above the through hole.

In the above device, since the insertion member provides to position the electronic element on the printed circuit board, the connection reliability between the electronic element and the printed circuit board is improved. Since the solder is supplied in the through hole by, for example, a screen printing method, a flow soldering process is not necessary. Thus, the packing density can be improved.

According to a second aspect of the present disclosure, an electronic device includes: a printed circuit board having a first side and a second side; and an electronic element having a body and a plurality of terminals. The electronic element is disposed on the first side of the printed circuit board. The printed circuit board further includes a plurality of through holes and a plurality of lands. Each through hole penetrates the printed circuit board from the first side to the second side. Each terminal is coupled with a corresponding land through a solder. At least one of the lands includes a surface land disposed on the first side and an insertion land integrally disposed on a sidewall of the through hole and on a periphery around the through hole. The plurality of terminals includes a branch terminal having an insertion member and a surface member. The insertion member is inserted in the through hole in such a manner that the insertion member is coupled with the insertion land through the solder, which is supplied from the first side. The surface member is coupled with the surface land through the solder, and the insertion member has an end in the through hole, which is disposed on a same plane as the second side, or disposed between the first side and the second side.

In the above device, since the insertion member provides to position the electronic element on the printed circuit board, the connection reliability between the electronic element and the printed circuit board is improved. Since the solder is supplied in the through hole by, for example, a screen printing method, a flow soldering process is not necessary. Thus, the packing density can be improved.

According to a third aspect of the present disclosure, an electronic device includes: a printed circuit board having a first side and a second side; and an electronic element having a body and a plurality of terminals. The electronic element is disposed on the first side of the printed circuit board. The printed circuit board further includes a plurality of through holes and a plurality of lands. Each through hole penetrates the printed circuit board from the first side to the second side. Each terminal is coupled with a corresponding land through a solder. At least one of the lands includes a surface land disposed on the first side and an insertion land integrally disposed on a sidewall of the through hole and on a periphery around the through hole. The plurality of terminals includes a branch terminal having an insertion member and a surface member. The insertion member is inserted in the through hole in such a manner that the insertion member is coupled with the insertion land through the solder, which is supplied from the first side. The surface member is coupled with the surface land through the solder. The branch terminal further includes a plurality of long branch terminals and a plurality of short branch terminals. Each long branch terminal includes a long insertion member and a first surface member, and each short branch terminal includes a short insertion member and a second surface member. The short insertion member has a second end in the through hole, which is disposed on a same plane as the second side, or disposed between the first side and the second side. The long insertion member has a first end, which protrudes from the second side, and the number of the plurality of long branch terminals is smaller than the number of the plurality of short branch terminals.

In the above device, since the insertion member provides to position the electronic element on the printed circuit board, the connection reliability between the electronic element and the printed circuit board is improved. Since the solder is supplied in the through hole by, for example, a screen printing method, a flow soldering process is not necessary. Thus, the packing density can be improved.

According to a fourth aspect of the present disclosure, a method for manufacturing an electronic device having a printed circuit board and an electronic element, the method includes: preparing the printed circuit board having a first side and a second side, wherein the preparing the printed circuit board includes: forming a through hole in the printed circuit board to penetrate the printed circuit board from the first side to the second side; forming a surface land on the first side; and forming an insertion land on a sidewall of the through hole and on a periphery around the through hole; preparing the electronic element having a body and a plurality of terminals, wherein the preparing the electronic element includes: forming a branch terminal as one of the terminals on the electronic element; forming an insertion member in the branch terminal, the insertion member being to be inserted in the through hole and to be coupled with the insertion land; and forming a surface member in the branch terminal, the surface member being to be disposed on the surface land and to be coupled with the surface land; applying a solder, which includes: forming a solder on the surface land by a screen printing method; and inserting the solder in the through hole from the first side by the screen printing method so that the solder is formed on at least a part of the insertion land; and reflowing the solder, which includes: arranging the electronic element on the first side; inserting the insertion member in the through hole from the first side; and heating the solder to melt the solder so that the surface member is bonded to the surface land with the solder and the insertion member is bonded to the insertion land with the solder.

The above method provides the electronic device. In the device, since the insertion member provides to position the electronic element on the printed circuit board, the connection reliability between the electronic element and the printed circuit board is improved. Since the solder is supplied in the through hole by, for example, a screen printing method, a flow soldering process is not necessary. Thus, the packing density can be improved.

BRIEF DESCRIPTION OF THE DRAWINGS

The above and other objects, features and advantages of the present invention will become more apparent from the following detailed description made with reference to the accompanying drawings. In the drawings:

FIG. 11A is an expanded side view of the branch terminal for showing the advantage of improvement in packaging density;

FIG. 11B is an expanded plan view around the surface land for showing the advantage of improvement in the packaging density;

FIG. 12A is an expanded side view of the branch terminal in the electronic control device having an L-shape structured branch terminal as a comparative example;

FIG. 12B is an expanded plan view around the surface land in the electronic control device having the L-shape structured branch terminal as a comparative example;

FIG. 13 is an expanded plan view around the surface land, for showing the advantage of suppression of positional shift amount;

DETAILED DESCRIPTION OF THE PREFERRED EMBODIMENTS

Hereinbelow, embodiments of the present invention will be described based on the drawings. Note that in the respective embodiments, a connector is shown as an example of an electronic component including a branch terminal, and as an example of an electronic device in which electronic components are mounted on a printed circuit board, an electronic control device in which a connector is mounted on a printed circuit board is shown.

First Embodiment

Figure 1:
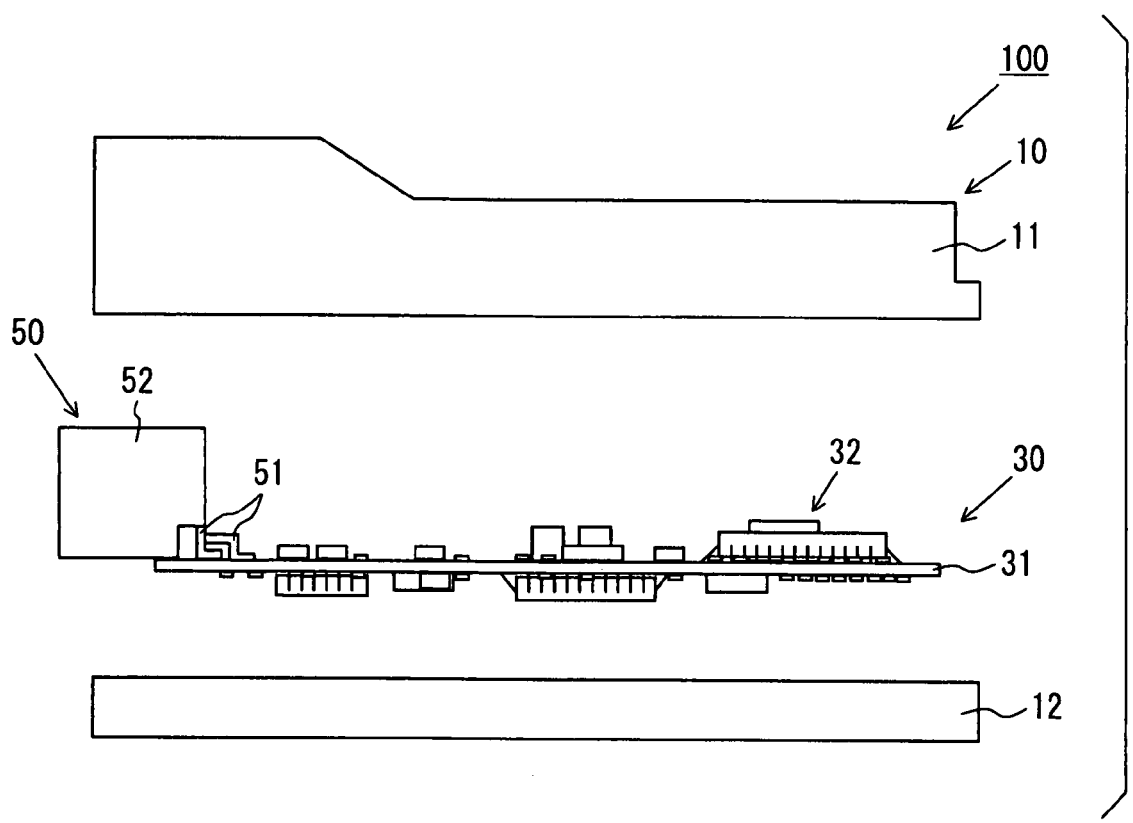
FIG. 1 is an exploded diagram showing a pre-assembly status for explanation of the schematic structure of an electronic control device according to a first embodiment.
Figure 2:
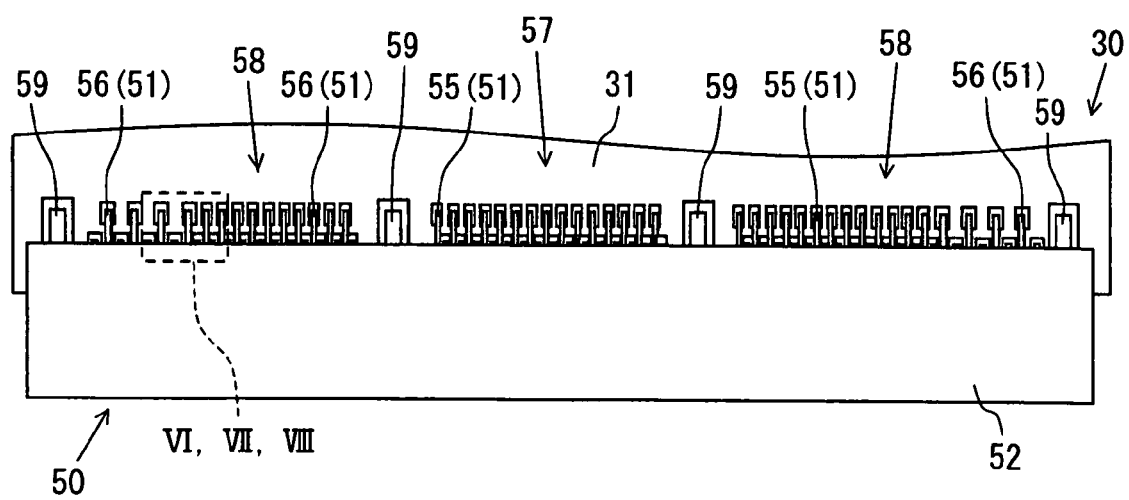
FIG. 2 is a plan view of a peripheral portion of a connector mounted on a printed circuit board.
Figure 3:
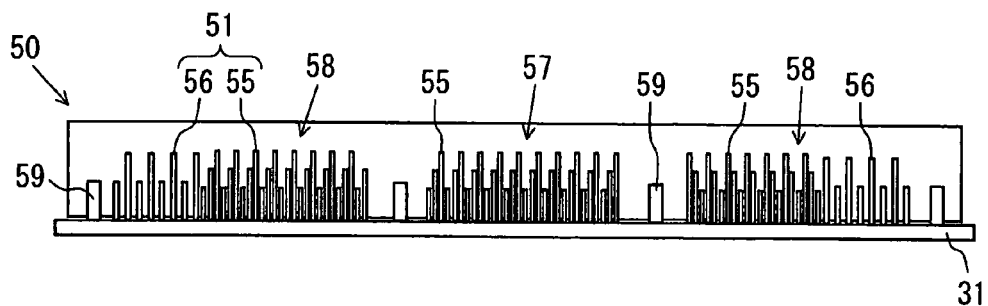
FIG. 3 is a plan view of the connector mounted on the printed circuit board viewed from the side of connection between the printed circuit board and terminals.
Figure 4:
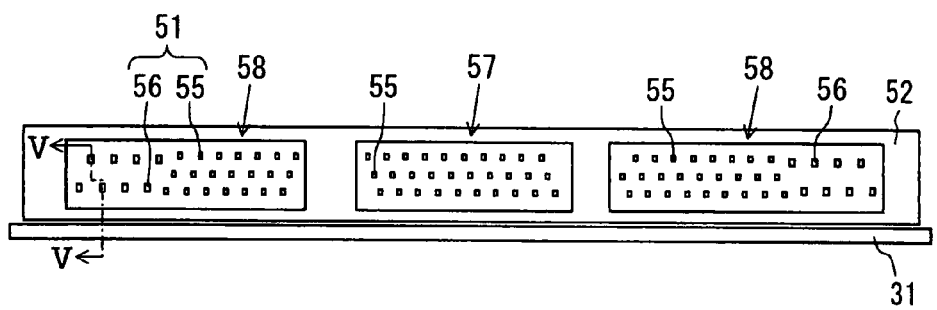
FIG. 4 is a plan view of the connector mounted on the printed circuit board viewed from the side of connection between the printed circuit board and external connectors.
Figure 5:
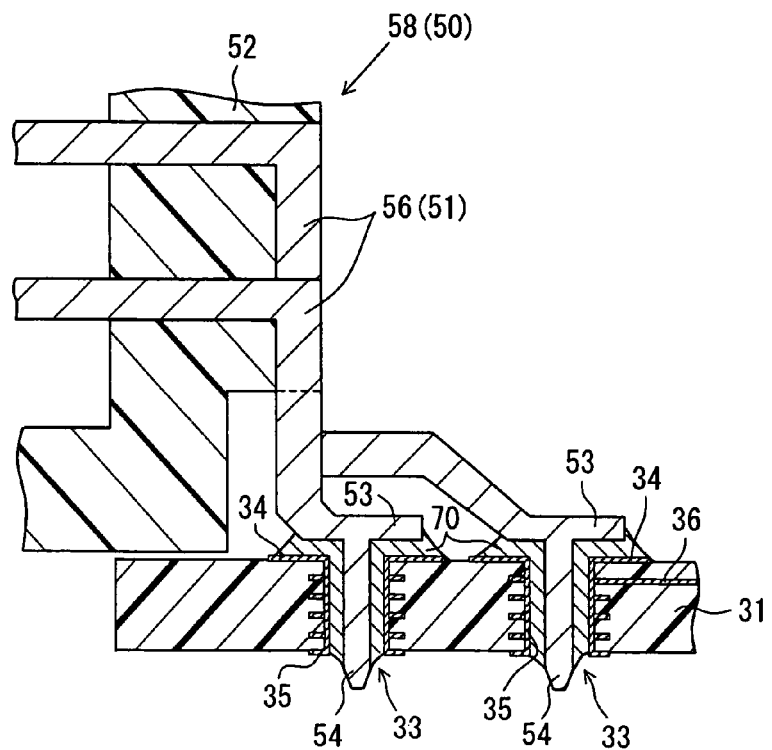
FIG. 5 is a cross-sectional view along a line V-V in FIG. 4.
Figure 6:
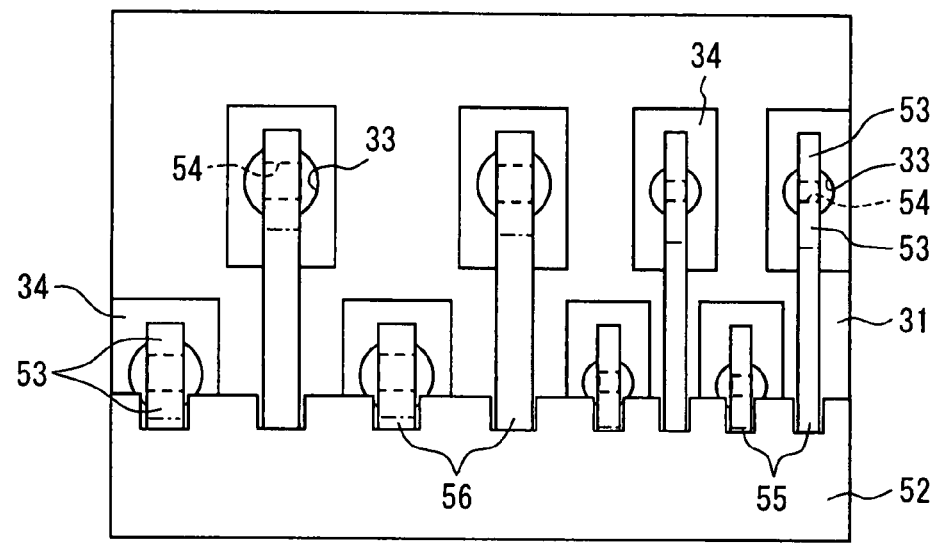
FIG. 6 is an expanded plan view of an area indicated with a broken line VI in FIG. 2 on the side of an electronic component mounting surface.
Figure 7:
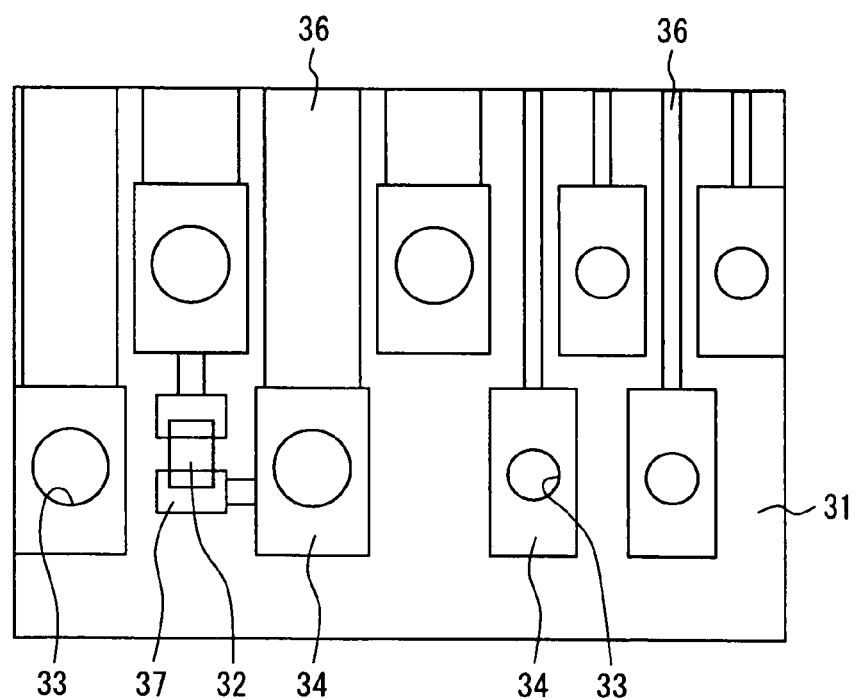
FIG. 7 is an expanded plan view of the electronic component mounting surface of the printed circuit board in the area indicated with the broken line VII in FIG. 2.
Figure 8:
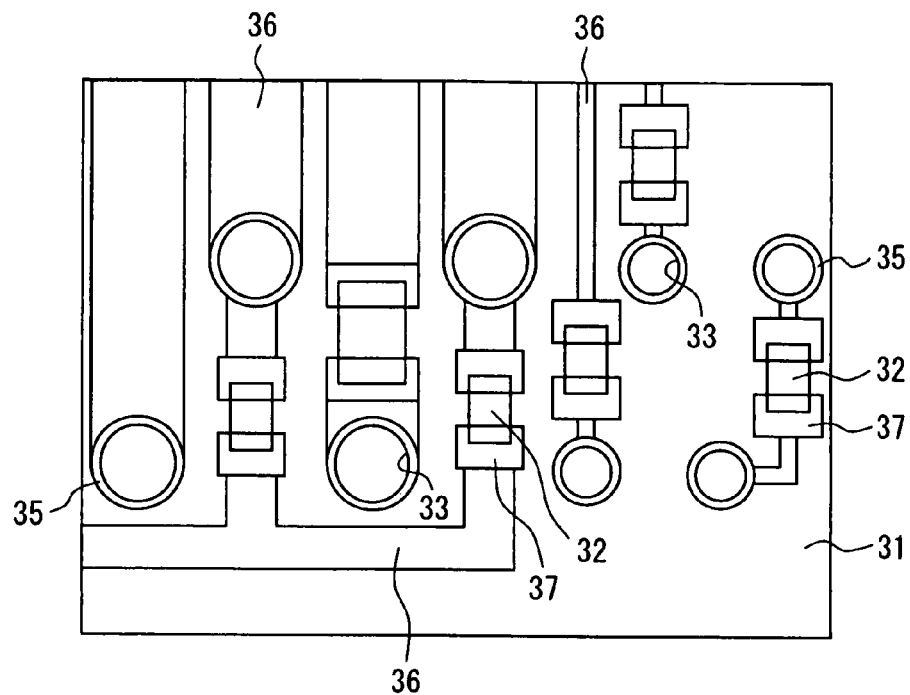
FIG. 8 is an expanded plan view of the rear surface side of the electronic component mounting surface of the printed circuit board in the area indicated with the broken line VIII in FIG. 2.

FIG. 1 is an exploded diagram showing a pre-assembly status for explanation of the schematic structure of an electronic control device according to a first embodiment. FIG. 2 is a plan view of a peripheral portion of a connector mounted on a printed circuit board. FIG. 3 is a plan view of the connector mounted on the printed circuit board viewed from the side of connection between the printed circuit board and terminals. FIG. 4 is a plan view of the connector mounted on the printed circuit board viewed from the side of connection between the printed circuit board and external connectors. FIG. 5 is a cross-sectional view along a line V-V in FIG. 4. FIG. 6 is an expanded plan view of an area indicated with a broken line in FIG. 2 on the side of an electronic component mounting surface. FIG. 7 is an expanded plan view of the electronic component mounting surface of the printed circuit board in the area indicated with the broken line in FIG. 2. FIG. 8 is an expanded plan view of the rear surface side of the electronic component mounting surface of the printed circuit board in the area indicated with the broken line in FIG. 2. Note that in FIG. 6, electronic components other than solder and the connector are omitted for the sake of convenience. In FIGS. 7 and 8, the solder and solder resist are omitted for the sake of convenience.

The electronic control device shown in the present embodiment has a non-watertight structure. The electronic control device is used as, e.g., a vehicle engine ECU (Electric Control Unit).

An electronic control device 100 shown in FIG. 1 corresponds to an electronic device. The electronic control device 100 includes, as primary elements, a circuit board 30 where electronic components 32 are mounted on a printed circuit board 31, and a connector 50, corresponding to an electronic component including a branch terminal, having terminals (a branch terminal 51 and a reinforcing terminal 59) and a housing 52. Further, in the present embodiment, the electronic control device 100 includes a casing 10 accommodating the circuit board 30 and a part of the connector 50.

The casing 10 is formed of metal material such as aluminum or iron or synthetic resin material. The casing 10 accommodates the circuit board 30 and a part of the connector 50. The number of the parts of the casing 10 is not particularly limited. The casing 10 may be formed with one part or with plural parts. In the present embodiment, as shown in FIG. 1, the casing 10 is formed with a box-shaped case 11 with one side opened, and a cover 12, shaped as an approximately rectangular flat plate, closing the opening of the case 11. The casing 10, having internal space to accommodate the circuit board 30 and a part of the connector 50, is formed by assembling the case 11 and the cover 12. Further, the casing 10 (case 11) is provided with a notch (not shown) corresponding to the connector 50. When the case 11 and the cover 12 are connected (not shown) so as to accommodate the circuit board 30, the circuit board 30 and a part of the connector 50 (including a side of the branch terminals 51 to be described later to be connected with the circuit board 30) are accommodated in the casing 10. The remaining part of the connector 50 (including a side of the branch terminals 51 to be connected with an external connector) are exposed outside the casing 10.

As shown in FIG. 1, in the circuit board 30, wirings including lands as electrodes, via holes for connecting the wirings and the like are formed on the printed circuit board 31. The electronic components 32 such as a microcomputer, a power transistor, a resistor and a capacitor are mounted on the printed circuit board 31. In the present embodiment, as one of the electronic components 32, the connector 50 electrically connecting the circuit board 30 with the outside is mounted on the printed circuit board 31.

As the materials of the printed circuit board 31, publicly-known materials such as thermoplastic resin, thermosetting resin, ceramic, and a glass (e.g. glass fabric)-resin compound material can be employed. Further, the number of layers of the printed circuit board 31 is not particularly limited. As shown in FIGS. 5 to 8, plural through holes 33 are formed from a mounting surface for the connector 50 (a surface on which the housing 52 is provided) to the rear side of the mounting surface. Among the terminals of the connector 50, a part of the branch terminal 51 are inserted in the through holes 33. Further, as lands mechanically and electrically connected with the branch terminal 51 via solder, surface lands 34 are respectively provided around the through holes on the connector mounting surface of the printed circuit board 31, and insertion lands 35 are respectively provided on wall surfaces of the through holes 33 and around openings of the through holes 33. Note that the surface lands 34 are provided to be mutually opposite with the through hole 33 therebetween.

In the present embodiment, as shown in FIG. 5, the surface land 34 and the insertion land 35 connected to the same one branch terminal 51 are integrated as one land on the connector mounting surface. In this structure, when one end of the surface land 34 on the far side from the insertion land 35 is fixed, a contact area between the surface land 34 and solder 70 can be increased. Further, when the contact area is the same, the size of the printed circuit board 31 can be reduced. In this manner, in the structure where the surface land 34 and the insertion land 35 are integrated, a portion of the insertion land 35 around the opening in the connector mounting surface is connected with the surface land 34. Accordingly, in the present embodiment, the land on the connector mounting surface is referred to as the surface land 34, and the opposed surface lands 34 with the through hole 33 therebetween have approximately the same length.

Note that in the present embodiment, as shown in FIG. 5, in the lands (the surface land 34 and the insertion land 35) connected to the same one branch terminal 51, the portion provided on the side of connector mounting surface of the printed circuit board (the surface land 34) is larger than the portion provided on the rear surface of the connector mounting surface (the portion of the insertion land 35 around the opening of the through hole 33). In this structure, in the printed circuit board 31 having the surface lands 34 and the insertion lands 35, in comparison with a structure where the portion provided on the rear surface of the connector mounting surface is larger than the portion provided on the side of the connector mounting surface of the printed circuit board 31 or the both portions are in the same size, a mounting disabled area for the electronic components 32 in the rear surface of the connector mounting surface can be reduced, and by extension, the printed circuit board 31 can be downsized.

Further, in the present embodiment, the plural surface lands 34 are zigzag-arranged on the printed circuit board 31 along a lengthwise direction of the housing 52 in correspondence with an array direction (the lengthwise direction of the housing 52) of the terminals (the branch terminals 51). The number of zigzag steps is not particularly limited. In the present embodiment, as shown in FIG. 7, the surface lands 34 are arranged in a two-step zigzag array in a direction away from the housing 52 of the connector 50. In this arrangement, in comparison with an arrangement in which the surface lands 34 are arrayed in one line, a large side fillet can be formed in the side surface of the branch terminal 51 in the array direction of the terminals (the branch terminals 51). As a result, the connection reliability can be improved. Further, the circuit board 30 can be downsized, and by extension, the electronic control device 100 can be downsized in the array direction of the terminals (the branch terminal 51). Further, in comparison with an arrangement in which the surface lands 34 are provided in a lattice type arrangement, the pattern of wirings 36 extended from the lands 34 and 35 can be simplified. Further, as shown in FIGS. 7 and 8, the other electronic components 32 than the connector 50 can be provided around the through hole 33 (the surface land 34). As such electronic components 32 provided around the through hole 33 (the surface land 34), a surge absorber capacitor, a phase locking resistor and the like can be effectively provided. Note that reference numeral 37 in FIGS. 7 and 8 denotes a surface land for mounting the electronic component 32.

Further, in the present embodiment, as shown in FIGS. 7 and 8, the printed circuit board 31 has two types of through holes 33 having different diameters. A small diameter through hole 33 corresponds to a first terminal 55 having a small diameter to be described later, and a large diameter through hole 33 corresponds to a second terminal 56 having a large diameter. That is, in the present embodiment, the sizes of the respective through holes 33 are set in consideration of the diameters of corresponding branch terminals 51 (55 and 56). Note that as described later, in the present embodiment, the first terminal 55 is a signal terminal for signal transmission, and the second terminal 56 is a power terminal for electric power transmission. Accordingly, in addition to the size of the through hole 33, the size of the surface land 34 and the width of the wiring 36 are set in correspondence with the amount of electric current.

In the connector 50, plural terminals of conductive material are arrayed in one direction along the flat surface of the printed circuit board 31 with respect to the housing 52 (corresponding to a main body) of insulating material. In the terminals constructing the connector 50, ends arrayed along the flat surface of the printed circuit board 31 with respect to the housing 52 of the connector 50 and extended from the housing 52 are at least mechanically connected with the lands of the printed circuit board 31 via solder. In the present embodiment, as the plural terminals, terminals in which respective one ends extended from the housing 52 are electrically and mechanically connected with the lands 34 and 35 of the printed circuit board 31 via solder 70, and other ends extended from the housing 52 and exposed outside the casing 10 are electrically connected with an external connector (i.e., plural terminals which perform a function of electrical connection between the printed circuit board 31 and the connector 50 (external connector)) are employed, and a small number (at least one) of terminals which do not provide the function of electrical connection between the connector 50 and the printed circuit board 31, but which improve the connection reliability of the connector 50 to the circuit board 30 are employed. More particularly, the branch terminals 51 are provided as the terminals having surface member 53 and insertion member 54 to perform the function of electrical connection. The reinforcing terminals 59 are provided as the terminals to improve the connection reliability.

As the terminals including the branch terminals 51, a so-called stamped terminal formed by integrating a terminal member having a previously-bent predetermined shape stamped from a metal plate and integrating the terminal member with the housing 52 by insert molding, or a so-called bend terminal formed by inserting a bar-shaped terminal member stamped from a metal plate into a hole provided in the housing 52 and bending the terminal member thereafter can be employed. In the present embodiment, all the terminals including the branch terminals 51 are brass-plated stamped terminals. As shown in FIGS. 2 to 4, the terminals are arrayed along the lengthwise direction of the housing 52 having a flat rectangular shape in a status where respective parts of the terminals are held in the housing 52 not so as to interfere with each other. In this manner, when the stamped terminals are employed as the terminals, the widths of the respective branch terminals 51 in the array direction (the lengthwise direction of the housing 52) of the terminals (the branch terminals 51) can be determined based on the thickness of the metal plate. Accordingly, by appropriately selecting the thickness of the metal plate, the stress caused by warp or the like of the printed circuit board 31 and/or the housing 52 in the lengthwise direction of the housing 52 can be mitigated with the elastic deformation of the branch terminals 51, and the stress acting on the solder junctions can be reduced.

Further, as shown in FIG. 5, the branch terminal 51 has the surface member 53 connected with the surface land 34 and the insertion member 54 connected with the insertion land 35, as connection portions electrically connected with the lands 34 and 35 via the solder 70, around the distal end of the end on the side extended from the housing 52 and connected with the lands 34 and 35 on the printed circuit board 31. That is, the branch terminal 51 has the surface member 53 with the surface mounting structure and the insertion member 54 with the insertion mounting structure, as one terminal. The surface member 53 of the branch terminal 51 is mechanically and electrically connected with the surface land 34 via the solder 70 provided on the corresponding surface land 34, and the insertion member 54 of the branch terminal 51 inserted in the corresponding through hole 33 is mechanically and electrically connected with the corresponding insertion land 35 via the solder 70.

This structure has the advantage of positioning to a direction vertical with respect to the thickness direction of the printed circuit board 31 in a status where the insertion member 54 of the branch terminal 51 is provided in the through hole 33 of the printed circuit board 31. Accordingly, even when deformation such as warp occurs in the printed circuit board 31 and/or the housing 52 upon reflowing due to the difference between liner expansion coefficients of the printed circuit board 31 and the housing 52 of the connector 50, the connection between the branch terminal 51 and the corresponding lands 34 and 35 can be ensured. Further, the insertion member 54, with its part provided in the through hole 33, is electrically and mechanically connected with a portion of the insertion land 35 in the through hole 33 via the solder 70. Accordingly, even when the number of branch terminals 51 is large in the lengthwise direction of the housing 52, the coplanarity between the surface members 53 and the corresponding surface lands 34 can be ensured. Accordingly, the area of contact between the branch terminals 51 (the lands 34 and 35) and the solder 70 to satisfy desired connection reliability can be ensured. That is, in comparison with the conventional surface mounting structure, the connection reliability can be improved. Especially in the present embodiment, as all the plural terminals to perform the function of electrical connection are the branch terminals 51, the connection reliability can be further improved.

Further, in the present embodiment, as shown in e.g. FIG. 5, in all the branch terminals 51, in the direction vertical to the thickness direction of the printed circuit board 31, the insertion member 54 is approximately vertically extended to the surface of the printed circuit board 31 from a portion held between the opposed portions of the surface land 34 in the surface member 53. More specifically, the surface member 53 is approximately parallel to the surface of the printed circuit board 31, then the portion opposite to the surface land 34, then the portion connected with the insertion member 54, and the portion opposite to the surface land 34, in this order, are provided along a lengthwise direction of the surface member 53. That is, the branch terminal 51 has an approximately T-shape structure where the insertion member 54 is held with the surface member 53. In the present embodiment, the shape of the branch terminal 51 is a main feature, and the advantages of the approximately T-shape structure will be described in detail later. The branch terminal 51 having the approximately T-shaped structure can be realized with any of a stamped terminal and a bend terminal.

Further, as shown in FIGS. 1 and 3 to 5, the branch terminals 51 are provided in a multiple step array also in the direction vertical to the surface of the printed circuit board 31. For example, as shown in FIG. 5, in all the branch terminals 51, the height of the branch terminals 51 connected with the surface lands 34 except the surface land 34 closest to the housing 52 to the connector mounting surface in a position extended from the housing 52 is the same as the height of the branch terminal 51 connected to the surface land 34 closest to the housing 52 to the connector mounting surface in a position extended from the housing 52 (a position indicated with a broken line in FIG. 5). In this structure, upon reflowing, heat is efficiently transmitted to all the branch terminals 51. Note that in a structure where the height of the branch terminals 51 connected with the surface lands 34 except the surface land 34 closest to the housing 52 to the connector mounting surface in a position extended from the housing 52 is closer to the connector mounting surface than the height of the branch terminal 51 connected to the surface land 34 closest to the housing 52 to the connector mounting surface in a position extended from the housing 52, the same advantage can be expected. Further, in another structure, in comparison with a structure where the position of the branch terminal 51, connected with the surface land 34 closest to the housing 52, extended from the housing 52, is the closest to the printed circuit board 31, the length of the end extended from the housing 52 can be prolonged. For example, it may be arranged such that the branch terminal 51 extended from a position close (low) to the printed circuit board 31 is connected with the surface land 34 away from the housing 52, and the branch terminal 51 extended from a position away (high) from the printed circuit board 31 is connected with the surface land 34 close to the housing 52. In this arrangement, the function of mitigating the stress acting on the solder junctions can be improved, and by extension, the connection reliability can be improved. However, within the range in which the connection reliability is ensured, the correspondence between the step position of the branch terminal 51 in the housing 52 and the lands (34 and 35) in the printed circuit board 31 is not limited to the above examples. In the present embodiment, as shown in FIG. 5, in the insertion direction of the branch terminal 51 to the housing 52, in all the branch terminals 51, the portions approximately vertical to the surface of the printed circuit board 31 and held in the housing 52 are mutually overlapped. However, it may be arranged such that in adjacent branch terminals 51 in the lengthwise direction of the housing 52 (the array direction of the branch terminals 51), the portions approximately vertical to the surface of the printed circuit board 31 and held in the housing 52 are shifted from each other in the insertion direction of the branch terminals 51 to the housing 52. In this structure, as the distance between the branch terminals 51 can be ensured, noise preventing property can be improved when the distance between the branch terminals 51 is short in the lengthwise direction of the housing 52. Further, in the structure where the adjacent branch terminals 51 are shifted from each other, it may be arranged such that in the insertion direction of the branch terminals 51 to the housing 52, the branch terminal 51 shifted to the external connector side is connected with the lands 34 and 35 close to the housing 52, and the branch terminal 51 shifted to the front side of the housing 52 is connected with the lands 34 and 35 away from the housing 52. In this arrangement, in the insertion direction of the branch terminals 51 to the housing 52, the overlap between the adjacent branch terminals 51 can be completely removed, and the noise preventing property can be further improved. Note that in the structure where the adjacent branch terminals 51 are shifted from each other, the branch terminal 51 shifted to the external connector side may be connected to the lands 34 and 35 away from the housing 52 and the branch terminal 51 shifted to the front side of the housing 52 may be connected with the lands 34 and 35 close to the housing 52. In this structure, in comparison with the above structure, the length of exposure of the branch terminal 51 shifted to the external connector side can be ensured, and the connection reliability can be improved.

In the present embodiment, as shown in e.g. FIG. 5, in all the branch terminals 51, when the branch terminal 51 and the lands 34 and 35 are electrically connected, the end of the insertion member 54 is projected to the rear surface side of the connector mounting surface of the printed circuit board 31. In this structure, upon reflowing, even when deformation such as warp or the like occurs in the printed circuit board 31 and/or the housing 52, the connection between the branch terminals 51 and the corresponding lands 34 and 35 can be more reliably ensured.

Further, in the present embodiment, the branch terminals 51 include respectively plural different types of terminals with different diameters. More particularly, as shown in FIGS. 2 to 8, the branch terminals 51 include the first terminal 55 with a small diameter and the second terminal 56 with a large diameter. Further, the first terminal 55 is employed as a so-called signal terminal for signal transmission, and the second terminal 56 is employed as a so-called power terminal for electric power transmission (electrically connected with a power device to transmit a high electric current).

As shown in FIGS. 2 to 4, the connector 50 has at least one first terminal block 57 including plural first terminals 55 and at least one second terminal block 58 including plural first terminals 55 and plural second terminals 56, as terminal blocks for connection with external connectors, in the lengthwise direction of the housing 52. More particularly, the connector 50 has one first terminal block 57 and two second terminal blocks 58, as terminal blocks connected with three external connectors electrically connected with respective engine-concerned systems. As shown in FIG. 4, on the side of connection with external connectors, the respective terminal blocks 57 and 58 are separated with the housing 52. Accordingly, in the lengthwise direction of the housing 52, warp of the housing 52 can be reduced.

In this structure where the first terminal block 57 and the second terminal blocks 58 are provided as plural terminal blocks for connection with external connectors, the first terminals 55 for signal transmission can be divided in consideration of, e.g., the influence of noise from a high current signal flowing through the second terminal 56. In the present embodiment, among the first terminals 55, the first terminals 55 to transmit analog signals (a knock sensor signal and other analog sensor signals) susceptible to noise are included in the first terminal block 57, while the first terminals 55 to transmit digital signals unsusceptible to noise are included in the second terminal blocks 58. Note that in the lands corresponding to the second terminal block 58, it is necessary to consider the difference of the terminal diameters between the first terminals 55 and the second terminals 56 and the above-described influence of noise, in arrangement of the lands and wirings extended from the lands. On the other hand, in the lands corresponding to the first terminal block 57, as the number of limitations as in the case of the second terminal blocks 58 is smaller (or there is no such limitation), the lands and wirings extended from the lands can be arranged with high efficiency. That is, as the structure has the first terminal block 57 as well as the second terminal blocks 58, the electronic control device 100 in the vertical direction to the thickness direction of the circuit board 30 can be downsized.

In the lengthwise direction of the housing 52, the arrangement of the plural terminal blocks for connection with external connectors (arrangement of the first terminal block 57 and the second terminal blocks 58) is not particularly limited. In the present embodiment, as shown in FIGS. 2 to 4, among the three terminal blocks 57 and 58, the second terminal blocks 58 are provided at both ends, and the first terminal block 57 is provided in a central area between the second terminal blocks 58. Generally, a power device with which power terminals are electrically connected via lands and wirings is provided around an end portion on the circuit board 30 from the viewpoint of radiation (for reduction of radiation direction to the outside of the electronic control device 100 and reduction of influence of radiation on other parts (devices)). Accordingly, in the lengthwise direction of the housing 52, when at least one second terminal block 58 out of the terminal block 57 and the terminals blocks 58 is provided at the end position, the wiring pattern for electrical connection between the lands corresponding to the second terminals 56 and the power device can be simplified.

Further, in the second terminal blocks 58, the second terminals 56 are provided on the end sides in the lengthwise direction of the housing 52. That is, in one connector 50, the second terminals 56 are provided in both end areas in the lengthwise direction of the housing 52, and the first terminals 55 are provided in the central area between the end areas. The hole diameter and tolerance of the through holes 33 corresponding to the insertion members 54 of the second terminals 56 with terminal diameter larger than that of the first terminals 55 are larger than the diameter and tolerance of the through holes 33 corresponding to the insertion members 54 of the first terminals 55. It is conceivable that as the number of terminals is increased, the insertion members 54 cannot be easily inserted in the corresponding through holes 33 in accordance with positional precision of the through holes 33 and that of the branch terminals 51. However, in the above-described structure, even though the precision is somewhat low, the production errors of the printed circuit board 31 and the connector 50 can be smoothed out with the through holes 33. That is, the connection reliability can be ensured.

Further, the arrangement of the branch terminals 51 (55 and 56) constructing the respective terminal blocks 57 and 58 is not particularly limited. In the present embodiment, as shown in FIG. 3 and 4, the first terminal block 57 is constructed with plural first terminals 55 zigzag-provided with respect to the housing 52. More particularly, the first terminals 55 are provided in a three-step array in the vertical direction to the flat surface of the printed circuit board 31. Further, as shown in FIG. 3 and 4, the second terminal blocks 58 are constructed with plural first terminals 55 and plural second terminals 56 zigzag-provided with respect to the housing 52. More particularly, in two second terminal blocks 58, the first terminals 55 are provided in a three-step array in the direction vertical to the flat surface of the printed circuit board 31, and the second terminals 56 adjacent to the first terminals 55 are provided in a two-step array. The first terminals 55 constructing the second terminal block 58 have the same shape as that of the first terminals 55 constructing the first terminal block 57 and in the same step from the circuit board 30 side (in the present embodiment, the first to third steps). That is, the same type of terminals is used as the branch terminals 51. In this arrangement, the number of types of the branch terminal 51 can be reduced, and the production costs can be reduced.

Note that in the present embodiment, as shown in FIGS. 2 and 3, the reinforcing terminals 59 are provided, with the branch terminals 51, along the lengthwise direction of the housing 52. As the reinforcing terminals 59 are provided in plural positions (4 positions) away from each other in the lengthwise direction of the housing 52, the advantage of reinforcing can be improved. However, in the present embodiment, as the branch terminals 51 have the surface members 53 and the insertion members 54 as connection portions with corresponding lands 34 and 35, the connection reliability can be ensured even if the reinforcing terminals 59 are omitted.

Figure 10:
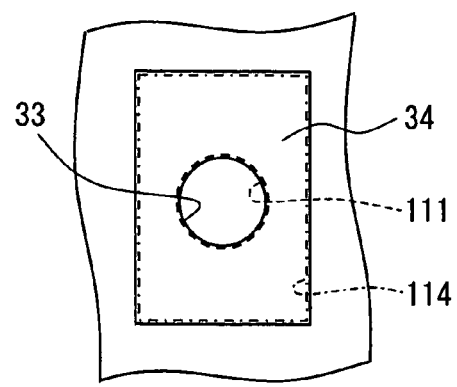
FIG. 10 is a plan view showing positional relation between a land connected with a terminal and an opening of a screen used in the coating process, corresponding to the land.
Figure 9A:
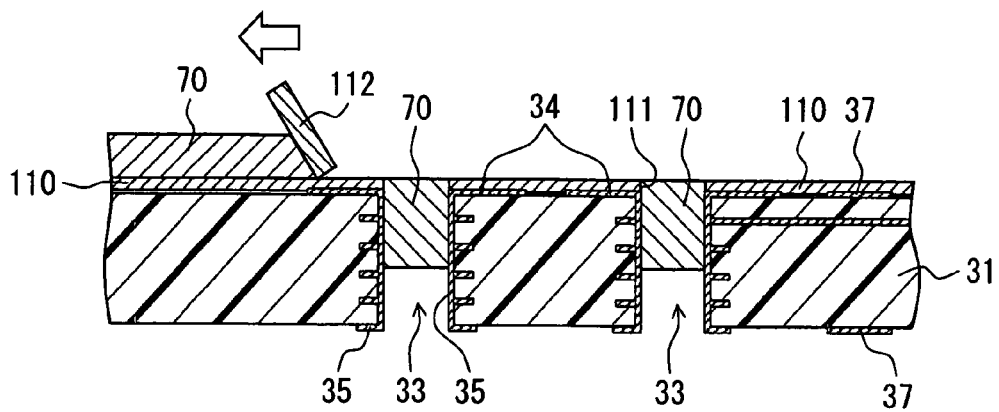
FIGS. 9A to 9C are explanatory views showing a first step, a second step, and a status after the completion of a coating process, as a feature of manufacturing of the electronic control device.
Figure 9B:
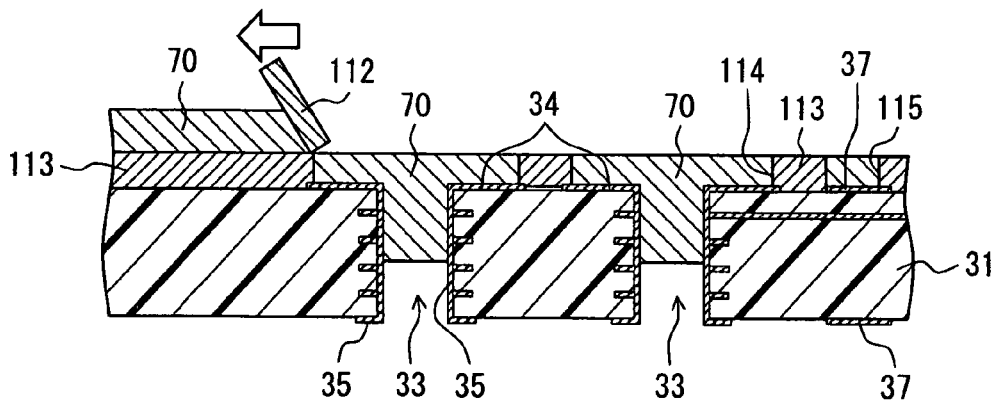
Figure 9C:
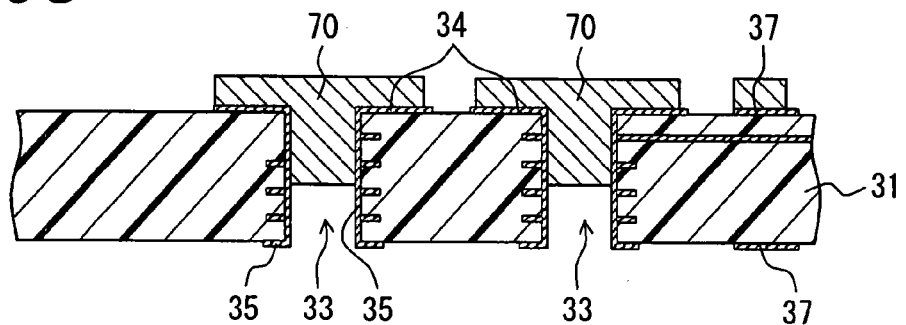

Next, a manufacturing method of the electronic control device 100 having the above structure will be described using FIGS. 5, FIGS. 9A to 9C and FIG. 10. FIGS. 9A to 9C are explanatory views showing a coating process as a feature of the manufacturing method of the electronic control device 100. FIG. 9A shows a first step of the coating process; FIG. 9B, a second step of the coating process; and FIG. 9C, a status after the completion of the coating process. FIG. 10 is a plan view showing positional relation between a land connected with a terminal and an opening of a screen used in the coating process, corresponding to the land.

In manufacture of the electronic control device 100, first, the circuit board 30 having the above-described structure and the connector 50 having the above-described structure are prepared using publicly-known manufacturing methods. For example, the through holes 33 can be formed by machine work using a drill or the like or laser machining, in positions in the printed circuit board 31 corresponding to the insertion members 54 of the branch terminals 51, in correspondence with the thickness of the printed circuit board 31 and the diameters of the through holes 33. Further, the surface lands 34 and the insertion lands 35 can be formed by publicly-known techniques such as plating, metal foil etching or the like. Note that in the present embodiment, upon formation of the branch terminals 51 by stamping a metal plate, the length of the insertion members 54 is set such that the ends of the insertion members 54 are projected to the rear surface side of the connector mounting surface of the printed circuit board 31 while the connector 50 is mounted on the circuit board 30. Further, the surface land 34 and the insertion land 35 corresponding to the same one branch terminal 51 are integrally formed.

Next, mounting on the connector mounting surface side is performed with respect to the prepared printed circuit board 31. First, as shown in FIGS. 9A to 9C, by using screen printing, solder paste 70 with controlled predetermined viscosity is applied to the inside of the through holes 33 (on the insertion lands 35), on the surface lands 34 and on the surface lands 37. In the coating process, the solder paste 70 can be applied to the inside of the through holes 33 (on the insertion lands 35), on the surface lands 34 and on the surface lands 37 at once. However, in the present embodiment, the coating is performed in first process and second process using screens with different mask shapes.

In the first process, as shown in FIGS. 9A and 10, a first screen 110 having openings 111 (corresponding to first openings) approximately corresponding to the through holes 33 (in size and shape) in positions corresponding to the through holes 33 is used. The solder paste 70 is supplied on the first screen 110, and a squeegee 112 is moved, thus screen printing is performed. The solder paste 70 is transferred through the openings 111 to the printed circuit board 31 side, and the solder paste 70 is filled in the through holes 33 from the connector mounting surface side. At this time, as air inside the through holes 33 escapes from the openings on the rear surface side of the printed circuit board 31 to the outside, the solder paste 70 can be efficiently filled in the through holes 33. Note that it is preferable that the first screen 110 has a thickness (mask thickness) as thin as possible for filling the solder paste 70 in the through holes 33.

After the completion of the first process, the second process is performed. In the second process, as shown in FIGS. 9B and 10, a second screen 113 having openings 114 (corresponding to second openings) approximately corresponding to the surface lands 34 (in size and shape) in positions corresponding to the through holes 33 and the surface lands 34, and openings 115 approximately corresponding to the surface lands 37 (in size and shape) in positions corresponding to the surface lands 37 is used. The solder paste 70 is supplied on the second screen 113, and the squeegee 112 is moved, thus screen printing is performed. The solder paste 70 is transferred through the openings 114 and 115 to the printed circuit board 31 side, and the solder paste 70 is provided from the connector mounting surface side on the surface lands 34 and the surface lands 37, and on the solder 70 provided in the first process. Note that it is preferable that the second screen 113 has a thickness (mask thickness) as thick as possible for providing the solder paste 70 on the surface lands 34. In the present embodiment, as the thickness of the first screen 110 is thinner than that of the second screen 113, the solder paste 70 can be efficiently filled in the through holes 33 and the thickness of the solder on the surface lands 34 can be ensured.

In this manner, as the coating process includes plural screen printing processes, more solder paste 70 can be supplied in the through holes 33 without partial mask thickness control and print pressure control as in the case of a screen printing process which is performed once, and by extension, the thickness of the solder paste 70 on the surface lands 34 can be increased. Accordingly, the contact area between the surface members 53, the insertion members 54 and the solder 70, and that between the lands 34, 35 and the solder 70 can be increased. Further, although the screen printing is performed plural times, contamination of the rear surface of the screen (transfer from the printed circuit board side) can be prevented. Further, as the through holes 33 are previously filled with the solder 70, in the reflow process to be described later, the solder 70 which flows in the through holes 33 from the surface lands 34 can be reduced or prevented.

Note that when the screen printing is performed plural times, there is a probability of inconvenience such as contamination when the solder 70 transferred to the printed circuit board 31 in the previous screen printing (the first process) is attached to the rear surface of the screen in the subsequent screen printing (the second process). In the present embodiment, as shown in FIG. 10, in the direction vertical to the thickness direction of the printed circuit board 31, the openings 114 of the second screen 113 used in the second process are larger than the openings 111 of the first screen 110 used in the first process such that the openings 111 are included in the openings 114. Accordingly, the above problem of contamination can be prevented. Further, as one opening 114 corresponds to an area including the through hole 33 and the surface land 34 corresponding to the same one branch terminal 51, the number of openings is small, and thereby the occurrence of contamination can be suppressed. Further, in the second process, as the solder paste 70 is applied on the surface lands 37 corresponding to the other electronic components 32 than the connector 50, the number of printing steps is reduced, thereby the occurrence of contamination can be suppressed. Further, the thickness of the solder on the surface lands 37 is ensured.

When the first process and the second process (the coating process) have been completed, as shown in FIG. 9C, the printed circuit board 31, in which the solder 70 is provided on the surface lands 34, on the insertion lands 35 in the through holes 33 and on the surface lands 37, is prepared. Then, positioning of the electronic components 32 including the connector 50 is performed on the connector mounting surface of the printed circuit board 31. Then the respective insertion members 54 are inserted through the solder 70 in the through holes 33. Further, the respective surface members 53 are brought into contact with the solder 70 provided on the corresponding surface lands 34. In this manner, in the present embodiment, as the insertion members 54 are inserted in the through holes 33, positioning of the connector 50 with respect to the printed circuit board 31 is facilitated. Further, as the insertion members 54 function as anchors, positional shift between the branch terminals 51 and corresponding lands 34 and 35 in the vertical direction to the thickness direction of the printed circuit board 31 can be suppressed.

Then, in a status where the electronic components 32 including the connector 50 are mounted on the printed circuit board 31, the reflow process is performed. The molten solder 70 is spread, and preferably, forms a fillet with respect to the surface members 53, and cooled and solidified in that state.

In the present embodiment, the ends of the insertion members 54 are projected to the rear surface side of the connector mounting surface of the printed circuit board 31, and in the coating process, the solder 70 is filled part of the through holes 33. Further, the surface lands 34 and the insertion lands 35 are integrated with each other. Accordingly, when the surface members 53 are in contact with the solder 70 on the surface lands 34, then upon reflowing, a part of the solder 70 on the surface lands 34 flows into gaps formed with the opposed insertion lands 35 formed on the wall surfaces of the through holes 33 and the insertion members 54 (hereinbelow, gaps between the through holes 33 and the insertion members 54) by the capillary phenomenon and/or gravity. FIG. 5 shows a structure where the solder 70 in this state is cooled and solidified. Further, when the contact between the surface members 53 and the solder 70 is not sufficient before the reflowing due to variation of the height of the branch terminals 51 to the connector mounting surface, the surface members 53 becomes wet with the molten solder 70 by the capillary phenomenon via the gaps between the through holes 33 and the insertion members 54, thereby a desired contact area between the branch terminals 51 and the solder 70 to ensure the connection reliability can be ensured. That is, in any case, the branch terminals 51 can be electrically and mechanically connected (bonded) with the lands 34 and 35 via the solder 70. Especially, in the present embodiment, as the solder 70 is efficiently filled in the through holes 33 and the thickness of the solder 70 on the surface lands 34 can be ensured in the coating process, the connection reliability can be further improved. Further, as the solder 70 is previously filled in the through holes 33, the amount of solder 70 flowing from the surface lands 34 in the through holes 33 in the reflow process can be reduced in comparison with a case where the solder 70 is not previously filled in the through holes 33. Accordingly, this also ensures the thickness of the solder 70 on the surface lands 34, and further improves the connection reliability. Further, as a sufficient amount of solder 70 is provided in the through holes 33, the occurrence of void can be suppressed.

Note that upon reflowing, there is a probability of occurrence of deformation such as warp in at least one of the printed circuit board 31 and the housing 52 before cooling and solidification of the solder 70 (molten state) due to the difference between liner expansion coefficients of the printed circuit board 31 and the housing 52 of the connector 50. Especially, in a structure having a shape long in the vertical direction to the thickness direction of the printed circuit board 31 and plural terminals (the branch terminals 51) are arrayed in the lengthwise direction as in the case of the connector 50 shown in the present embodiment, the amount of above deformation is increased on the end side in the lengthwise direction. That is, in connection between the branch terminals 51 and the corresponding lands 34 and 35, the connection reliability is easily lowered on the end side. However, in the present embodiment, as described above, as the insertion members 54 inserted in the through holes 33 function as anchors, the positional shift between the branch terminals 51 and the corresponding lands 34 and 35 before cooling and solidification of the solder 70 (molten state) can be prevented.

After the completion of reflowing on the connector mounting surface side of the printed circuit board 31, reflow mounting of the electronic components 32 is similarly performed on the rear surface of the printed circuit board 31. Thus the electronic control device 100 as shown in FIG. 1 can be formed.

As described above, in the present embodiment, the connector 50 includes the branch terminals 51 having the surface members 53 and the insertion members 54 as terminals to provide an electrical connection function. The reflowing is performed while the insertion members 54 of the branch terminals 51 are inserted in the through holes 33. Accordingly, in comparison with the conventional surface mounting structure, the connection reliability can be improved.

Further, in the structure where the insertion members 54 are inserted in the through holes 33, as flow soldering is unnecessary, the mounting disabled area for the electronic components 32 can be reduced on the rear surface of the connector mounting surface of the printed circuit board 31. That is, in comparison with the conventional insertion mounting structure, the packaging density can be improved.

Figure 14:
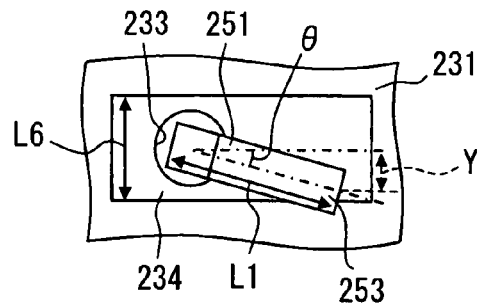
FIG. 14 is an expanded plan view around the surface land in the electronic control device having the L-shape structured branch terminal as a comparative example.
Figure 15:
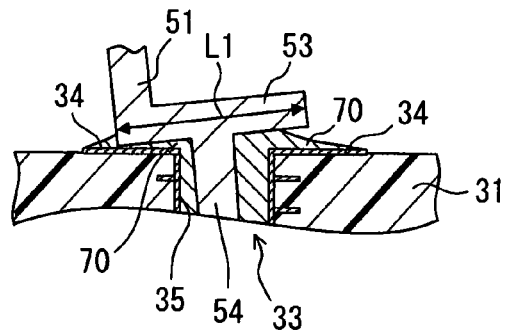
FIG. 15 is an expanded cross-sectional view around the surface land, for showing the advantage of improvement in connection reliability.
Figure 16:
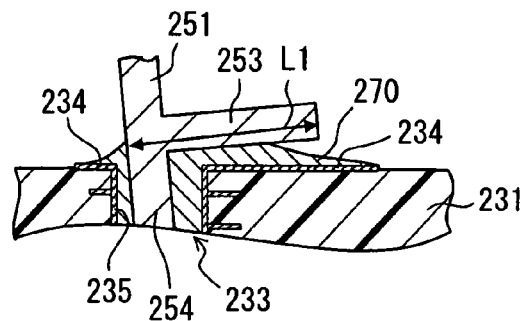
FIG. 16 is an expanded cross-sectional view around the surface land in the electronic control device having the L-shape structured branch terminal as a comparative example.
Figure 17:
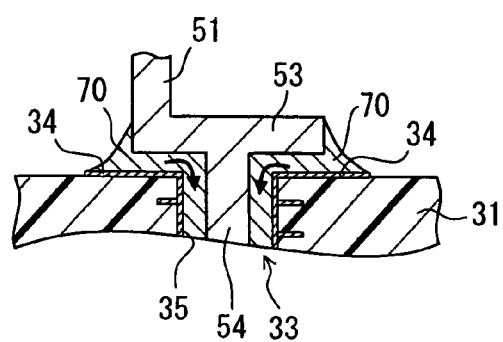
FIG. 17 is an expanded cross-sectional view around the surface land for showing the advantage of improvement in the connection reliability.
Figure 18:
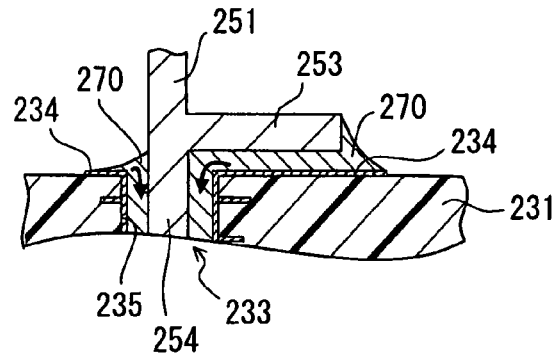
FIG. 18 is an expanded cross-sectional view around the surface land in the electronic control device having the L-shape structured branch terminal as a comparative example.
Figure 19:
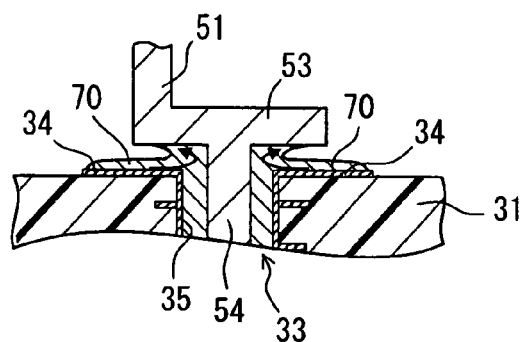
FIG. 19 is an expanded cross-sectional view around the surface land for showing the advantage of improvement in the connection reliability.
Figure 20:
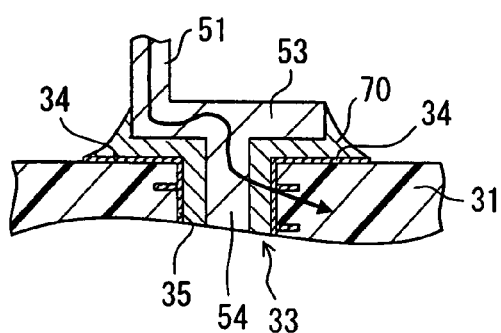
FIG. 20 is an expanded cross-sectional view around the surface land for showing the advantage of stress mitigation.
Figure 21:
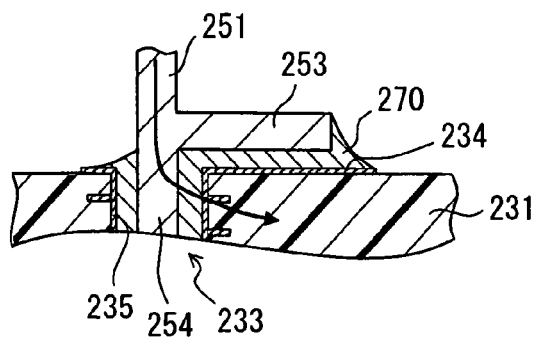
FIG. 21 is an expanded cross-sectional view around the surface land in the electronic control device having the L-shape structured branch terminal as a comparative example.

Next, the advantages of the shape of the branch terminal 51 as a main feature of the electronic control device 100 according to the present embodiment will be described in detail using FIGS. 11A and 11B, FIGS. 12A and 12B, and FIGS. 13 to 21. FIGS. 11A and 11B and FIGS. 12A and 12B show the advantages of the improvement in packaging density. FIGS. 11A and 11B show the electronic control device according to the present embodiment. FIG. 11A is an expanded side view of the branch terminal. FIG. 11B is an expanded plan view around the surface land. FIGS. 12A and 12B show the electronic control device having an L-shape structured branch terminal as a comparative example. FIG. 12A is an expanded side view of the branch terminal. FIG. 12B is an expanded plan view around the surface land. FIGS. 13 and 14 show the advantage of suppression of positional shift amount. FIG. 13 is an expanded plan view around the surface land in the electronic control device according to the present embodiment. FIG. 14 is an expanded plan view around the surface land in the electronic control device having the L-shape structured branch terminal as a comparative example. FIGS. 15 and 16 show the advantage of improvement in the connection reliability. FIG. 15 is an expanded cross-sectional view around the surface land in the electronic control device according to the present embodiment. FIG. 16 is an expanded cross-sectional view around the surface land in the electronic control device having the L-shape structured branch terminal as a comparative example. FIGS. 17 and 18 also show the advantage of improvement in the connection reliability. FIG. 17 is an expanded cross-sectional view around the surface land in the electronic control device according to the present embodiment. FIG. 18 is an expanded cross-sectional view around the surface land in the electronic control device having the L-shape structured branch terminal as a comparative example. FIG. 19 is an expanded cross-sectional view around the surface land in the electronic control device according to the present embodiment for showing the advantage of improvement in the connection reliability. FIGS. 20 and 21 show the advantage of stress mitigation. FIG. 20 is an expanded cross-sectional view around the surface land in the electronic control device according to the present embodiment. FIG. 21 is an expanded cross-sectional view around the surface land in the electronic control device having the L-shape structured branch terminal as a comparative example. Note that in the electronic control device as a comparative example, the constituent elements identical to those of the electronic control device shown in the present embodiment have 200s reference numerals with last two digits corresponding to those of the reference numerals in the electronic control device in the present embodiment. More particularly, numeral 231 denotes a printed circuit board; 233, a through hole; 234, a surface land; 235, an insertion land; 251, a branch terminal; 253, a surface member; 254, an insertion member, and 270, solder.

In FIGS. 11A and 11B and FIGS. 12A and 12B, the lengths of portions approximately parallel to the printed circuit board 31 and 231 are both L1 (in other words, the lengths of the surface members 53 and 253 are the same), the clearances between the ends of the surface members 53 and 253 and the ends of the surface lands 34 and 234, when the insertion members 54 and 254 are inserted in the through holes 33 and 233 having the same diameter, are both L2, and the tolerance of the through holes 33 and 233 is L3. A length L4 of the surface land 34 corresponding to the branch terminal 51 having an approximately T-shaped structure (as shown in FIG. 11B, the length along a lengthwise direction of the surface member 53) is obtained by doubling the length L2 and adding the doubled length L2 to the length L1. On the other hand, a length L5 of the surface land 234 corresponding to the branch terminal 251 having the L-shaped structure (as shown in FIG. 12B, the length along the lengthwise direction of the surface member 53) is obtained by adding greater one of the lengths L2 and L3 to the lengths L1 and L2. Accordingly, the length L4 of the surface land 34 is equal to or shorter than the length L5 of the surface land 234. Note that generally, as shown in FIGS. 11B and 12B, L2<L3 holds. That is, as shown in the present embodiment, when the branch terminal 51 having the approximately T-shaped structure is employed, if the sizes are the same in the vertical direction to the thickness direction of the printed circuit boards 31 and 231, the packaging density of the electronic components 32 can be improved in comparison with that of the branch terminal 251 having the L-shaped structure. Further, if the packaging densities are the same, the size in the vertical direction to the thickness direction of the printed circuit board 31 and 231 can be reduced in comparison with the branch terminal 251 having the L-shaped structure. Note that the above-described advantages of the branch terminal 51 having the approximately T-shaped structure are further improved in a structure where the insertion member 54 is extended from an approximately central position of the surface member 53.

Further, in FIGS. 13 and 14, in a status where the insertion members 54 and 254 are inserted in the through holes 33 and 233 of the printed circuit boards 31 and 231 before the reflowing, the branch terminal is rotated at an angle θ about the insertion member 54 as a rotation center, and the surface members 53 and 253 are shifted from the surface lands 34 and 234 from the lengthwise direction of the surface lands 34 and 234. Note that the lengths of the portions approximately parallel to the printed circuit boards 31 and 231 are both L1 (in other words, the lengths of the surface members 53 and 253 are the same), and the widths of the surface lands 34 and 234 are both L6. At this time, in the branch terminal 251 having the L-shaped structure, as shown in FIG. 14, a positional shift amount Y in the direction vertical to the lengthwise direction in the end of the surface member 253 in its lengthwise direction is approximately equal to L1×sin θ. On the other hand, in the branch terminal having the approximate T-shaped structure, as shown in FIG. 13, in the lengthwise direction of the surface member 53, the surface member 53 on the side of longer one of the two areas with the insertion member 54 therebetween is further shifted. However, a positional shift amount X in the direction vertical to the lengthwise direction in the end of the surface member 53 in its lengthwise direction is smaller than the above-described positional shift amount Y For example, when the insertion member 54 is extended from the central position of the surface member 53, the positional shift amount Y is approximately equal to L1×sin θ/2. Accordingly, the positional shift amount in the branch terminal 51 having the approximately T-shaped structure is smaller than that in the branch terminal 251 having the L-shaped structure. That is, the branch terminal 51 having the approximately T-shaped structure (surface member 53) is not easily protruded from the surface land 34 and the side fillet is easily formed. Accordingly, the connection reliability (quality) can be ensured. Note that the above-described advantage of the branch terminal 51 having the approximately T-shaped structure is further improved in the structure where the insertion member 54 is extended from the approximately central position of the surface member 53.

Further, in FIGS. 15 and 16, the insertion members 54 and 254 are inserted in the through holes 33 and 233 and solder-bonded while the branch terminals 51 and 251 are inclined in the same direction with respect to the surfaces of the printed circuit boards 31 and 231, and a part of the surface member 53 opposite to the surface land 34 and that of the surface member 253 opposite to the surface land 234 are exposed without contact with the solders 70 and 270 on the surface lands 34 and 234. Note that in FIGS. 15 and 16, the end of the surface members 53 and 253 in their lengthwise direction (the sides away from the housing of the connector) are inclined at the same angle in a direction away from the surface of the printed circuit boards 31 and 231. Further, the lengths of the portions of the branch terminals 51 and 251 approximately parallel to the printed circuit boards 31 and 231 are both L1 (in other words, the lengths of the surface members 53 and 253 are the same). In this structure, a crack easily occurs in the solder junctions in the surfaces of the surface members 53 and 253 opposite to the surface lands 34 and 234 and corners (the boundaries to the ambient atmosphere) of the ends in contact with the solders 70 and 270. Accordingly, in the branch terminal 251 having the L-shaped structure in FIG. 16, the connection reliability may be easily lowered. On the other hand, in the branch terminal 51 having the approximately T-shape structure in FIG. 15, even when a crack occurs in one of the surface members 53 with the insertion member 54 therebetween (the side away from the housing), in the other surface member 53 (the side close to the housing), the opposing distance to the surface land 34 is short in the inclined status, and the surface opposite to the surface land 34 is brought into contact with the solder 70 on the surface land 34, and the side fillet is formed. That is, the connection reliability (quality) can be more easily ensured in the branch terminal 51 having the approximately T-shaped structure. Note that the advantage of the branch terminal having the approximately T-shaped structure is further improved in the structure where the insertion member 54 is extended from the approximately central position of the surface member 53.

Further, as shown in FIG. 17, in the branch terminal 51 having the approximately T-shape structure, in the surface land 34 of the printed circuit board 31, respective opposed portions with the through hole 33 therebetween are large with respect to the surface member 53. Accordingly, even when the solder 70 or the surface land 34 flows in the through hole 33 upon reflowing, approximately equal thickness of the solder 70 can be maintained on the respective opposed portions of the surface land 34 with the through hole 33 therebetween. On the other hand, as shown in FIG. 18, in the branch terminal 251 having the L-shaped structure, in the surface land 234 of the printed circuit board 231, a portion of the opposed portions with the through hole 33 therebetween, opposite to the surface member 253, is large, however, a portion not opposite to the surface member 253 (a peripheral portion of the insertion member 254 around the opening of the through hole) is small in consideration of improvement of packaging density. Accordingly, when the solder 70 on the surface land 234 flows in the through hole 33 upon reflowing, the thickness of the solder may vary on the respective opposed portions of the surface land 34 with the through hole 33 therebetween. That is, the connection reliability (quality) can be more easily ensured in the branch terminal 51 having the approximately T-shaped structure.

Further, as shown in FIG. 19, in the branch terminal 51 having the approximately T-shaped structure, before the reflowing, even when a surface of the surface member 53 opposite to the surface land 34 is not in contact with the solder 70, the surface of the surface member 53 opposite to the surface land 34 is soaked with the solder 70 by the capillary phenomenon in the opposed area between the surface member 53 and the surface land 34, and the fillet is formed. The fillet is formed in the respective opposed surface members 53 with the insertion member 54 therebetween.

On the other hand, although not shown, as the branch terminal 251 having the L-shaped structure has the surface member 253 only in one side to the insertion member 254, the number of positions in which the fillet is formed to the surface member 253 is smaller. That is, in the branch terminal 51 having the approximately T-shaped structure, the connection reliability can be further improved.

Further, in the branch terminal 51 having the approximately T-shaped structure, the end of the portion extended from the housing is bent and the surface member 53 approximately parallel to the surface of the printed circuit board 31 is formed. In the surface member 53, the insertion member 54 extends from a portion of the surface member 53 held between opposed portions of to the surface land 34 toward the printed circuit board 31 approximately vertically. As shown in FIG. 20, when the stress in the direction vertical to the surface of the printed circuit board 31 (an arrow in FIG. 20) acts on a solder junction between the branch terminal 51 and the printed circuit board 31, the stress is transmitted to the printed circuit board 31 via the surface member 53, or transmitted through the surface member 53 and via the insertion member 54, to the printed circuit board 31. Accordingly, the stress can be mitigated in the surface member 53. On the other hand, in the branch terminal 251 having the L-shaped structure, the insertion member 254 approximately vertical to the surface of the printed circuit board 231 is formed in a portion extended from the housing, and the surface member 253 is extended from the insertion member 254 (or the portion extended from the housing) in approximately parallel to the surface of the printed circuit board 231. As shown in FIG. 21, when the stress in the direction vertical to the surface of the printed circuit board 231 (an arrow in FIG. 21) acts on a solder junction between the branch terminal 251 and the printed circuit board 231, the stress is transmitted via the insertion member 254 to the printed circuit board 231 almost without the surface member 253. That is, in the branch terminal 51 having the approximately T-shaped structure, the connection reliability can be further improved.

Figure 22:
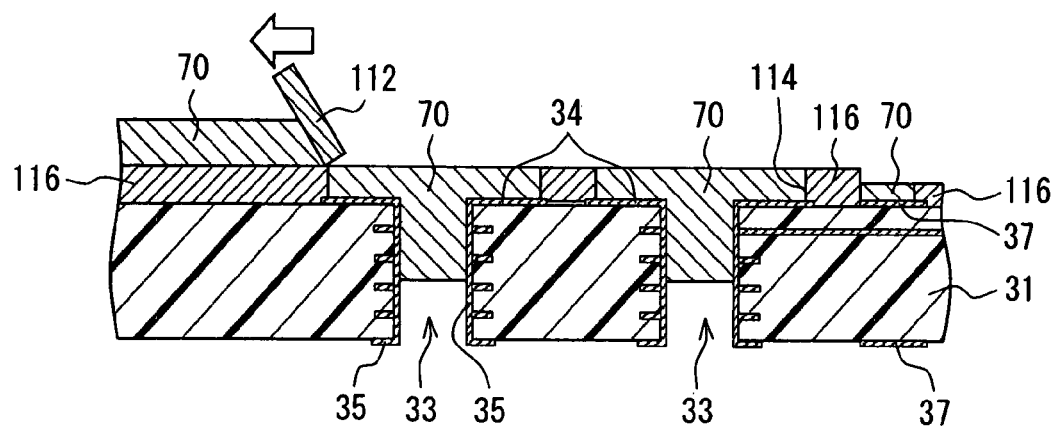
FIG. 22 is a cross-sectional view showing a modification of the coating process.

Note that in the present embodiment, the coating process includes the first process and the second process using the screens 110 and 113 having different musk shapes. However, the number of the screen printing is not limited to two. The screen printing may be performed thrice or more. Further, it may be arranged such that the solder 70 is applied to the inside of the through holes 33.(lands 35), on the lands 34 and on the surface lands 37 in one screen printing. For example, as shown in FIG. 22, the thickness of a screen 116 (mask thickness) may be partially changed. The connection reliability can be improved by making the thickness of portions corresponding to the lands 34 and 35 requiring more solder 70 to fill the through holes 33 with the solder 70 greater than that of a portion corresponding to the surface land 37 of the electronic component 32. FIG. 22 is a cross-sectional view showing the modification of the coating process. In addition, the connection reliability can be improved by controlling the running speed of the squeegee 112 (to a lower speed on the lands 34 and 35 than that on the surface lands 37) or controlling the print pressure (to higher pressure on the lands 34 and 35 than that on the surface lands 37).

Further, in the present embodiment, the surface lands 34 are provided in a two-step zigzag array, and in the direction vertical to the flat surface of the printed circuit board 31, the first terminals 55 are provided in a three-step array and the second terminals 56 are provided in a two-step array with respect to the housing 52. However, the number of zigzag steps is not limited to two. As the number of types of the branch terminal 51 is determined based on the number of array steps of the branch terminals 51 and the number of array steps of the surface lands 34, when the number of array steps of the branch terminals 51 (the first terminals 55 and the second terminals 56) is n times (n is an integer equal to or greater than "2") of the number of array steps of the zigzag-arrayed surface lands, the number of types of terminals can be reduced.

Figure 23:
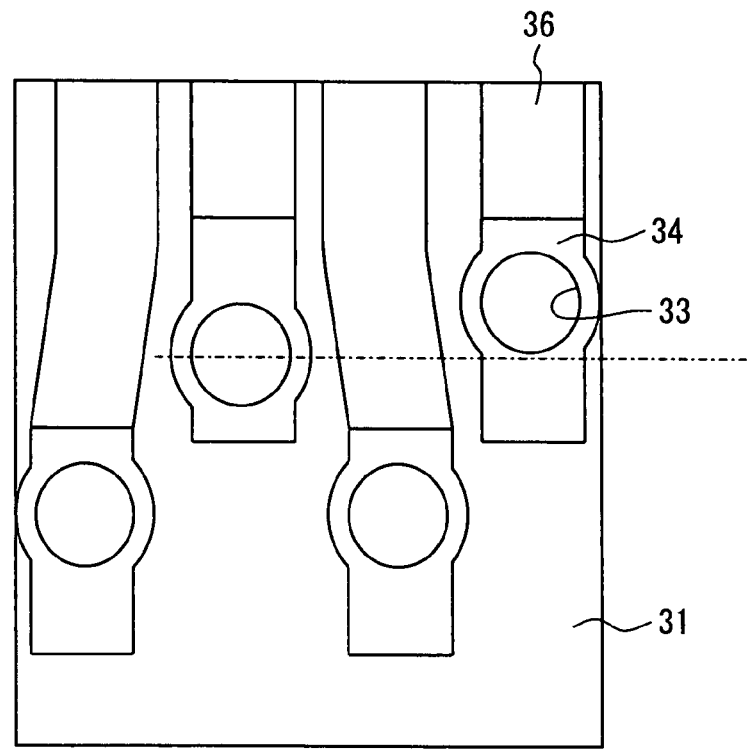
FIG. 23 is a plan view of the printed circuit board according to another modification.

Further, in the present embodiment, as shown in e.g. FIG. 7, the external shape of the surface land 34 is rectangle in the direction vertical to the thickness direction of the printed circuit board 31. That is, in the insertion land 35, a peripheral portion of the opening of the through hole 33 (shown as a part of the surface land 34) is included in the rectangular-shaped surface land 34. However, as shown in FIG. 23, it may be arranged such that, in the insertion land 35, the peripheral portion of the opening of the through hole 33 (shown as a part of the surface land 34) is larger than the surface land 34 in the lengthwise direction of the housing 52, in accordance with diameter of the branch terminal 51 (the diameter of the through hole 33). In this case, as shown in FIG. 23, when the positions of the through hole 33 and the surface land 34 in the second step away from the housing 52 (on the upper side in the drawing) are shifted in a direction away from the housing 52, the printed circuit board 31 in the lengthwise direction of the housing 52, and by extension, the electronic control device 100 can be downsized. Note that FIG. 23 is a plan view of the printed circuit board according to the modification. In this case, as the lengths of the branch terminals 51 extended from the housing 52 are different, the number of types of the terminal is increased. However, as described above, when the number of array steps of the branch terminals 51 is n times (n is an integer equal to or greater than "2") of the number of array steps of the zigzag-arrayed surface lands 34, the number of types of terminal can be reduced. For example, in FIG. 23 in which the surface lands 34 are provided in a two-step array, when the number of array steps of the branch terminals 51 is e.g. four, the number of types of the branch terminal 51 is four even if the position of the surface land 34 in the second step is shifted. More particularly, the branch terminal 51 in the fourth step, the branch terminal 51 in the first step, the branch terminal 51 in the third step, and the branch terminal 51 in the second step, sequentially from the right (the surface land 34 in the second step) to the left of FIG. 23, correspond to the four surface lands 34 in FIG. 23. Note that in FIG. 23, the solder and the solder resist are omitted for the sake of convenience.

Further, in the present embodiment, after the completion of the reflowing on the side of the connector mounting side in the printed circuit board 31, the reflow mounting is performed on the rear surface side. However, the reflow mounting may be performed on the side of the connector mounting surface after the completion of the reflowing on the rear surface side of the connector mounting surface of the printed circuit board 31. In this case, even when the insertion member 54 is projected to the rear surface side of the connector mounting surface of the printed circuit board 31, the insertion member 54 does not prevent the heat of the reflowing.

Second Embodiment

Figure 24:
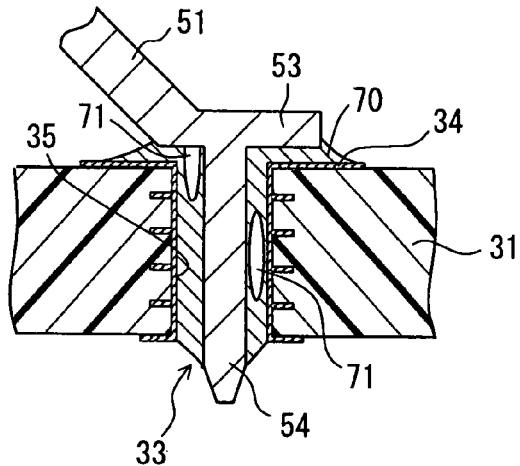
FIG. 24 is an expanded cross-sectional view of a peripheral portion of the connector mounted on the printed circuit board, for explanation of the concept in the structure shown in the first embodiment.
Figure 25:
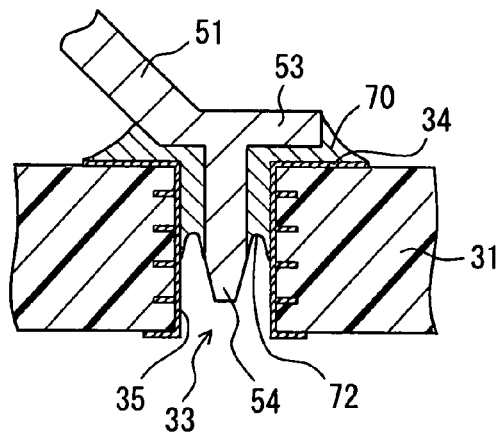
FIG. 25 is an expanded cross-sectional view of the peripheral portion of the connector mounted on the printed circuit board in the electronic control device according to a second embodiment.

Next, a second embodiment of the present invention will be described based on FIGS. 24 and 25. FIG. 24 is an expanded cross-sectional view of a peripheral portion of the connector mounted on the printed circuit board, for explanation of the concept in the structure shown in the first embodiment. FIG. 25 is an expanded cross-sectional view of the peripheral portion of the connector mounted on the printed circuit board in the electronic control device according to the second embodiment.

The electronic control device and its manufacturing method according to the second embodiment have many commonalities with those in the first embodiment, accordingly, the detailed explanations of such commonalities will be omitted, and the difference will be mainly described. Further, in the present embodiment, constituent elements identical to those in the first embodiment have the same reference numerals.

In the first embodiment, the insertion member 54 of the branch terminal 51 is projected to the rear surface side of the connector mounting surface of the printed circuit board 31 while it is reflow-mounted. In this structure, the gap between the through hole 33 and the insertion member 54 (opposing area) is formed over the entire thickness direction of the printed circuit board 31. Accordingly, in accordance with thickness of the printed circuit board 31, it is difficult to completely fill the gap by filling the through holes 33 with the solder 70 in the coating process. When the gap is not completely filled with the solder 70, it is conceivable that upon reflowing, a part of the solder 70 provided on the surface land 34 flows in the through hole 33 by the capillary phenomenon and/or gravity. As a result, the thickness of the solder 70 on the surface land 34 is reduced, and as shown in e.g. FIG. 24, the side fillet formed in the side surface of the surface member 53 is reduced, or the fillet may not be formed. Further, there is a probability of occurrence of a hollow 71 (void) in the through hole 33 due to shortage of the solder 70 filled in the gap as shown in FIG. 24.

On the other hand, as a feature of the present embodiment, the end of the insertion member 54 of the branch terminal 51 is set in the same position (flat-top) as that in the rear surface of the connector mounting surface of the printed circuit board 31 or in a position between the electronic component mounting surface and its rear surface while the end of the insertion member 54 is reflow-mounted. Note that in FIG. 25, as an example, the end of the insertion member 54 of the branch terminal 51 is set in the position between the electronic component mounting surface and its rear surface.

In this manner, in this structure where the end of the insertion member 54 is not projected to the rear surface side of the connector mounting surface of the printed circuit board 31, the length of the gap in the thickness direction of the printed circuit board 31 is shorter than that in the structure where the end of the insertion member 54 is projected to the rear surface side of the connector mounting surface. Accordingly, the amount of solder 70 flowing in the through hole 33 from the position on the surface land 34 can be reduced. That is, the thickness of the solder 70 on the surface land 34 can be ensured, and as shown in FIG. 25, an excellent fillet (side fillet) can be easily formed on the surface member 53. Further, as the length of the gap in the thickness direction of the printed circuit board 31 is short, the amount of solder required for filling the gap can be smaller than that in the structure where the end of the insertion member 54 is projected to the rear surface side of the connector mounting surface. That is, formation of the hollow 71 in the through hole 33 is suppressed. Accordingly, the connection reliability can be improved without increasing the surface land 34 and increasing the amount of the solder 70.

Further, as the end of the insertion member 54 is not projected to the rear surface side of the connector mounting surface of the printed circuit board 31, upon mounting of electronic components provided on the rear surface side of the printed circuit board 31, reflowing heat is not blocked with the insertion member 54. Accordingly, the connection reliability on the rear surface side of the printed circuit board 31 can be improved.

Note that in the structure where the end of the insertion member 54 is not projected to the rear surface side of the connector mounting surface of the printed circuit board 31, when the capillary phenomenon acts on the gap between the through hole 33 and the insertion member 54, an end surface 72 of the solder 70 provided in the gap on the rear surface side of the connector mounting surface (in other words, a surface exposed on the rear surface side of the printed circuit board 31) has a shape with a portion closer to the connector mounting surface than a contact portion with the insertion land 35 and a contact portion with the insertion member 54 (an arc shape) in the thickness direction of the printed circuit board 31 as shown in FIG. 25. On the other hand, in the structure where the end of the insertion member 54 is projected to the rear surface side of the connector mounting surface of the printed circuit board 31, although the capillary phenomenon acts on the opposing area (gap) between the through hole 33 and the insertion member 54, the capillary phenomenon does not act on the portion of the insertion member 54 projected from the through hole 33, and the solder 70 is spread by gravity. Accordingly, as shown in FIG. 24, the surface corresponding to the above-described end surface 72 has a shape in which the surface is closer to the connector mounting surface from the contact portion with the insertion land 35 toward the contact portion with the insertion member 54 in the thickness direction of the printed circuit board 31.

Figure 26:
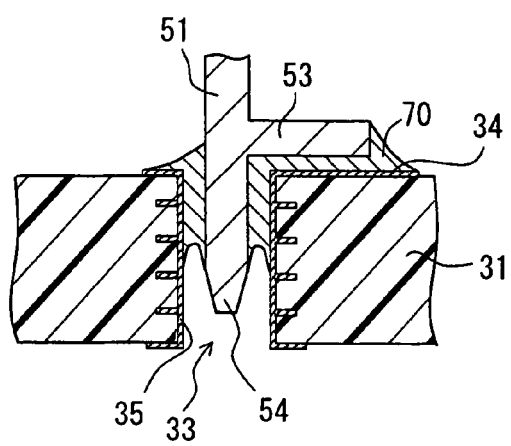
FIG. 26 is an expanded cross-sectional view showing a modification of the branch terminal.
Figure 27:
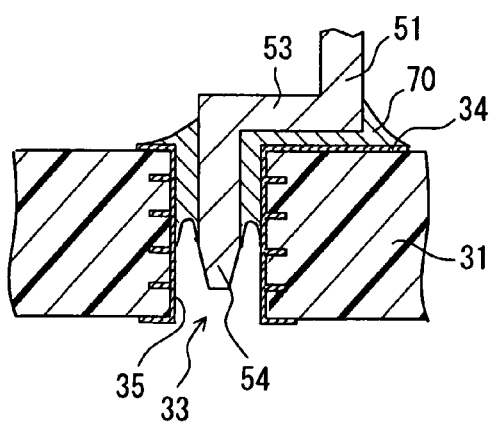
FIG. 27 is an expanded cross-sectional view showing another modification of the branch terminal.

Further, in the present embodiment, the branch terminal 51 with its end not projected to the rear surface side of the connector mounting surface of the printed circuit board 31 has the approximately T-shaped structure as in the case of the first embodiment. In this manner, by adopting the branch terminal 51 having the approximately T-shaped structure, the above advantage can be obtained in addition to the advantages shown in the first embodiment. Accordingly, the packaging density and the connection reliability can be further improved. However, the structure of the branch terminal 51 having the advantage shown in the second embodiment is not limited to the above-described approximately T-shaped structure. For example, the branch terminal 51 having the L-shaped structure as shown in FIGS. 26 and 27 may be employed. FIGS. 26 and 27 are expanded cross-sectional views showing modifications of the branch terminals 51. In FIG. 26, the insertion member 54 approximately vertical to the surface of the printed circuit board 31 is formed in a position extended from the portion extended from the housing, and the surface member 53 is extended in approximately parallel to the surface of the printed circuit board 31 from the insertion member 54 (or the portion extended from the housing). In FIG. 27, the end of the portion extended from the housing is bent and the surface member 53 approximately parallel to the surface of the printed circuit board 31 is formed, and the end of the surface member 53 is bent and the insertion member 54 is formed approximately vertically to the surface of the printed circuit board 31. These structures can be made as stamped terminals or bend terminals.

Further, in the present embodiment, as shown in FIG. 25, the length of the insertion member 54 is set such that the end of the insertion member 54 is positioned between the connector mounting surface of the printed circuit board 31 and its rear surface. However, even in a structure where the end of the insertion member 54 is in approximately the same position as the rear surface of the connector mounting surface of the printed circuit board 31, the same advantages can be expected.

Third Embodiment

Figure 28:
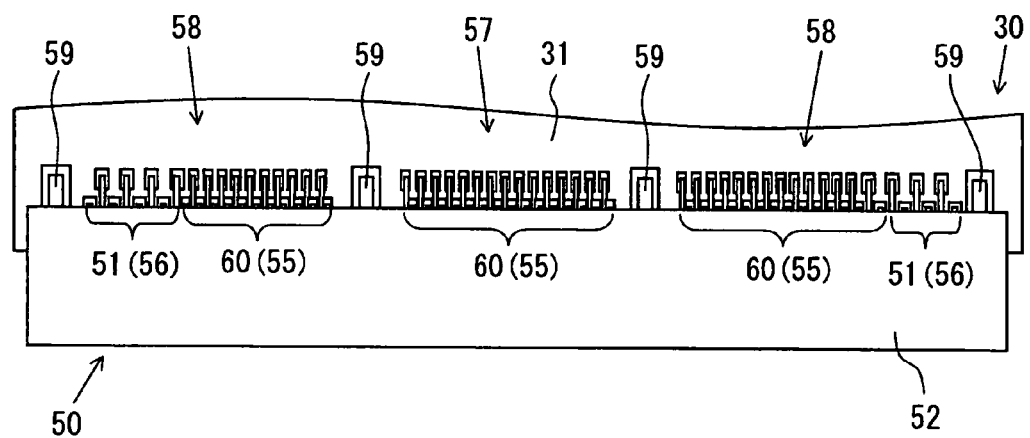
FIG. 28 is a plan view of a peripheral portion of the connector mounted on the printed circuit board in the electronic control device according to a third embodiment.

Next, a third embodiment of the present invention will be described based on FIG. 28. FIG. 28 is a plan view of a peripheral portion of the connector mounted on the printed circuit board in the electronic control device according to the third embodiment.

As the electronic control device 100 and its manufacturing method according to the third embodiment have many commonalities with those in the first embodiment, the detailed explanations of such commonalities will be omitted hereinbelow, but the difference will be mainly described. Further, in the present embodiment, constituent elements identical to those in the first embodiment have the same reference numerals.

In the first embodiment, all the terminals which provide an electrical connection function are the branch terminals 51. On the other hand, in the present embodiment, as shown in FIG. 28, the connector 50 includes a surface mounting type terminal 60 as a terminal to provide an electrical connection function, in addition to the branch terminal 51. That is, a terminal connected with solder has the branch terminal 51, the reinforcing terminal 59 and the surface mounting type terminal 60. Note that the surface mounting type terminal 60 has only the surface member 53 of the branch terminal 51 as a connection portion with a land. That is, the surface mounting type terminal 60 has approximately the same structure as that of the branch terminal 51 except that the insertion member 54 is omitted. Further, in the printed circuit board 31, the through hole 33 is not formed in a position corresponding to the surface mounting type terminal 60, and the surface land 34 is formed in correspondence with the surface mounting type terminal 60 on the connector mounting surface.

As shown in the first embodiment, when all the terminals to provide an electrical connection function are the branch terminals 51, the through holes 33 are provided in the printed circuit board 31 in correspondence with the number of the branch terminals 51. However, when the terminals include the branch terminals 51 and the surface mounting type terminals 60, the number of through holes 33 can be reduced. Accordingly, although the connection reliability is somewhat degraded in comparison with the structure where all the terminals are the branch terminals 51, as long as the number of the terminals is the same, the connection reliability can be improved in comparison with the conventional surface mounting structure and the insertion mounting structure. Further, in comparison with the structure where all the terminals are the branch terminals 51, the printed circuit board 31 can be downsized in the direction vertical to the thickness direction of the printed circuit board 31, and by extension, the electronic control device 100 can be downsized. Further, the freedom of the wiring 36 formed on the printed circuit board 31 can be improved.

Note that in the present embodiment, as shown in FIG. 28, the second terminal 56 is the branch terminal 51, and the first terminal 55 is the surface mounting type terminal 60. In the lengthwise direction of the housing 52 (the array direction of terminals along the surface of the printed circuit board 31), plural branch terminals 51 are provided with the surface mounting type terminals 60 therebetween. Further, in the lengthwise direction of the housing 52, at least one branch terminal 51 is provided in both end areas.

In this manner, when the branch terminals 51 are provided with the surface mounting type terminals 60 therebetween, the positional shift between the terminals and the corresponding lands can be effectively suppressed. Further, as described above, as the number of the terminals is increased, the coplanarity between the terminals and the lands cannot be ensured without difficulty. The amount of deformation of the printed circuit board 31, for example, is increased in a position away from the center of the housing 52 in the lengthwise direction of the housing 52. Accordingly, when the branch terminals 51 are provided in the both end areas, the positional shift between the terminals and the corresponding lands can be more effectively suppressed.

Further, as the second terminal 56 provided in the both end areas is the branch terminal 51, the production errors of the printed circuit board 31 and the connector 50 can be smoothed out with the through holes 33, as in the case of the first embodiment. That is, the connection reliability can be ensured.

Note that the arrangement of the branch terminals 51 and the surface mounting type terminals 60 is not limited to the above arrangement. Arbitrary combinations of the branch terminals 51 and the surface mounting type terminals 60 may be employed. In the present embodiment, the first terminal 55 is the surface mounting type terminal 60, and the second terminal 56 is the branch terminal 51. It may be arranged such that at least a part of the first terminals 55 are the branch terminals 51 and at least a part of the second terminals 56 are the surface mounting type terminals 60. Further, the arrangement in which the plural branch terminals 51 are provided with the surface mounting type terminals 60 therebetween in the lengthwise direction of the housing 52 is not limited to the above arrangement. For example, the terminals 51 and the surface mounting type terminals 60 may be alternately provided in the lengthwise direction of the housing 52.

Further, as shown in the present embodiment, in the arrangement in which the connector 50 includes plural terminal blocks 57 and 58, the respective terminal blocks 57 and 58 are connected with different external connectors. Accordingly, in the respective terminals 57 and 58, the branch terminals 51 may be provided in the respective end areas, and the surface mounting type terminals 60 may be provided in the respective central areas. In this case, the connection reliability can be improved in the respective terminal blocks 57 and 58.

Note that the arrangement shown in the present embodiment may be combined with that shown in the second embodiment as well as that shown in the first embodiment.

Fourth Embodiment

Figure 29A:
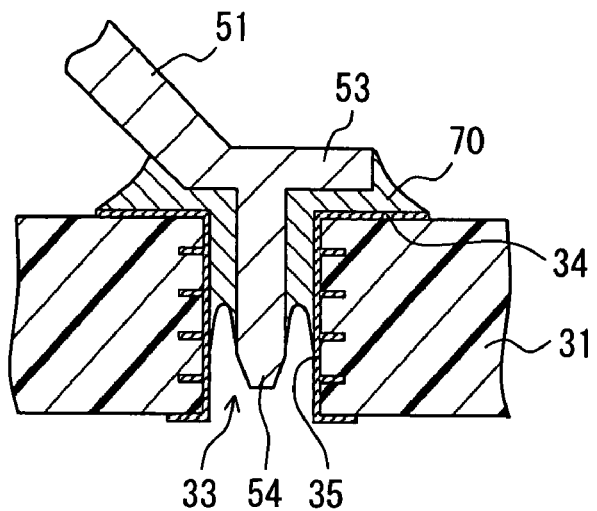
FIGS. 29A and 29B are explanatory views of the concept of the manufacture of the electronic control device according to the second embodiment by the manufacturing method shown in the first embodiment, showing a status before the reflow process and a status after the reflow process.
Figure 29B:
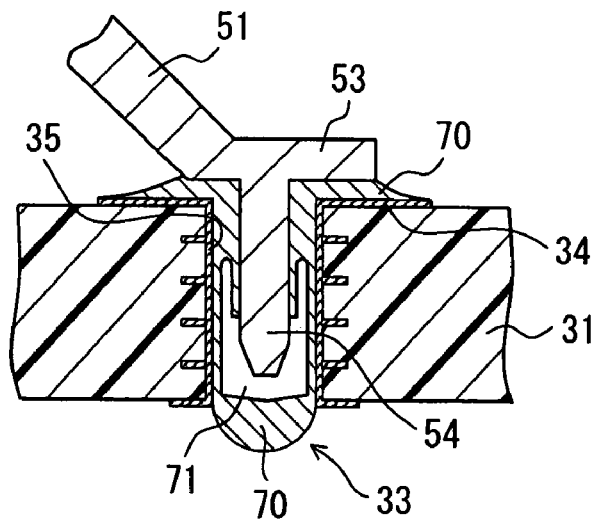
Figure 30A:
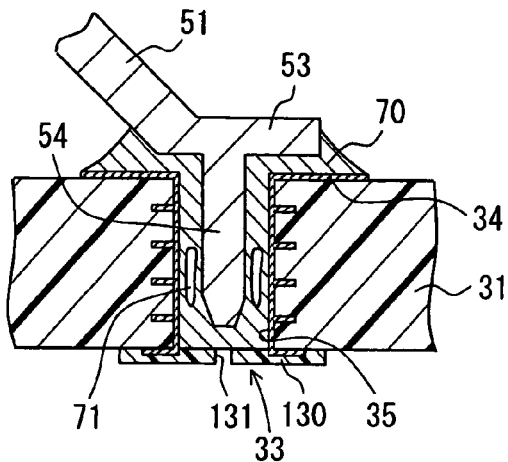
FIGS. 30A and 30B are explanatory views of a part of the manufacture of the electronic control device according to a fourth embodiment, showing the reflow process and a removal process after the reflow process.
Figure 30B:
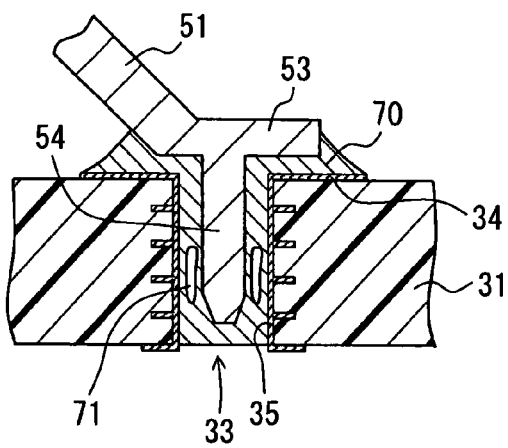

Next, a fourth embodiment of the present invention will be described based on FIGS. 29A and 29B and FIGS. 30A and 30B. FIGS. 29A and 29B are explanatory views of the concept of manufacture of the electronic control device according to the second embodiment by the manufacturing method shown in the first embodiment. FIG. 29A shows a status before the reflow process, and FIG. 29B, a status after, the reflow process. FIGS. 30A and 30B are explanatory views of a part of the manufacture of the electronic control device according to a fourth embodiment. FIG. 30A shows the reflow process, and FIG. 30B, a removal process after the reflow process.

As the electronic control device and its manufacturing method according to the fourth embodiment have many commonalities with the structure shown in the second embodiment (the manufacturing method shown in the first embodiment is applied to the structure shown in the second embodiment), the detailed explanations of such commonalities will be omitted hereinbelow, but the difference will be mainly described. Further, in the present embodiment, constituent elements identical to those in the second embodiment have the same reference numerals.

When the electronic control device 100 shown in the second embodiment (the end of the insertion member 54 is not projected to the rear surface side of the connector mounting surface of the printed circuit board 31) is manufactured by the manufacturing method shown in the first embodiment, in a status before the reflowing as shown in FIG. 29A, even when the solder 70 is filled in the through hole 33 in a position closer to the connector mounting surface by a sufficient amount to ensure the connection reliability, upon reflowing, the molten solder 70 may flow to the rear surface side of the connector mounting surface and escape to the outside of the through hole 33 as shown in FIG. 29B in accordance with size of the gap between the through hole 33 (the insertion land 35) and the insertion member 54, viscosity of the molten solder 70, specific gravity or the like. As a factor of this phenomenon, it can be conceivable that, the downward force such as gravity (in the direction to the rear surface of the printed circuit board 31) is higher than the force to hold the solder 70 in the gap by the capillary phenomenon, when, for example, the diameter of the through hole 33 is very large in comparison with the diameter of the insertion member 54. When such phenomenon occurs, the amount of the solder 70 on the surface land 34 may be reduced, or the void 71 may occur in the through hole 33, and the connection reliability may be lowered. Further, the solder 70 may fall from the through hole 33 to the outside of the printed circuit board 31, which may cause inconvenience. Note that in accordance with viscosity of the solder 70, in addition to the time of reflowing, in the coating process, the solder paste 70 may flow to the rear surface side of the connector mounting surface and escape to the outside of the through hole 33. In this case, the above inconvenience occurs.

On the other hand, as a feature of the present embodiment, the escape of the solder 70 to the outside of the through hole 33 is suppressed by the completion of the reflow process. More particularly, after the completion of the coating process, before execution of the reflow process, as shown in FIG. 30A, a covering process is performed to fix an insulating member 130 (for example, to attach a resin film) so as to cover the opening of the through hole 33 on the rear surface side, to the rear surface of the connector mounting surface of the printed circuit board 31. Then, the reflow process is performed in the status where the opening of the through hole 33 on the rear surface side is covered with the insulating member 130. As shown in FIG. 30A, the molten solder 70 remains in the through hole 33. Then after the completion of the reflow process, the insulating member 130 is removed as shown in FIG. 30B.

In this manner, according to the manufacturing method of the electronic control device 100 according to the present embodiment, upon reflowing, the escape of the molten solder 70 to the outside of the through hole 33 is suppressed. Accordingly, the connection reliability can be ensured.

Note that when the through hole 33 is airtightly sealed with the insulating member 130, it is conceivable that upon occurrence of air expansion and contraction in the through hole 33 (void 71) by heating and cooling upon reflowing, a stress acts on the solder junction and the connection reliability is lowered (for example, a crack occurs). On the other hand, in the present embodiment, as shown in FIG. 30A, a hole having a diameter smaller than the through hole 33 is provided, as a ventilation member 131 to ventilate the through hole 33 to the outside of the printed circuit board 31 but not to pass the solder 70, in a part of the insulating member 130 covering the opening. Accordingly, the degradation of the connection reliability can be suppressed.

Further, when the insulating member 130 having the ventilation member 131 is used, a capping process may be performed before execution of the coating process as well as before the reflow process. In this case, as the air in the through hole 33 can be escaped to the outside via the ventilation member 131, the solder 70 can be efficiently filled in the through hole 33 can be suppressed. Further, the escape of the solder paste 70 to the outside of the through hole 33 can be suppressed. Accordingly, the connection reliability can be ensured.

Figure 31:
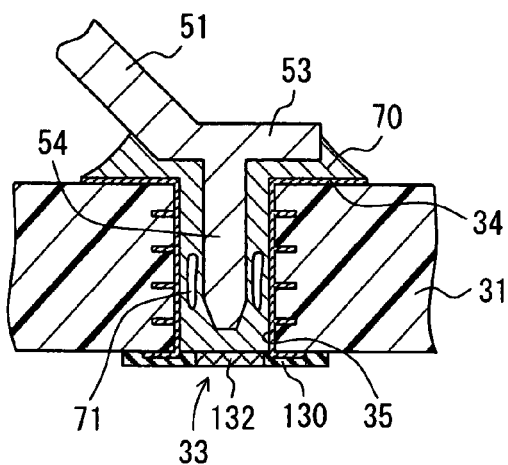
FIG. 31 is a cross-sectional view of a modification of an insulating member.

Note that the structure of the insulating member 130 is not limited to the above structure. For example, as shown in FIG. 31, the insulating member 130 may have a mesh member or a porous member as a ventilation member 132. Further, the insulating member 130 without ventilation members 131 or 132 may be employed. FIG. 31 is a cross-sectional view of the modification of the insulating member 130.

Figure 32:
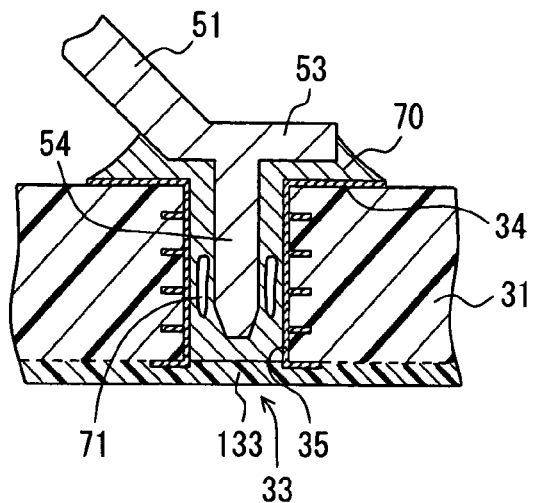
FIG. 32 is a cross-sectional view of another modification of the insulating member.
Figure 33:
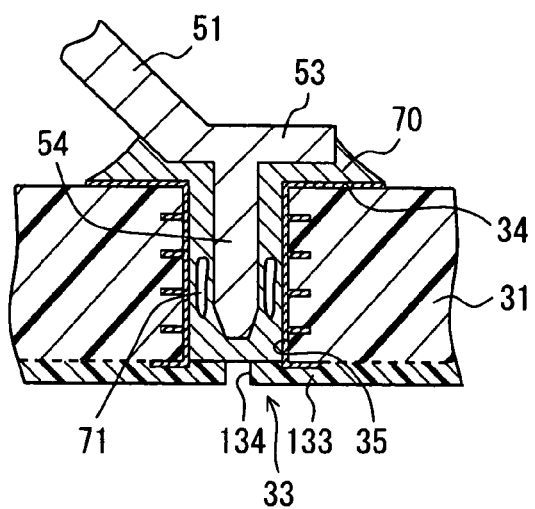
FIG. 33 is a cross-sectional view of another modification of the insulating member.

Further, in the present embodiment, the insulating member 130 is removed after the reflow process. However, it may be arranged such that the insulating member 130 is not removed but fixed to the rear surface of the connector mounting surface of the printed circuit board 31 as the electronic control device 100. For example, in FIG. 32, a member having a material the same as that of the printed circuit board 31 is used as an insulating member 133. The insulating member 133 is fixed to the printed circuit board 31 where the through hole 33 is filled with the solder 70, so as to cover the opening on the rear surface side of the through hole 33. In this manner, as the insulating member 133 is built up on the rear surface of the printed circuit board 31, the escape of the molten solder 70 to the outside of the through hole 33 upon reflowing can be suppressed. In this case, the insulating member 133 can be utilized as a part of the printed circuit board 31. As the through hole 33 is sealed with the insulating member 133, the through hole 33 becomes a non-perforated hole. FIG. 32 is a cross-sectional view of the modification of the insulating member 133. Further, as shown in FIG. 33, when a ventilation member 134 (a laser-machined hole in FIG. 18) is provided in a part of the insulating member 133 covering the opening, in a status where the insulating member 133 is built up on the rear surface of the printed circuit board 31, the degradation of the connection reliability can be suppressed as described above. In this manner, when a hole as shown in FIG. 33 is provided as the ventilation member 134, the printed circuit board 31 has a through hole 33 in which the diameter of its opening on the side of the connector mounting surface is smaller than that on the rear surface. FIG. 33 is a cross-sectional view of the modification of the insulating member 133. Note that it may be arranged such that the insulating member 133 previously provided with the ventilation member 134 is built up on the rear surface of the printed circuit board 31. Further, even though the insulating member 133 is not built up, upon formation of the through hole 33 in the printed circuit board 31, the through hole 33 may be formed such that the diameter of its opening in the rear surface of the connector mounting surface is smaller than that on the side of the connector mounting surface, and more preferably, the diameter of its opening in the rear surface of the connector mounting surface is smaller than the terminal diameter of the insertion member 54. In this structure, the degradation of the connection reliability can be suppressed, and the connection reliability can be ensured. For example, this structure may be realized by forming a hole in the thickness direction of the printed circuit board 31 from the side of the connector mounting surface to a predetermined depth, then forming a hole with a diameter smaller than the former hole from the rear surface side, and connecting these holes.

Figure 34A:
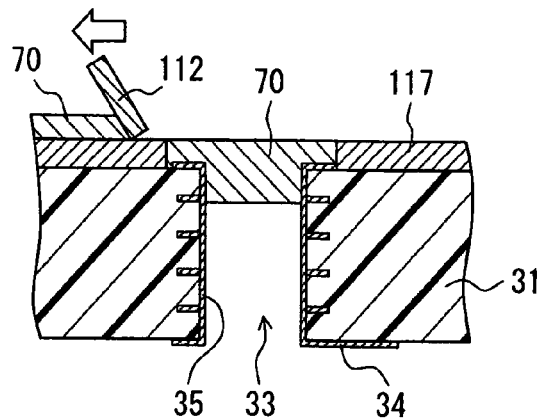
FIGS. 34A and 34B are explanatory views of a modification of the manufacture, showing the coating process on the rear surface side and the coating process on the connector mounting surface side.
Figure 34B:
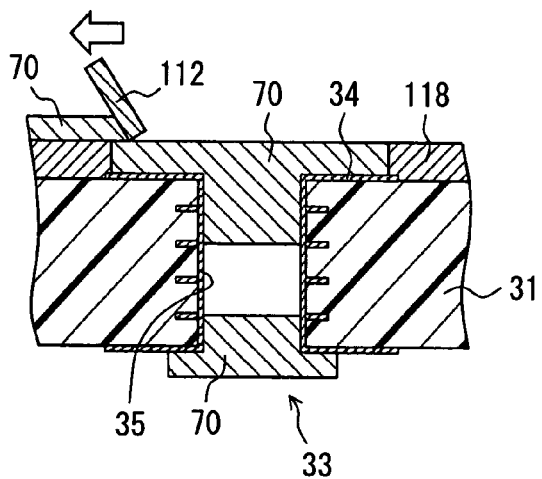

Further, in the printed circuit board 31, the escape of the molten solder 70 to the rear surface side of the printed circuit board 31 via the through hole 33 upon reflowing can be suppressed by utilizing reflowing on the rear surface side of the connector mounting surface. More particularly, before execution of the coating process on the connector mounting surface side of the printed circuit board 31, first, the coating process is performed on the rear surface side of the printed circuit board 31 as shown in FIG. 34A. Thereafter, the reflow process is performed, thereby the opening of the through hole 33 on the rear surface side is covered with the solder 70. Then, in the status where the opening of the through hole 33 on the rear surface side is covered with the solder 70, the coating process is performed on the connector mounting surface side of the printed circuit board 31 as shown in FIG. 34B. Thereafter, the reflow process is performed. Thus the escape of the molten solder 70 to the rear surface side of the printed circuit board 31 via the through hole 33 upon reflowing can be suppressed. Note that according to the manufacturing method, upon coating on the connector mounting surface side, as the opening of the through hole 33 on the rear surface side is covered with the solder 70, the solder 70 cannot be filled in the through hole 33 without difficulty from the connector mounting surface side. However, as the solder 70 is also filled in the through hole 33 from the rear surface side of the connector mounting surface, the contact area between the insertion member 54 of the branch terminal 51 and the solder 70 can be increased. FIGS. 34A and 34B are explanatory views of the modification of the manufacture. FIG. 34A shows the coating process on the rear surface side, and FIG. 34B, the coating process on the connector mounting surface side. Note that numerals 117 and 118 in FIGS. 34A and 34B denote a screen.

Fifth Embodiment

Figure 35:
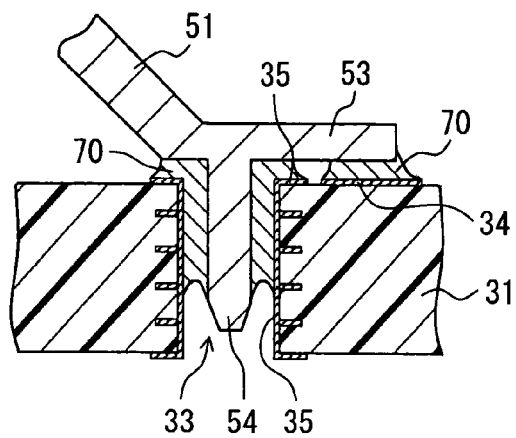
FIG. 35 is an expanded cross-sectional view of the peripheral portion of the connector mounted on the printed circuit board in the electronic control device according to a fifth embodiment.
Figure 36:
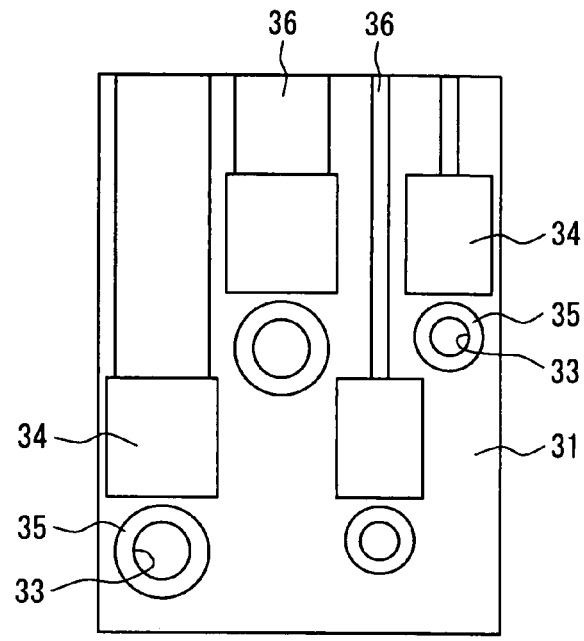
FIG. 36 is an expanded plan view of the peripheral portion of the connector mounted on the printed circuit board in the connector mounting surface.

Next, a fifth embodiment of the present invention will be described based on FIGS. 35 and 36. FIG. 35 is an expanded cross-sectional view of the peripheral portion of the connector mounted on the printed circuit board in the electronic control device according to the fifth embodiment. FIG. 36 is an expanded plan view of the peripheral portion of the connector mounted on the printed circuit board in the connector mounting surface.

As the electronic control device 100 and its manufacturing method according to the fifth embodiment have many commonalities with those in the first and second embodiments, the detailed explanations of such commonalities will be omitted hereinbelow, but the difference will be mainly described. Further, in the present embodiment, constituent elements identical to those in the first and second embodiments have the same reference numerals.

In the first and second embodiments, the surface land 34 and the insertion land 35 are integrally formed as one land solder-bonded to the branch terminal 51. On the other hand, as a feature of the present embodiment, as shown in FIGS. 35 and 36, the surface land 34 and the insertion land 35 corresponding to the same one branch terminal 51 are separated on the connector mounting surface of the printed circuit board 31.

In this structure, upon reflowing, the spread of the solder 70 between the surface land 34 and the insertion land 35 can be suppressed. That is, upon reflowing, the structure can suppress the flow of a part of the solder 70 provided on the surface land 34 into the through hole 33 (the gap between the through hole 33 and the insertion member 54) by the capillary phenomenon and/or gravity, and suppress the reduction of the amount of the solder on the surface land 34. As a result, as an excellent solder fillet is formed in the surface member 53 of the branch terminal 51 on the surface land 34, the connection reliability can be improved.

Note that although the surface land 34 and the insertion land 35 are separated, as the solder 70 is provided on the insertion land 35 (in the through hole 33) in the coating process, desired connection reliability can be ensured between the branch terminal 51 and the lands 34 and 35 while upsizing of the surface land 34 is suppressed.

Sixth Embodiment

Figure 37:
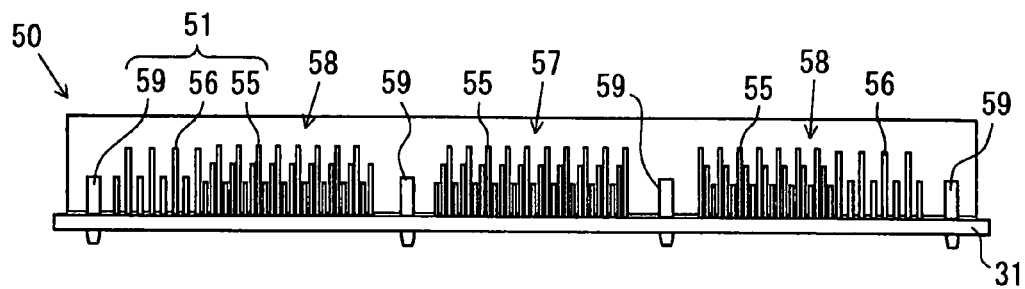
FIG. 37 is a plan view of the connector mounted on the printed circuit board in the electronic control device according to a sixth embodiment viewed from the side of connection between the printed circuit board and the terminals.
Figure 38:
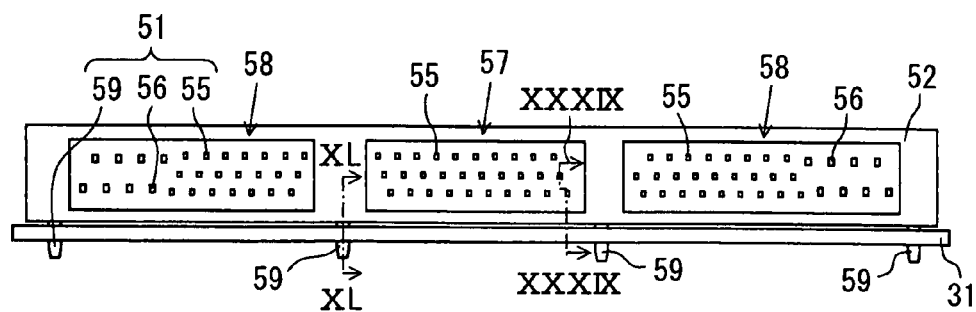
FIG. 38 is a plan view of the connector mounted on the printed circuit board viewed from the side of connection between the printed circuit board and external connectors.
Figure 39:
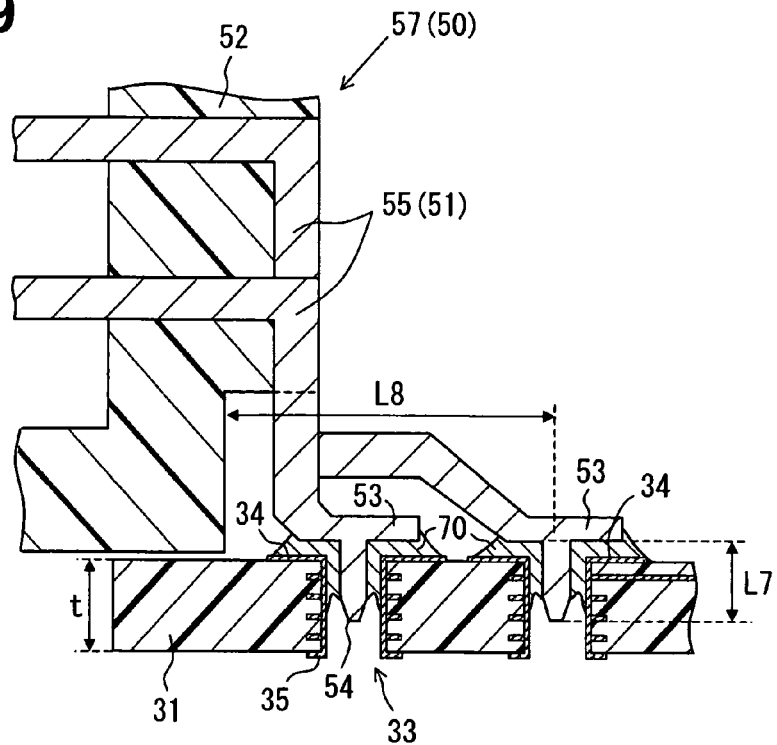
FIG. 39 is a cross-sectional view along a line XXXIX-XXXIX in FIG. 38.
Figure 40:
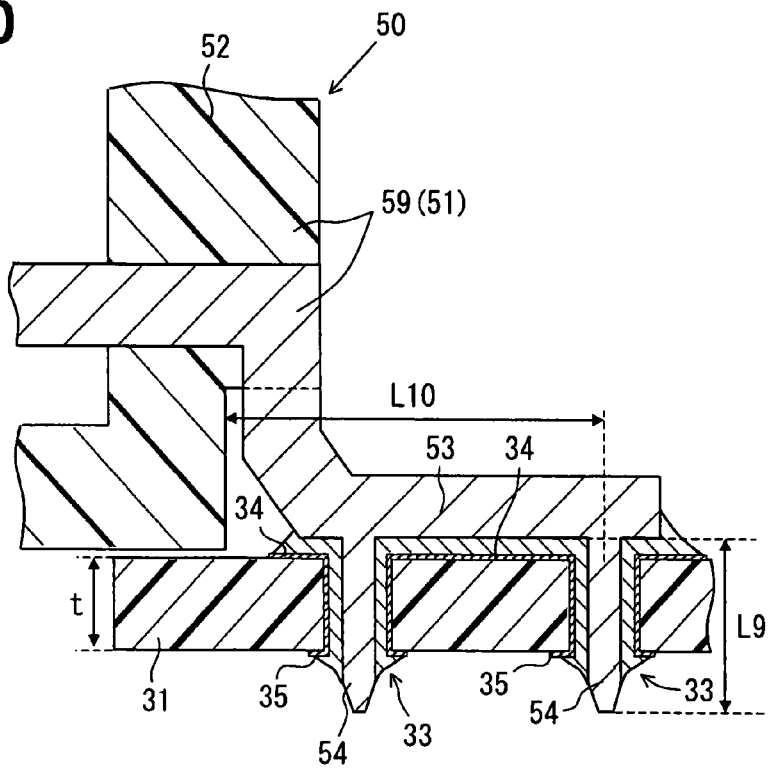
FIG. 40 is a cross-sectional view along a line XL-XL in FIG. 38.
Figure 41:
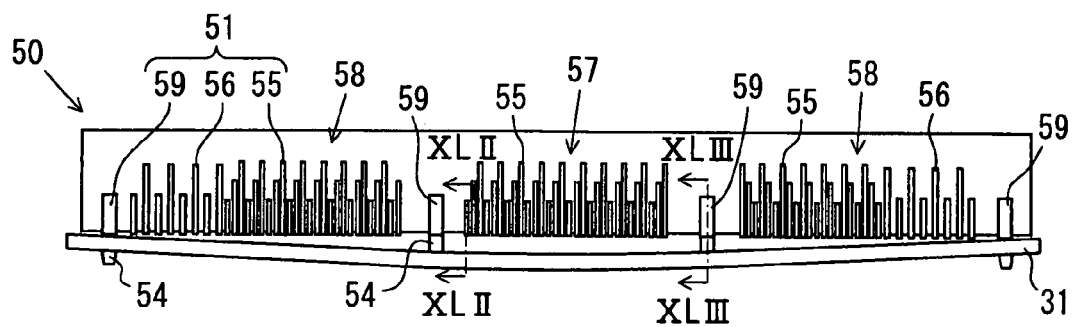
FIG. 41 is a plan view showing warp of the printed circuit board in the reflow process.
Figure 42:
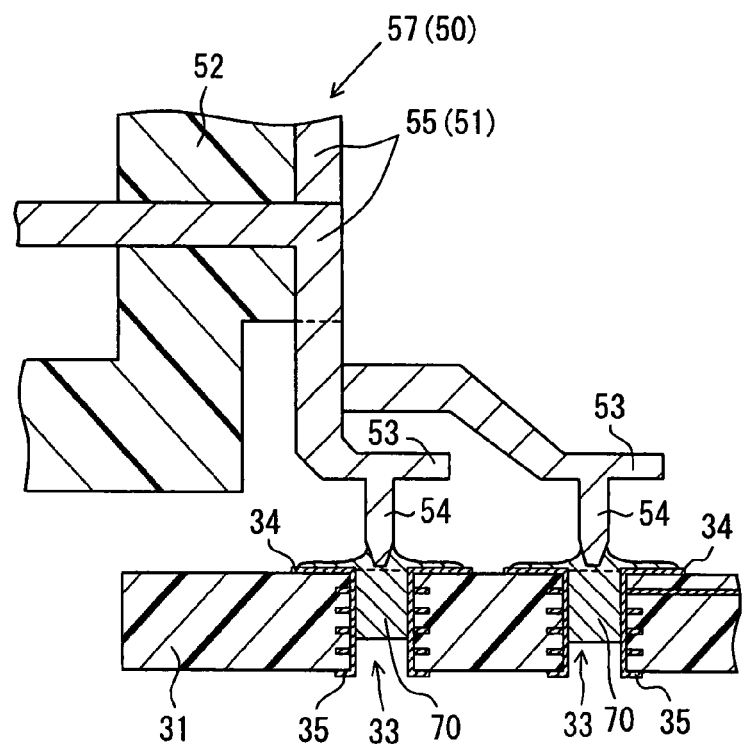
FIG. 42 is a cross-sectional view along a line XLII-XLII in FIG. 41.
Figure 43:
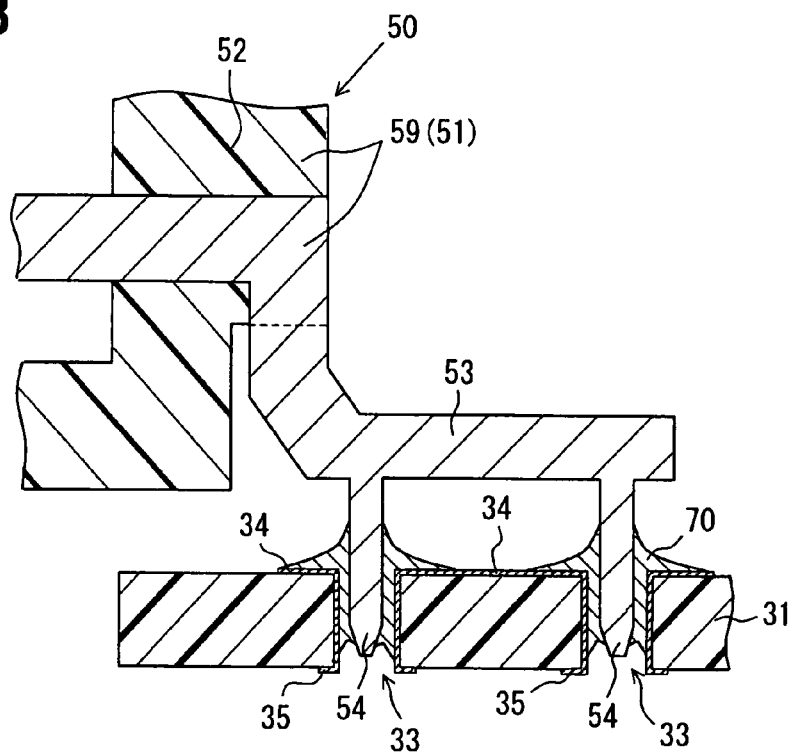
FIG. 43 is a cross-sectional view along a line XLIII-XLIII in FIG. 41.

Next, a sixth embodiment of the present invention will be described based on FIGS. 37 to 43. FIG. 37 is a plan view of the connector mounted on the printed circuit board in the electronic control device according to the sixth embodiment, viewed from the side of connection between the printed circuit board and the terminals. FIG. 38 is a plan view of the connector mounted on the printed circuit board viewed from the side of connection between the printed circuit board and external connectors. FIG. 39 is a cross-sectional view along a line XXXIX-XXXIX in FIG. 38. FIG. 40 is a cross-sectional view along a line XL-XL in FIG. 38. FIG. 41 is a plan view showing warp of the printed circuit board in the reflow process. FIG. 42 is a cross-sectional view along a line XLII-XLII in FIG. 41. FIG. 43 is a cross-sectional view along a line XLIII-XLIII in FIG. 41.

As the electronic control device and its manufacturing method according to the sixth embodiment have many commonalities with those in the above-described respective embodiments, the detailed explanations of such commonalities will be omitted hereinbelow, but the difference will be mainly described. Further, in the present embodiment, constituent elements identical to those in the above-described respective embodiments have the same reference numerals.

In the second embodiment, among the solder-bonded terminals, all the terminals to provide an electrical connection function are the branch terminals 51. In a status where the end of the insertion member 54 of the branch terminal 51 is reflow-mounted, the end of the insertion member 54 is provided in the same position as that of the rear surface of the connector mounting surface of the printed circuit board 31 (flat-top) or between the electronic component mounting surface and its rear surface. In this structure, the insertion member 54 is not projected to the rear surface side of the connector mounting surface of the printed circuit board 31 while it is reflow-mounted. Accordingly, the connection status between the branch terminal 51 and the corresponding lands 34 and 35 is determined by externally observing the connection status between the surface member 53 and the holder 70 from the connector mounting surface side of the printed circuit board 31, and by extension, the connection reliability is ensured. However, when the number of the branch terminals 51 is large and the surface members 53 are densely provided, the inspection by external observation is difficult.

Accordingly, as a feature of the present embodiment, as plural solder-bonded terminals, the terminal having the structure shown in the second embodiment, i.e., a short-leg terminal in which the length of the leg of the insertion member 54 is short, and further, a long-leg terminal in which the length of the leg of the insertion member 54 is longer than that of the short-leg terminal, are used. In the long-leg terminal, at least in a status before the reflow-mounting, the end of the insertion member 54 is projected to the rear surface side of the printed circuit board 31. Note that the length of the leg of the insertion member 54 means the length between the starting point of the insertion member 54 extended from the surface member 53 to the end of the insertion member 54.

In the present embodiment, among the solder-bonded terminals, the first terminal 55 with a smaller diameter, the second terminal 56 with a diameter larger than that of the first terminal 55, and the reinforcing terminal 59 are used as the branch terminals 51. That is, all the solder-bonded terminals are the branch terminals 51. In the first terminal 55 and the second terminal 56 to provide an electrical connection function between the printed circuit board 31 and the connector 50 (external connector), when reflow-mounted, the end of the insertion member 54 is in the same position as that of the rear surface of the electronic component mounting surface of the printed circuit board 31 or a position between the electronic component mounting surface and its rear surface as shown in FIG. 39. That is, they are the short-leg terminals. More particularly, in the first terminal 55 and the second terminal 56, the length of the legs of the insertion members 54 are both predetermined length, L7 (in FIG. 39, the first terminal 56 is shown as a representative). The predetermined length L7 is equal to or less than the thickness t of the printed circuit board 31 (in FIG. 39, shorter than the thickness t). Further, among the insertion members 54 of the first terminals 55 and the second terminals 56, the distance of the insertion member 54, inserted in the through hole 33 farthest from the housing 52, to e.g. the center, is a predetermined distance L8. Note that upon reflow mounting of the first terminal 55 and the second terminal 56 having the above structure, the manufacturing methods and structures in the above-described embodiments can be employed.

Further, in the reinforcing terminal 59, which does not provide an electrical connection function between the printed circuit board 31 and the connector 50 (external connector) but improves bond strength of the connector 50 to the printed circuit board 31, in a status where the insertion member 54 is inserted in the corresponding through hole 33 and at least before reflow-mounted (FIG. 40 shows a status after the reflowing), the end of the insertion member 54 is projected to the rear surface side of the electronic component mounting surface of the printed circuit board 31. That is, the reinforcing terminal 59 is a long-leg terminal. Note that when the end of the insertion member 54 is projected to the rear surface side of the electronic component mounting surface of the printed circuit board 31 after the reflowing, the structure is the same as that shown in the first embodiment (see FIG. 5). More particularly, in the reinforcing terminal 59, the leg of the insertion member 54 is set to a predetermined length L9 longer than the thickness t of the printed circuit board 31. Further, in the present embodiment, the length L9 of the insertion member 54 of the reinforcing terminal 59 is equal to or less than the sum of the length L7 of the insertion member 54 of the first terminal 55 and the second terminal 56 and the thickness t of the printed circuit board 31 (in FIG. 40, the length L9 is less than the sum). Further, among the insertion members 54 of the reinforcing terminals 59, the distance from the insertion member 54 inserted in the through hole 33 farthest from the housing 52 to e.g. the center is set to a predetermined length L10 longer than the predetermined length L8. Note that the predetermined lengths L8 and L10 are set with reference to the same position in the surface in the housing 52 where the terminals are extended.

Note that when the terminal diameters are the same, as the length of the insertion member 54 is long, the durability of the insertion member 54 is lowered, and the insertion member 54 is easily deformed. Accordingly, it is preferable that the diameter of the long-leg terminal is larger than that of the short-leg terminal. In the present embodiment, the reinforcing terminal 59 as a long-leg terminal has a terminal diameter (cross-section) thicker than that of the first terminal 55 and the second terminal 56 (greater than the cross-sectional area). In the lengthwise direction of the housing 52, at least one (in FIGS. 37 and 38, respectively one in the both ends) reinforcing terminal 59 is provided in both end areas. Further, in the central area between the end areas, at least one (in FIGS. 37 and 38, two away from each other) reinforcing terminal 59 is provided. That is, the four reinforcing terminals 59 as long-leg terminals are provided in positions away from each other.

Further, in the printed circuit board 31, the opening diameter of the through hole 33 is set in correspondence with the terminal diameter of the corresponding insertion member 54. That is, the through hole 33 corresponding to the reinforcing terminal 59 as a long-leg terminal is larger than the through hole 33 corresponding to the first terminal 55 or the second terminal 56 as a short-leg terminal. Further, the surface land 34 is larger in the reinforcing terminal 59. It is preferable that the setting of the through hole 33 and the surface land 34 are made such that upon reflowing, the molten solder 70 can be supplied in the through holes 33 without causing void and the solder 70 can be held in the through holes 33.

In this manner, according to the present embodiment, among the branch terminals 51, the first terminal 55 and the second terminal 56 to provide an electrical connection function are short-leg terminals. That is, almost all the plural branch terminals 51 are short-leg terminals, and only a part of the terminals are long-leg terminals which requires a large amount of solder 70. Accordingly, the connection reliability can be improved without increasing the surface land 34 and increasing the amount of the solder 70. Further, the connection reliability can be improved on the rear surface side of the printed circuit board 31. These advantages are equivalent to or similar to the advantages shown in the second embodiment (see FIG. 25).

Especially in the present embodiment, as the four reinforcing terminal 59 as long-leg terminals are simply provided away from each other, the influence of reflow-heat disturbance with the insertion member 54 of the long-leg terminal projected to the rear surface side of the printed circuit board 31 can be reduced upon reflowing.

Further, in the present embodiment, in the long-leg terminals as a part of the plural branch terminals 51, at least in a status before the reflow-mounting, the end of the insertion member 54 is projected to the rear surface side of the printed circuit board 31 (particularly, the length L9 of the leg of the insertion member 54 is longer than at least the thickness t of the printed circuit board 31). Accordingly, in a status where the solder-joined terminal is connected to the corresponding land, the status of exposure of the insertion member 54 of the reinforcing terminal 59 (exposed/unexposed and the degree of exposure) is observed from the rear surface side of the printed circuit board 31, thereby the connection status between the terminals other than the long-leg terminals and the solder 70 can be determined without inspecting the connection status between the terminals other than the long-leg terminals (in the present embodiment, the first terminals 55 and the second terminals 56) and the solder 70, and by extension, the connection reliability can be ensured.

Especially in the present embodiment, the length L9 of the leg of the insertion member 54 of the reinforcing terminal 59 is equal to or less than the sum of the length L7 of the leg of the insertion member 54 of the first terminal 55 and the second terminal 56 and the thickness t of the printed circuit board 31. Accordingly, after the reflowing, when the insertion member 54 of the reinforcing terminal 59 is projected to the rear surface side of the printed circuit board 31, it is determined that the a part of the insertion members 54 of the first terminal 55 and the second terminal 56 are provided inside the through holes 33 (connection with the solder 70 is excellent). On the other hand, when the insertion member 54 of the reinforcing terminal 59 is not projected to the rear surface side of the printed circuit board 31, it is determined that the insertion members 54 of the first terminal 55 and the second terminal 56 are floated from the through holes 33 (the connection with the solder 70 is poor). Accordingly, the connection status between the insertion members 54 of the first terminal 55 and the second terminal 56 and the solder 70 can be determined by the inspection by observation from the rear surface side of the printed circuit board 31, and by extension, the connection reliability can be ensured.

Further, even when the connector 50 is inclined, as the insertion member 54 of the reinforcing terminal 59 (long-leg terminal) abuts on the wall surface of the through holes 33, dropping of the insertion members 54 of the first terminal 55 and the second terminal 56 (short-leg terminals) from the through holes 33 can be suppressed. This also improves the connection reliability of the solder-bonded terminals. Especially in the present embodiment, among the insertion members 54 of the reinforcing terminals 59, the distance L10 from the insertion member 54 inserted in the through hole 33 farthest from the housing 52 to e.g. the center is longer than the distance L8 from the insertion member 54 among the first terminals 55 and the second terminals 56 inserted in the through hole 33 farthest from the housing 52. Accordingly, the amount of inclination of the connector 50 (the amount of looseness of the housing 52), limited by abutment of the insertion member 54 of the reinforcing terminal 59 (long-leg terminal) on the wall surface of the through hole 33, can be smaller than a case where the distance L10 is equal to or shorter than the distance L8. That is, the connection reliability between the terminals other than the long-leg terminal and the solder 70 can be further improved.

Further, to ensure the connection reliability of the long-leg terminal itself having the insertion member 54 projected to the rear surface side of the printed circuit board 31 at least before the reflowing, it is necessary to supply the solder 70 the amount of which is larger than that in the short-leg terminals, to the through holes 33, as described in the above-described embodiment. For this purpose, it is preferable that the size of the surface land 34 corresponding to the surface member 53 of e.g. a long-leg terminal is increased, and as the number of long-leg terminals is increased, the size of the printed circuit board 31 is increased. On the other hand, in the present embodiment, the reinforcing terminal 59 is used as a long-leg terminal. To perform the function of the reinforcing terminal 59 for improvement in the connection reliability of the connector 50 to the printed circuit board 31., it is preferable to increase the size of the surface land 34 corresponding to the surface member 53 of the reinforcing terminal 59. In this manner, since the size of the surface land 34 corresponding to the reinforcing terminal 59 is large in any way (even when the reinforcing terminal 59 does not function as a long-leg terminal), it is not necessary to increase the size of the printed circuit board 31 when the reinforcing terminal 59 is used as a long-leg terminal. That is, in the structure including the long-leg terminals, upsizing of the printed circuit board 31, by extension, upsizing of the electronic control device 100, can be suppressed.

Further, in the present embodiment, in the lengthwise direction of the housing 52, the reinforcing terminal 59 as a long-leg terminal is provided in respectively one position in both ends. As described above, as the number of terminals is increased, the co-planarity in connection portions between the terminals and the lands cannot be ensured without difficulty. The amount of deformation of the printed circuit board 31 (the amount of deformation along the surface of the printed circuit board 31) is increased in a position away from the center of the housing 52 in the lengthwise direction of the housing 52. Accordingly, when at least one long-leg terminal (reinforcing terminal 59) is provided in the end area, the positional shift between the terminals and corresponding lands can be more effectively suppressed. Further, when the long-leg terminal is provided in the end area, as the insertion status of the insertion member 54 in the through hole 33 can be easily checked, positioning of the long-leg terminals with respect to the through holes 33 can be facilitated. Further, as described above, the insertion member 54 of the long-leg terminal has a terminal diameter larger than that of the insertion member 54 of the short-leg terminal, and the opening diameter of the corresponding through hole 33 is large. Accordingly, as the through hole 33 having the large opening diameter disturbs wiring from the land, the freedom of wirings from the lands can be improved when the through hole 33 having a large opening diameter is provided in the end area.

Further, in the present embodiment, in the lengthwise direction of the housing 52, the reinforcing terminal 59 as a long-leg terminal is also provided in the central area between the end areas. In the reflow process, as the printed circuit board 31 is heated while it is conveyed with its opposed ends supported, the central portion between the ends is deformed downward as shown in FIG. 41, in accordance with weight of mounted electronic components or weight of itself. That is, upon reflowing, the amount of deformation of the printed circuit board 31 in its thickness direction is larger in the central portion than that in the ends. Accordingly, when at least one long-leg terminal is provided in the central portion in the lengthwise direction of the housing 52, the connection status between all the terminals except the long-leg terminals and the solder 70 can be determined based on the exposure status of the long-leg terminal provided in the central area, in comparison with a structure where the long-leg terminal is not provided in the central area. For example, as shown in FIG. 43, when the insertion member 54 of the reinforcing terminal 59 as a long-leg terminal provided in the central area is not exposed on the rear surface side of the printed circuit board 31, the insertion member 54 of the first terminal 55 as a short-leg terminal provided in the central area is floated from the through hole 33 as shown in FIG. 42. As described above, as the degree of floating status of the insertion member 54 of the first terminal 55 is higher in the central area than in the ends of the printed circuit board 31, the connection status between the terminals other than the long-leg terminals and the solder 70 can be precisely determined based on inspection by external observation of the reinforcing terminal 59 as a long-leg terminal provided in the central area, and by extension, the connection reliability can be ensured.

Note that in the present embodiment, the length L9 of the insertion member 54 of the reinforcing terminal 59 as a long-leg terminal is equal to or less than the sum of the length L7 of the insertion member 54 of the first terminal 55 and the second terminal 56 as short-leg terminals and the thickness t of the printed circuit board 31. However, these lengths may be arbitrarily set as long as the length L7 of the insertion member 54 of the first terminal 55 and the second terminal 56 is equal to or less than the thickness t of the printed circuit board 31 and the length L9 of the insertion member 54 of the reinforcing terminal 59 is longer than at least the thickness t of the printed circuit board 31. That is, as long as the insertion member 54 of the long-leg terminal inserted in the through hole 33 is exposed on the rear surface side of the printed circuit board 31 before the reflowing, the connection status between the terminals other than the long-leg terminal and the solder 70 can be determined based on the degree of exposure of the insertion member of the long-leg terminal after the reflowing, and by extension, the connection reliability can be ensured. For example, even when the length L9 of the insertion member 54 of the long-leg terminal is greater than the sum of the length L7 of the insertion member 54 of the short-leg terminal and the thickness t, the connection status between the terminals other than the long-leg terminal and the solder 70 can be determined by providing a memory (gauge) or a reference mark on the insertion member 54 of the long-leg terminal.

Further, in the present embodiment, the branch terminal 51 (the first terminal 55, the second terminal 56 and the reinforcing terminal 59) has the approximately T-shaped structure. However, the shape of the branch terminal 51 is not limited to the above structure. For example, the structure shown in FIGS. 26 and 27 may be employed.

Further, in the present embodiment, in the reinforcing terminal 59, two insertion members 54 are extended from one surface member 53. However, as long as at least one insertion member 54 is extended from one surface member 53, the number of the insertion member is not particularly limited.

Figure 44:
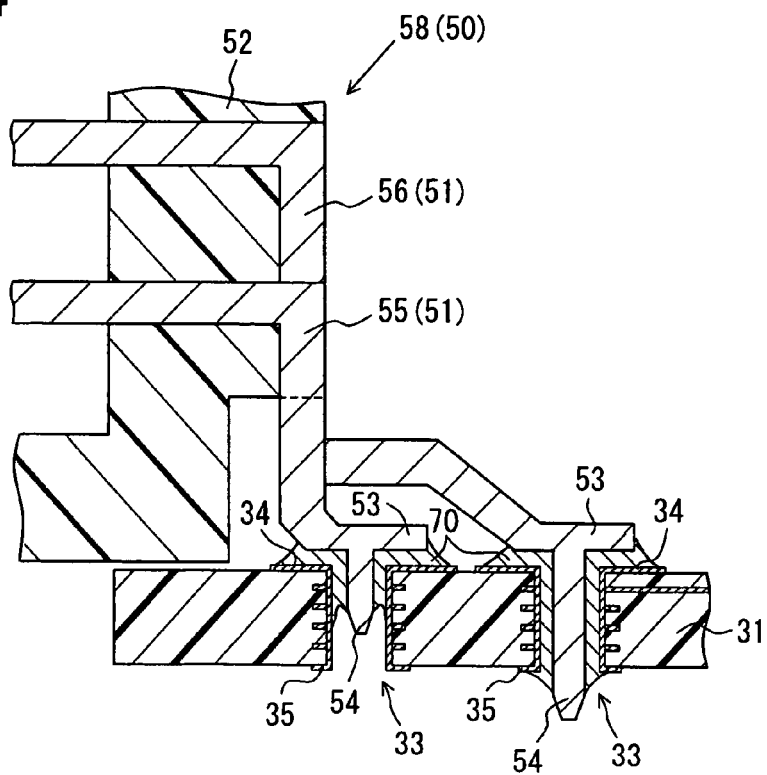
FIG. 44 is a cross-sectional view showing a modification.

Further, in the present embodiment, among the solder-bonded terminals, the reinforcing terminal 59 which does not provide an electrical connection function is employed as a long-leg terminal. However, a part of the terminals which provide an electrical connection function may be employed as long-leg terminals. In the present embodiment, the first terminal 55 as a so-called signal terminal for signal transmission having a small diameter and the second terminal 56 as a so-called power terminal for electric power transmission having a diameter larger than that of the first terminal 55 are used as the terminals which provide an electrical connection function. Further, in accordance with terminal diameter, the size of the surface land 34 corresponding to the second terminal 56 is larger than that corresponding to the first terminal 55. Accordingly, when at least a part of the second terminals 56 are long-leg terminals, more solder 70 can be supplied to the through holes 33, and the connection reliability between the long-leg terminals and the solder 70 can be improved. Further, in the lengthwise direction of the housing 52, when the second terminal 56 with a large terminal diameter is provided outside the first terminal 55 i.e. in the end portion, the freedom of wiring from the land can be improved. For example, in FIG. 44, the first terminal 55 is a short-leg terminal, and the second terminal 56 is a long-leg terminal. FIG. 44 is a cross-sectional view showing the modification.

Figure 45:
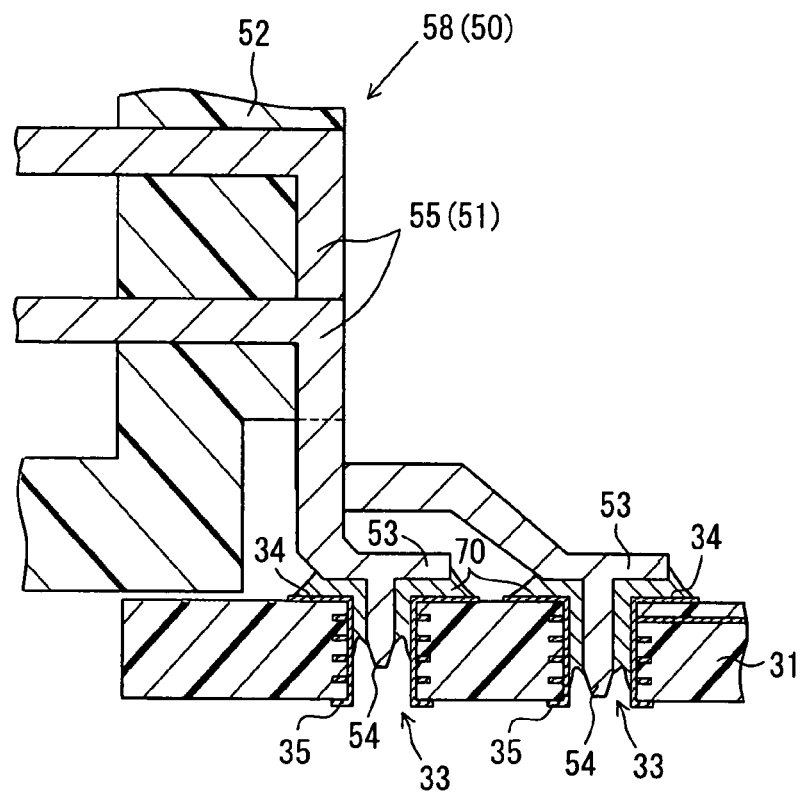
FIG. 45 is a cross-sectional view showing another modification.

Further, in the present embodiment, the length L7 of the insertion member 54 of the short-leg terminal and the length L9 of the insertion member 54 of the long-leg terminal respectively have one value. However, it may be arranged such that at least one of the lengths of the insertion members 54 of the short-leg terminal and the long-leg terminal is set in multiple steps (plural types) within a range satisfying the above relation. For example, as shown in FIG. 45, in the structure shown in the present embodiment (the reinforcing terminal 59 is a long-leg terminal), the length of the insertion member 54 of the first terminal 55 may be set in multiple steps. As the insertion member 54 is inserted in multiple steps in accordance with the length of the insertion member 54 in the corresponding through hole 33, the stress upon insertion of the insertion member 54 in the through hole 33 can be reduced (the stress can be dispersed). That is, bending of the terminal upon insertion (bending of the insertion member 54) or the like can be suppressed. FIG. 45 is a cross-sectional view showing the modification.

Figure 46:
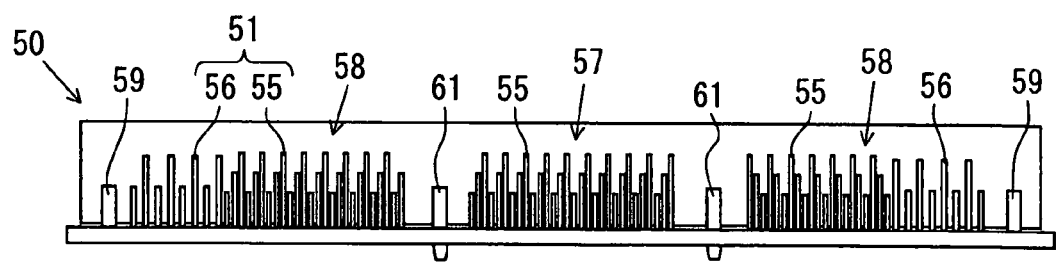
FIG. 46 is a plan view showing another modification.

Further, in the present embodiment, a part of the branch terminals 51 are long-leg terminals. However, it may be arranged such that the connector 50 has a positioning pin with its end projected to the rear surface side of the printed circuit board 31 in a status at least before the terminals are connected with the lands, in addition to the solder-bonded terminal. That is, the positioning pin which is not solder-bonded may be used in place of the solder-bonded long-leg terminal. For example, in FIG. 46, a positioning pin 61 is employed in place of two reinforcing terminals 59 provided in the central area. The positioning pin 61 is not connected with the solder 70, but is inserted in the through hole 33, thereby effectively suppresses the positional shift between the terminals and the corresponding lands in a status before the terminals and the lands are connected (the solder 70 is in molten state). Further, in the status where the terminals are connected with the lands, the connection status between the solder-bonded terminals (the branch terminals 51) and the solder 70 is determined based on the degree of exposure of the positioning pin 61 on the rear surface side of the printed circuit board 31, and by extension, the connection reliability can be ensured. FIG. 46 is a plan view showing the modification.

The preferred embodiments of the present invention have been described as above, however, the present invention is not limited to the above-described embodiments but various modifications can be made within a scope not departing from the subject matter of the present invention.

Figure 47:
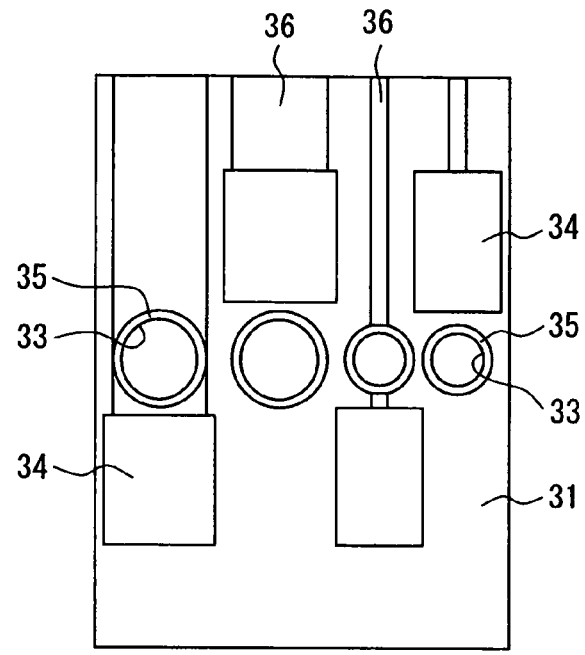
FIG. 47 is a plan view showing a modification of the printed circuit board.

In the above-described embodiments, the through holes 33 and the surface lands 34 are arranged in a zigzag array on the printed circuit board 31. However, the arrangement of the through holes 33 and/or the surface lands 34 is not limited to the zigzag array. Further, the array of the through holes 33 and/or the surface lands 34 is not limited to the multiple step array in the direction away from the housing 52. In the structure where the plural through holes 33 are arrayed in one line and at least a part of the through holes 33 are adjacent to each other, the following arrangement is preferable. That is, in the lengthwise direction of the housing 52, when the width of the surface land 34 is larger than the diameter of the through hole 33 and/or the outer diameter of the opening peripheral portion of the insertion land 35, it may be arranged such that, as shown in FIG. 47, the surface lands 34 corresponding to the mutually adjacent through holes 33 are alternately provided in a position closer to the housing 52 than the corresponding through hole 33 and a position farther away from the housing 52 than the corresponding through hole 33 in the array direction of the through holes 33. That is, the adjacent surface lands 34 are provided over the array of the through holes 33. In this arrangement, the size of the printed circuit board 31 in the lengthwise direction of the housing 52 can be reduced. Further, as the through holes 33 are arrayed in one line, on the rear surface side of the connector mounting surface of the printed circuit board 31, the freedom of arrangement of other electronic components 32 and the wirings 36 extended from the insertion lands 35 can be improved. FIG. 47 is a plan view showing the modification of the printed circuit board.

Figure 48:
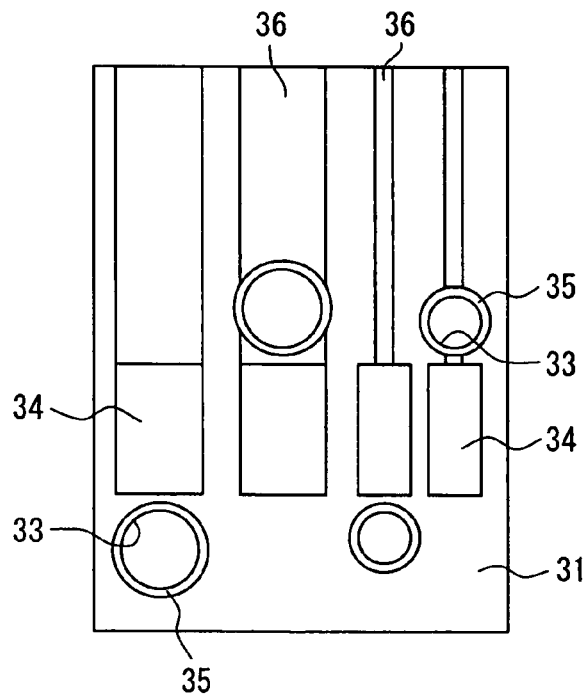
FIG. 48 is a plan view showing another modification of the printed circuit board.

Further, in a structure where the plural surface lands 34 are arrayed in one line, and among the plural arrayed surface lands 34 and 37, at least a part of the surface lands 34 corresponding to the branch terminals 51 are adjacent to each other, the following arrangement is preferable. That is, in the lengthwise direction of the housing 52, when the diameter of the through hole 33 and/or the outer diameter of the opening peripheral portion of the insertion land 35 is larger than the width of the surface land 34, it may be arranged such that, as shown in FIG. 48, the through holes 33 corresponding to the mutually adjacent surface lands 34 are alternately provided in a position closer to the housing 52 than the corresponding surface land 34 and a position farther away from the housing 52 than the corresponding surface land 34 in the array direction of the surface lands 34. That is, the adjacent through holes 33 are provided over the array of the surface lands 34. In this arrangement, the size of the printed circuit board 31 in the lengthwise direction of the housing 52 can be reduced. Further, as the surface lands 34 are arrayed in one line, the heat in the reflowing can be uniformly transmitted to all the junctions between the surface members 53 and the surface lands 34. FIG. 48 is a plan view showing the modification of the printed circuit board.

Figure 49:
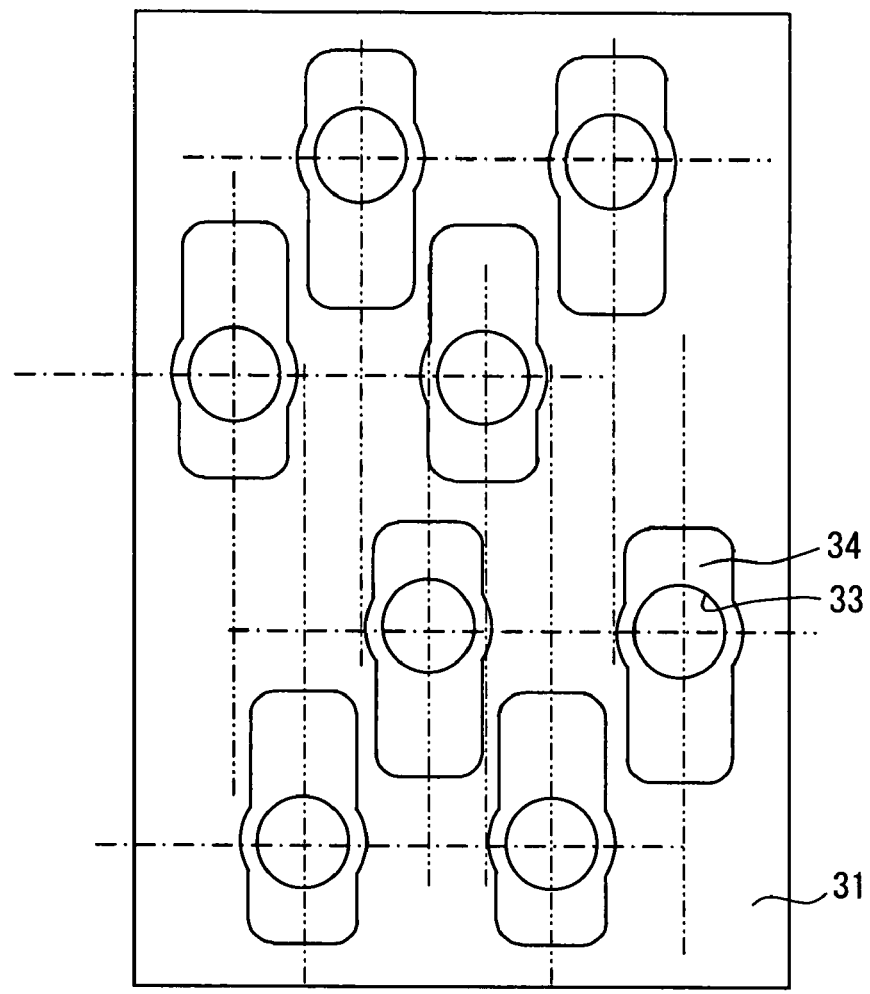
FIG. 49 is a plan view showing another modification of the printed circuit board.

Further, when the through holes 33 and the surface lands 34 are arranged in a zigzag array on the printed circuit board 31 (arranged in a multi-step array in the direction away from the housing 52), it may be arranged such that, as shown in FIG. 49, a part of the through holes 33 and the surface lands 34 in the respective steps in the direction away from the housing 52 are overlapped with each other. In FIG. 49, in a four step array, the surface lands 34 in the first step and the surface lands 34 in the second step, the surface lands 34 in the third step and the surface lands 34 in the fourth step are partially overlapped in the direction away from the housing 52. In this arrangement, the printed circuit board 31, by extension, the electronic control device can be downsized in the direction away from the housing 52. Further, in the arrangement in FIG. 49, in the lengthwise direction of the housing 52, the diameter of the through hole 33 and/or the outer diameter of the opening peripheral portion of the insertion land 35 (in FIG. 49, this portion is illustrated as the surface land 34 for the sake of convenience) is larger than the width of the surface land 34. In this structure, when the surface lands 34 are not overlapped with the opening peripheral portions of the through holes 33 as shown in FIG. 49, the printed circuit board 31, by extension, the electronic control device can be downsized in the lengthwise direction of the housing 52. Further, in FIG. 49, the positions of the respective through holes 33 and the surface lands 34 (the central positions of the through holes 33) are shifted in the lengthwise direction of the housing 52. More specifically, the positions of the surface lands 34 are shifted to the third step, then the first step, then the fourth step, and the second step. FIG. 49 is a plan view showing the modification of the printed circuit board.

In the above described respective embodiments, the connector 50 is shown as an example of an electronic component including branch terminals, and the electronic control device 100 in which the connector 50 is mounted on the printed circuit board 31 is shown as an example of an electronic device in which electronic components are mounted on a printed circuit board. However, the above-described structure and the manufacturing method can be employed as long as an electronic component has plural terminals extended from a main body, and equivalent or similar advantages to those shown in the above-described respective embodiments can be expected. For example, the structure and the manufacturing method may be applied to the electronic component 32 (e.g., a microcomputer) other than the connector 50 shown in FIG. 1.

Further, in the above described respective embodiments, the end of the terminal on the side mounted on the circuit board 30 is extended from one surface of the housing 52 (main body) of the connector 50 (electronic component). However, even in a structure where the end of the terminal on the side mounted on the circuit board 30 is extended from plural surfaces of the main body, the above-described structure and the manufacturing method can be employed.

In the above described respective embodiments, the first terminal 55 and the second terminal 56 with a diameter larger than that of the first terminal are used as the terminals which provide an electrical connection function. However, the type of the terminals to provide an electrical connection function is not particularly limited. Further, the number of terminal blocks is not particularly limited.

In the above described respective embodiments, the electronic control device 100 has a non-watertight structure. However, the invention is applicable to an electronic control device having a watertight structure.

In the above described respective embodiments, the solder 70 is filled in the through holes 33 in the coating process. However, when the surface land 34 and the insertion land 35 are integrally formed as one land, it may be arranged such that the solder 70 is not filled in the through hole 33 but provided only on the surface land 34. In this case, in the reflow process, the solder 70 on the surface land 34 flows into a gap (opposing area) between the through hole 33 (the insertion land 35 formed in the wall surface of the through hole 33) and the insertion member 54 by the capillary phenomenon and/or gravity, thereby the insertion land 35 and the insertion member 54 are solder-bonded. However, since it is difficult to ensure excellent junction status between the surface land 34 and the surface member 53 and between the insertion land 35 and the insertion member 54 only with the solder 70 on the surface land 34, it is preferable as described above that the solder 70 is filled in the through holes 33 in the coating process.

Seventh Embodiment

Figure 50:
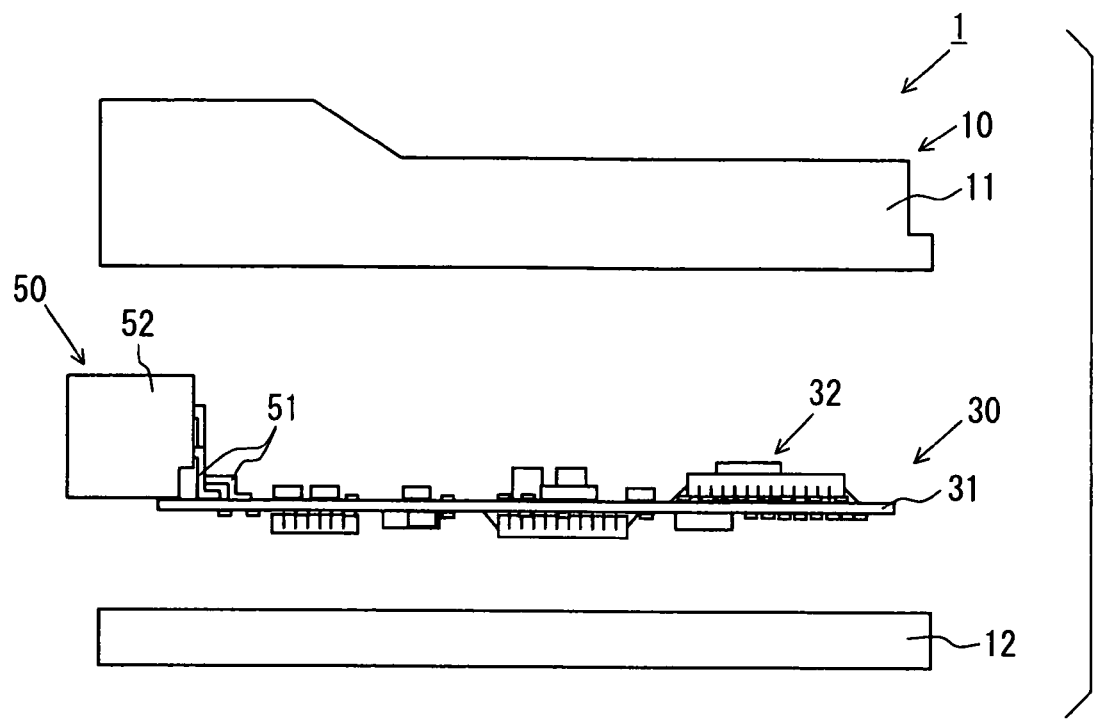
FIG. 50 is an exploded diagram showing a pre-assembly status for explanation of the schematic structure of an electronic control device according to a seventh embodiment.
Figure 51:
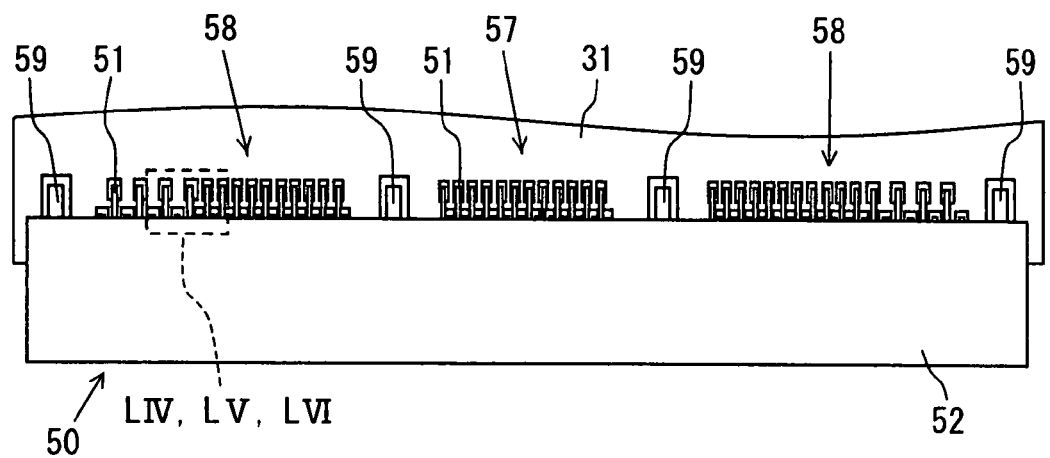
FIG. 51 is a plan view of a peripheral portion of a connector mounted on a printed circuit board.
Figure 52:
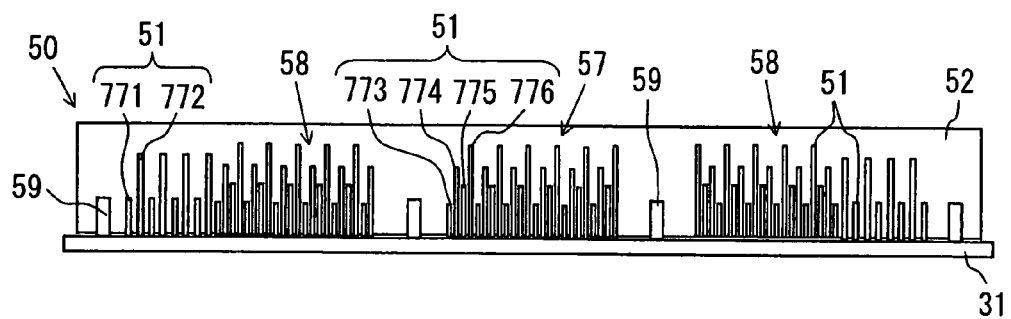
FIG. 52 is a plan view of the connector mounted on the printed circuit board viewed from the side of connection between the printed circuit board and terminals.
Figure 53:
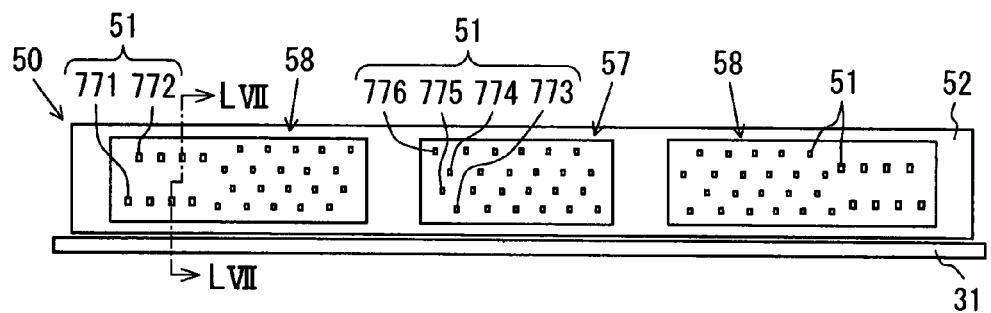
FIG. 53 is a plan view of the connector mounted on the printed circuit board viewed from the side of connection between the printed circuit board and external connectors.
Figure 54:
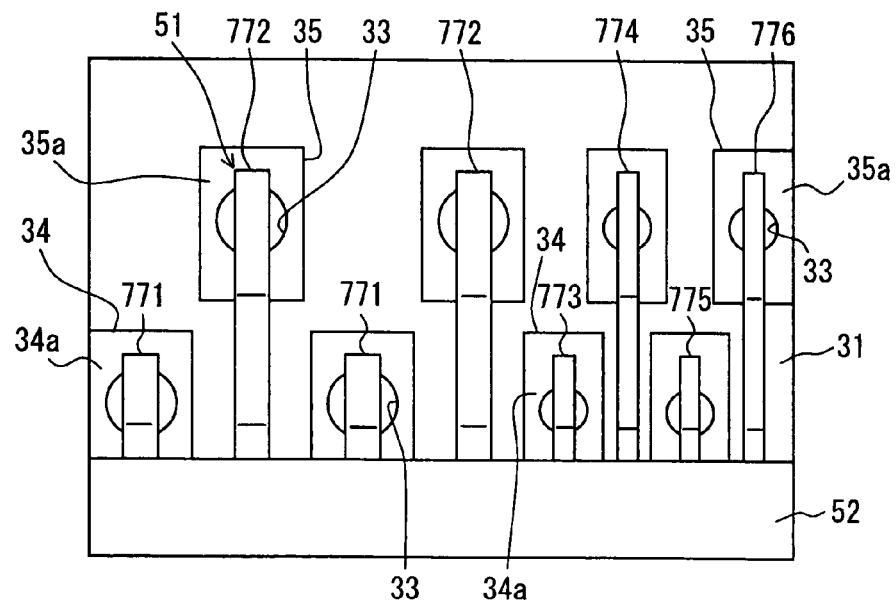
FIG. 54 is an expanded plan view of an area indicated with a broken line LIV in FIG. 51 on the side of a housing mounting surface.
Figure 55:
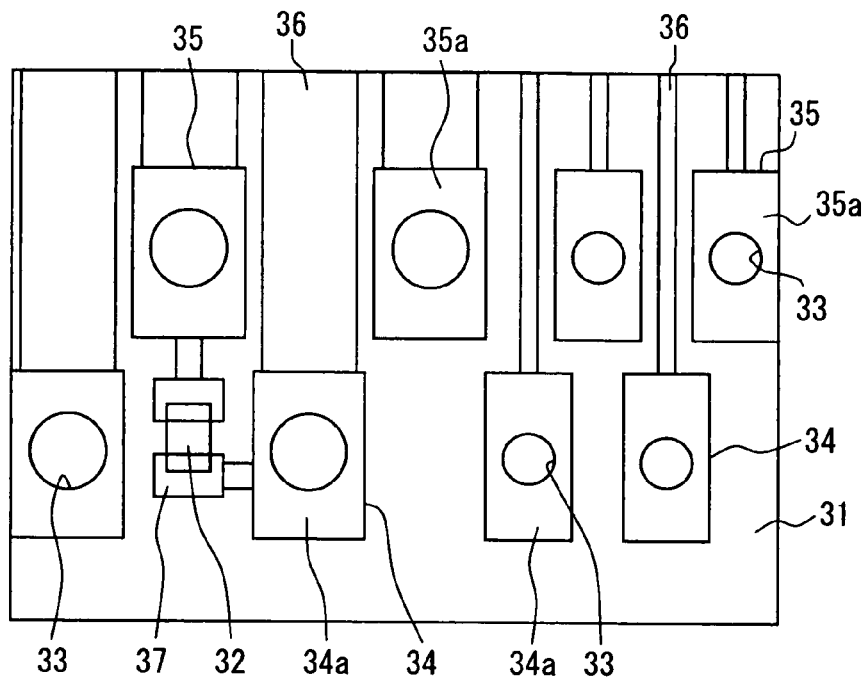
FIG. 55 is an expanded plan view of the housing mounting surface of the printed circuit board in the area indicated with the broken line LV in FIG. 51.
Figure 56:
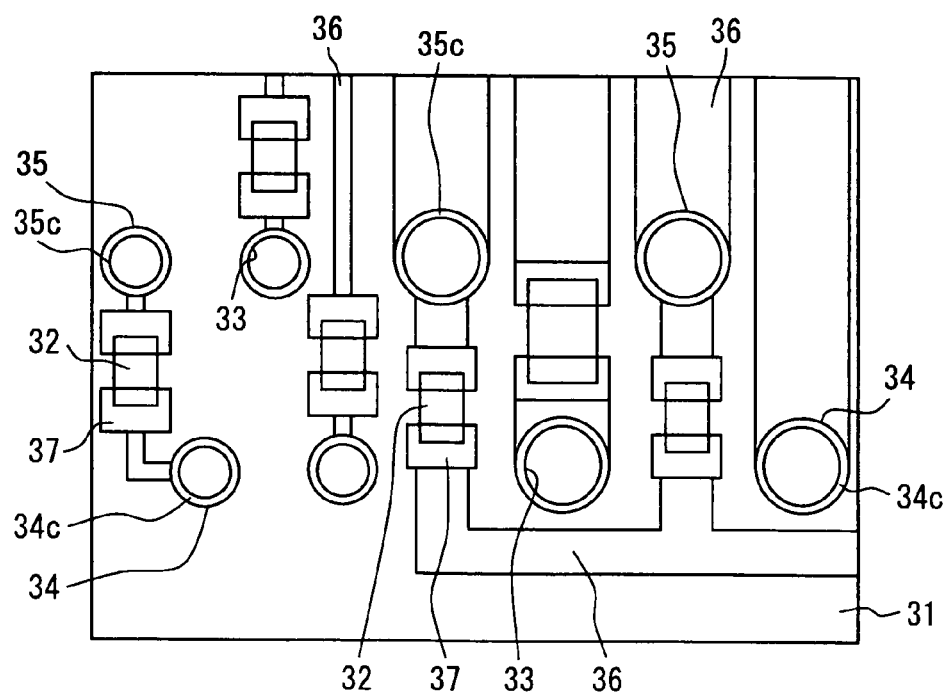
FIG. 56 is an expanded plan view of the rear surface side of the housing mounting surface of the printed circuit board in the area indicated with the broken line LVI in FIG. 51.
Figure 57:
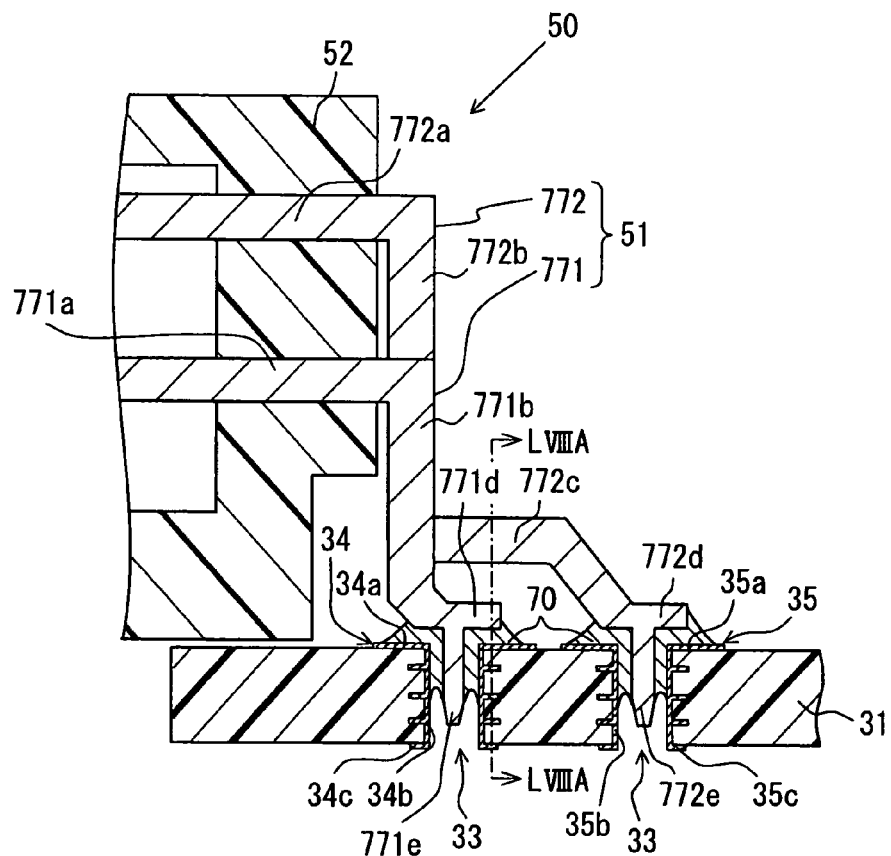
FIG. 57 is a cross-sectional view along a line LVII-LVII in FIG. 53.
Figure 58A:
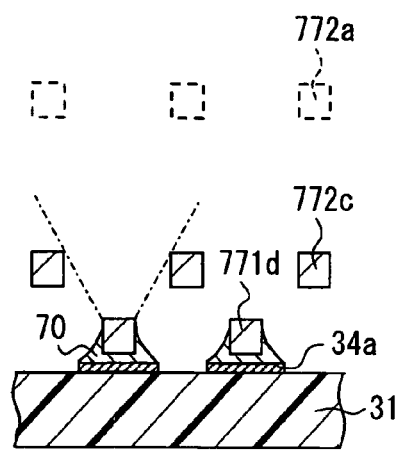
FIG. 58A is a cross-sectional view along a line LVIII-LVIII in FIG. 57.
Figure 58B:
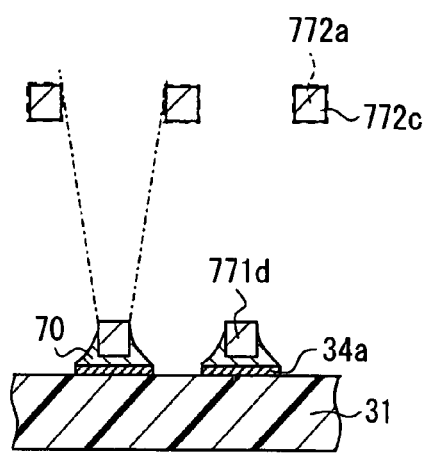
FIG. 58B is a cross-sectional view showing a comparative example of FIG. 58A.

FIG. 50 is an exploded diagram showing a pre-assembly status for explanation of the schematic structure of an electronic control device according to a seventh embodiment. FIG. 51 is a plan view of a peripheral portion of a connector mounted on a printed circuit board. FIG. 52 is a plan view of the connector mounted on the printed circuit board viewed from the side of connection between the printed circuit board and terminals. FIG. 53 is a plan view of the connector mounted on the printed circuit board viewed from the side of connection between the printed circuit board and external connectors. FIG. 54 is an expanded plan view of an area indicated with a broken line in FIG. 51 on the side of a housing mounting surface. FIG. 55 is an expanded plan view of the housing mounting surface of the printed circuit board in the area indicated with the broken line in FIG. 51. FIG. 56 is an expanded plan view of the rear surface side of the housing mounting surface of the printed circuit board in the area indicated with the broken line in FIG. 51. FIG. 57 is a cross-sectional view along a line LVII-LVII in FIG. 53. FIG. 58A is a cross-sectional view along a line LVIII-LVIII in FIG. 57. FIG. 58B is a cross-sectional view showing a comparative example of FIG. 58A. Note that in FIG. 54, electronic components other than solder and the connector are omitted for the sake of convenience. Further, in FIGS. 55 and 56, the solder and solder resist are omitted for the sake of convenience.

The electronic control device shown in the present embodiment has a non-watertight structure. The electronic control device is used as, e.g., a vehicle engine ECU (Electric Control Unit).

An electronic control device 1 shown in FIG. 50 corresponds to an electronic device. The electronic control device 1 includes, as primary elements, a circuit board 30 where electronic components 32 are mounted on a printed circuit board 31, and a connector 50, corresponding to an electronic component, mainly having a housing 52 and terminals 51 with mounting members to be reflow-soldered. Further, in the present embodiment, the electronic control device 1 includes a casing 10 accommodating the circuit board 30 and the connector 50 in addition to the above constituent elements.

The casing 10 is formed of metal material such as aluminum or iron or synthetic resin material. The casing 10 accommodates the circuit board 30 and a part of the connector 50. The number of the parts of the casing 10 is not particularly limited. The casing 10 may be formed with one part or with plural parts. In the present embodiment, as shown in FIG. 50, the casing 10 is formed with a box-shaped case 11 with one side opened, and a cover 12, shaped as an approximately rectangular flat plate, closing the opening of the case 11. The casing 10, having internal space to accommodate the circuit board 30 and the connector 50, is formed by assembling the case 11 and the cover 12. Further, the casing 10 (case 11) is provided with a notch (not shown) corresponding to the connector 50. When the case 11 and the cover 12 are engaged (not shown) so as to accommodate the circuit board 30, the circuit board 30 and a part of the connector 50 (including the side of connection between the terminals 51 and the circuit board 30) are accommodated in the casing 10. The remaining part of the connector 50 (including the side of connection between the terminals 51 and external connectors) are exposed outside the casing 10.

As shown in FIG. 50, in the circuit board 30, wirings including lands as electrodes, via holes for connecting the wirings and the like are formed on the printed circuit board 31. The electronic components 32 such as a microcomputer, a power transistor, a resistor and a capacitor are mounted on the printed circuit board 31. In the present embodiment, as one of the electronic components 32, the connector 50 electrically connecting the circuit board 30 with the outside is mounted on the printed circuit board 31. Further, plural lands, to which the mounting members of the terminals 51 are reflow-soldered, are provided along an array direction of the terminals 51 with respect to the housing 52, on the printed circuit board 31. The lands are provided in plural lines in a direction vertical to the array direction of the terminals 51 and along a housing mounting surface of the printed circuit board 31. The lands of the respective lines are arranged in a zigzag array.

The number of lines (steps) of zigzag array is not particularly limited. In the present embodiment, as shown in FIGS. 54 to 56, as the lands, plural first lands 34 as a surface land are arrayed in one line along the array direction of the terminals 51, and plural second lands 35 as an insertion land are arrayed in one line along the array direction of the terminals 51 in positions farther away from the housing 52 than the first lands 34 (positions away from one end surface of the printed circuit board 31). The first lands 34 and the second lands 35 are arranged in a two-step zigzag array. In this arrangement, in comparison with an arrangement in which the first lands 34 and the second lands 35 are provided in one line, a large side fillet in a side surface of the terminal 51 can be formed in the array direction of the terminals 51, thereby the connection reliability can be improved. Further, in the array direction of the terminals 51, the printed circuit board 31 can be downsized, and by extension, the electronic control device 1 can be downsized. Further, in comparison with an arrangement in which the first lands 34 and the second lands 34 are provided in a lattice type arrangement, the pattern of wirings 36 extended from the respective lands 34 and 35 can be simplified. Further, as shown in FIGS. 55 and 56, the other electronic components 32 than the connector 50 can be provided around the respective lands 34 and 35. As such electronic components 32 provided around the respective lands 34 and 35, a surge absorber capacitor, a phase locking resistor and the like can be effectively provided. Further, as described later, the heat in reflowing is excellently applied to the respective lands 34 and 35 (especially the first lands 34 close to the housing 52 (one end surface of the printed circuit board 31), thereby the connection reliability can be improved. Note that reference numeral 37 in FIGS. 55 and 56 denotes a land for reflow-soldering to the electronic component 32.

The first lands 34 and the second lands 35 are provided on wall surfaces of through holes 33, formed from a housing 52 mounting surface of the printed circuit board 31 to its rear surface, and around the openings of the through holes 33. More particularly, as shown in FIGS. 54 and 57, the lands 34 and 35 have surface members 34a and 35a, provided around the opening of the through hole 33 on the housing mounting surface of the printed circuit board 31, and reflow-soldered to a part of the mounting members of the corresponding terminal 51, and wall surface members 34b and 35b, provided on the wall surface of the through hole 33, and reflow-soldered to a part of the mounting members of the corresponding terminal 51 while the mounting members are inserted in the through hole 33, and rear surface members 34c and 35c, provided around the opening of the through hole 33 on the rear surface of the housing mounting surface of the printed circuit board 31. The surface member 34a, the wall surface member 34b and the rear surface member 34c are integrated as one first land 34, and the surface member 35a, the wall surface member 35b and the rear surface member 35c are integrated as one second land 35. Note that in the present embodiment, the surface members 34a and 35a, and the wall surface members 34b and 35b are integrated (connected), however, it may be arranged such that the surface members 34a and 35a and the wall surface members 34b and 35b are not integrated and solder resist exists therebetween (electrically separated).

The shape of the lands 34 and 35 provided on the wall surface of the through hole 33 and around the opening of the through hole 33 is not particularly limited. In the present embodiment, the through hole 33 is positioned at the center of the surface members 34a and 35a having a flat rectangular shape. In this structure, as described later, upon reflowing, solder provided on the surface members 34a and 35a uniformly flows in the through hole 33 from symmetric positions with the through hole 33 therebetween. Accordingly, an excellent solder fillet can be formed in the mounting members of the terminal 51 opposingly provided in the symmetric positions. Further, the reflowing heat is uniformly transmitted to the mounting member of the terminal 51 provided in the through hole 33 from the symmetric positions. Accordingly, variation of connection status between the respective symmetric positions and the mounting member of the terminal 51 can be reduced. Further, in the first land 34 and the second land 35, the surface members 34a and 35a are larger than the rear surface members 34c and 35c. In this structure, in comparison with a structure where the rear surface members 34c and 35c are larger than or the same size as the size the surface members 34a and 35a, a mounting disabled area for the electronic components 32 can be reduced in the rear surface of the housing mounting surface of the printed circuit board 31, and by extension, the printed circuit board 31 can be downsized.

Note that the shape and size of the through hole 33 is arbitrarily set in correspondence with the terminal 51 (the diameter of the mounting member) inserted in the through hole 33. In the present embodiment, as shown in FIGS. 54 to 56, the printed circuit board 31 has two type of the holes 33 having different diameters, i.e., through holes 33 having a small diameter corresponding to terminals 773 to 776 having a small diameter, and through holes 33 having a large diameter corresponding to terminals 771 and 772 having a diameter larger than that of the terminals 773 to 776. Note that in the present embodiment, the small diameter terminals 773 to 776 are signal terminals for signal transmission, and the large diameter terminals 771 and 772 are power terminals for electric power transmission. Accordingly, in addition to the size of the through hole 33, the size of the surface members 34a and 35a and the width of the wiring 36 are set in correspondence with the amount of electric current.

In the connector 50, the plural terminals 51 formed of conductive material are arrayed along the surface of the printed circuit board 31 with respect to the housing 52 (corresponding to a main body) formed of insulating material (resin in the present embodiment). As the terminal 51, any terminal may be employed as long as it has a structure where one end portion (mounting member) extended from the housing 52 is reflow-soldered to the corresponding land 34 or 35, and the other end portion extended from the housing 52 is exposed outside the casing 10 and electrically connected with an external connector. As such terminal 51, a so-called stamped terminal formed by integrating a terminal member having a previously-bent predetermined shape stamped from a metal plate and integrating the terminal member with the housing 52 by insert molding, or a so-called bend terminal formed by inserting a bar-shaped terminal member stamped from a metal plate into a hole provided in the housing 52 and bending the terminal member thereafter can be employed.

In the present embodiment, all the terminals 51 are brass-plated stamped terminals. As shown in FIGS. 51 to 53, the terminals are arrayed along the lengthwise direction of the housing 52 having a flat rectangular shape in a status where respective parts of the terminals are held in the housing 52 not so as to interfere with each other. In this manner, when the stamped terminals are employed as the terminals 51, the width of the respective terminals 51 in the array direction (the lengthwise direction of the housing 52) of the terminals 51 can be determined based on the thickness of the metal plate. Accordingly, by appropriately selecting the thickness of the metal plate, a stress caused by warp or the like of the printed circuit board 31 and/or the housing 52 in the lengthwise direction of the housing 52 can be mitigated with the spring force of the terminals 51, and the stress acting on the solder junctions can be reduced.

Further, as described above, in the present embodiment, the terminals 51 include the power terminals 771 and 772 and the signal terminals 773 to 776. Among the terminals 771 to 776, the terminals 771, 773 and 775 are connected with the first lands 34 on the near side with respect to the housing 52, and the terminals 772, 774 and 776 higher than the terminals 771 and 775 are connected with the second lands 35 on the far side with respect to the housing 52.

As the terminal 51 (771, 773 and 775) connected to the first land 34, any terminal may be used as long as it has a third parallel member which is approximately parallel to the housing mounting surface of the printed circuit board 31 and at least a part of which is fixed to the housing 52, and a second connection member which has one end connected to the third parallel member and the other end, connected with the mounting member to be mounted on the first land 34, directly or via a portion approximately parallel to the housing mounting surface of the printed circuit board 31 and exposed from the housing 52. For example, as shown in FIG. 57, the power terminal 771 connected with the first land 34 has a third parallel member 771*a* which has a portion approximately parallel to the housing mounting surface of the printed circuit board 31 and is fixed inside the housing 52 and a portion connected with the above portion and slightly projected from the housing 52 to the formation side of the lands 34 and 35, and a second connection member 771*b* which has an upper end connected with the third parallel member 771*a* and a lower end directly connected with a surface mounting member 771*d* and an insertion mounting member 771*e* as mounting members on the first land 34. Note that in the third parallel member 771*a*, the end other than the end connected with the second connection member 771*b* is connected with a connection member which is exposed to the opposite side to the formation side of the lands 34 and 35 from the housing 52 and connected with an external connector. Further, although not shown, the signal terminals 773 and 775 connected with the first lands 34 have a similar structure to that of the power terminal 771.

Further, as the terminal 51 (772, 774 and 776) connected with the second land 35, any terminal may be used as long as it has a first parallel member which is approximately parallel to the housing mounting surface of the printed circuit board 31 and at least a part of which is fixed to the housing 52, a second parallel member which is approximately parallel to the housing mounting surface of the printed circuit board 31 which has an and end exposed from the housing 52 on the side far from the housing 52 connected with a mounting member mounted on the second land 35, and a first connection member which connects the first parallel member with the second parallel member. Further, the first parallel member and the second parallel member may be arbitrarily set as long as the entire first parallel member is provided in the housing 52 or the first parallel member has a portion exposed from the housing 52 on the formation side of the lands 34 and 35 with a length shorter than the second parallel member 2, and the second parallel member is positioned closer to the housing mounting surface of the printed circuit board 31 than the first parallel member in the direction vertical to the housing mounting surface of the printed circuit board 31. Further, as shown in FIG. 57, the power terminal 772 connected with the second land 35 has a first parallel member 772*a* which has a portion approximately parallel to the housing mounting surface of the printed circuit board 31 and fixed inside the housing 52 and a portion connected to the above portion and projected from the housing 52 to the formation side of the lands 34 and 35, a second parallel member 772*c* which has an end approximately parallel to the housing mounting surface of the printed circuit board 31, exposed from the housing 52 on the side far from the housing 52 and connected with a surface mounting member 772*d* and an insertion mounting member 772*e* as mounting members on the second land 35, and a first connection member 772*b* which has an upper end connected with the first parallel member 772*a* and a lower end connected with the second parallel member 772*c*. Further, the first parallel member 772*a* has a portion exposed from the housing 52 to the formation side of the lands 34 and 35 with a length shorter than the second parallel member 772*c*. The second parallel member 772*c* is provided in a position closer to the housing mounting surface of the printed circuit board 31 than the first parallel member 772*a*, in the vertical direction to the housing mounting surface of the printed circuit board 31. Note that in the first parallel member 772*a*, the end other than the end connected with the first connection member 772*b* is connected with a connection member exposed from the housing 52 to the opposite side to the formation side of the lands 34 and 35 and connected with an external connector. Further, although not shown, the signal terminals 774 and 776 connected with the second lands 35 have a similar structure to that of the power terminal 772.

Further, in the terminal 51 (771, 773 and 775) connected with the first land 34 and the terminal 51 (772, 774 and 776) connected with the second land 35, the first connection member 772*b* and the second connection member 771*b* are approximately vertical to the housing mounting surface of the printed circuit board 31, and alternately arranged in one line along the array direction of the terminals 51. Further, the third parallel member 771*a* is positioned farther away from the housing mounting surface of the printed circuit board 31 than the second parallel member 772*c* on the same side with respect to the housing mounting surface of the printed circuit board 31.

In the vertical direction to the housing mounting surface of the printed circuit board 31, the number of steps of the terminals 51 (771 to 776) with respect to the housing 52 is not particularly limited. However, when the terminals 51 are provided in a multiple step array, in comparison with a one-step array, the printed circuit board 31 can be further downsized in the array direction of the terminals 51. In the present embodiment, as shown in FIGS. 52, 53 and 57, the terminals 51 are provided in a multiple steps in the vertical direction to the surface of the printed circuit board 31 with respect to the housing 52. More particularly, the power terminals 771 and 772 are provided in this order in two-step array, from the printed circuit board 31 side, with respect to the housing 52. As shown in FIG. 53, the power terminals 771 and the power terminals 772 are zigzag-provided in two steps with respect to the housing 52. Further, the signal terminals 773 to 776 are provided in a four-step array, i.e., the signal terminals 773, then the signal terminals 775, then the signal terminals 774, and the signal terminals 776, from the printed circuit board 31 side, with respect to the housing 52. As shown in FIG. 53, in the array direction of the terminals 51, the signal terminals 773, then the signal terminals 774, then the signal terminals 775, and the signal terminals 776, in this order, are zigzag-provided with respect to the housing 52. Further, as shown in e.g. FIG. 57, the first parallel member 772a of the terminal 51 (772, 774 and 776) connected with the second land 35 is positioned farther away from the housing mounting surface of the printed circuit board 31 than the third parallel member 771a of the terminal 51 (771, 773 and 775) connected with the first land 34. Note that the structure of the terminal 51 is a main feature of the present embodiment, and the advantages of the structure will be described later.

The mounting member of the terminal 51 is not particularly limited as long as it is reflow-soldered to the corresponding land 34 and 35. For example, a so-called surface mounting structure approximately parallel to the surface of the printed circuit board 31 may be employed, or an insertion mounting structure approximately vertical to the surface of the printed circuit board 31 and inserted in the through hole in the printed circuit board 31 may be employed. In the present embodiment, the respective terminals 51 have a branch terminal in which the surface mounting members 771d and 772d have a surface mounting structure and the insertion mounting members 771e and 772e have an insertion mounting structure, as described above, as the mounting members. The surface mounting members 771d and 772d of the terminal 51 are provided opposite to each other on the surface members 34a and 35a of the corresponding lands 34 and 35, and mechanically and electrically connected via solder 70. Further, the insertion mounting members 771e and 772e of the terminal 51, inserted in the corresponding through holes 33, are mechanically and electrically connected via solder with at least the wall surface members 34b and 35b of the corresponding lands 34 and 35.

In this structure, in the status where the insertion mounting members 771e and 772e of the terminal 51 are provided in the corresponding through holes 33 of the printed circuit board 31, the advantage of positioning can be obtained in the direction vertical to the thickness direction of the printed circuit board 31. Accordingly, upon e.g. reflowing, even when deformation such as warp occurs in at least one of the printed circuit board 31 and the housing 52 due to the difference between linear expansion coefficients of the printed circuit board 31 and the housing 52, the connection between the terminal 51 and the corresponding lands 34 and 35 can be ensured. Further, the insertion mounting members 771e and 772e are electrically and mechanically connected via the solder 70 with the wall surface members 34b and 35b of the corresponding lands 34 and 35 in a status where parts of the insertion mounting members 771e and 772e are inserted in the through holes 33. Accordingly, even when the number of the terminals 51 in the lengthwise direction of the housing 52 is large, co-planarity between the surface mounting members 771d and 772d and the surface members 34a and 35a of the corresponding lands 34 and 35 can be ensured. Accordingly, a contact area between the terminal 51 (the lands 34 and 35) and the solder 70 to satisfy desired connection reliability can be ensured. That is, in comparison with a case where the mounting member has a surface mounting structure, the connection reliability can be improved. Especially, in the present embodiment, since all the terminals 51 are branch terminals, the connection reliability can be further improved.

Further, in the present embodiment, as shown in e.g. FIG. 57, in the terminal 51 (772, 774, 776) connected with the second land 35, in the direction vertical to the array direction of the terminals 51 and along the surface of the printed circuit board 31, the surface mounting member 772d is extended from the end of the second parallel member 772c in a direction away from the housing 52. Further, as shown in e.g. FIG. 57, in the terminal 51 (771, 773 and 775) connected with the first land 34, in the direction vertical to the array direction of the terminals 51 and along the surface of the printed circuit board 31, the surface mounting member 771d is extended from the lower end of the second connection member 771b in the direction away from the housing 52. Accordingly, the reflowing heat is excellently applied to the mounting member.

Further, in the present embodiment, in the direction vertical to the array direction of the terminals 51 and along the surface of the printed circuit board 31, the surface mounting members 771d and 772d, then the insertion mounting members 771e and 772e, and the surface mounting members 771d and 772d are provided in this order as the mounting members of the terminal 51. That is, the terminal has an approximately T-shaped structure. When the terminal 51 having the approximately T-shaped structure is employed, when the terminal 51 has the surface mounting members 771d and 772d and the insertion mounting members 771e and 772e, in comparison with a structure where the insertion mounting members 771e and 772e are positioned closer to the housing 52 than the surface mounting members 771d and 772d (so-called heel structure), the blocking of the heat with the surface mounting members 771d and 772d is suppressed upon reflowing, thereby the heat is excellently transmitted to the insertion mounting members 771e and 772e (junctions between the insertion mounting members 771e and 772e and the corresponding wall surface members 34b and 35b). As a result, the connection reliability can be improved. Note that even in a structure where the insertion mounting members 771e and 772e are positioned farther away from the housing 52 than the surface mounting members 771d and 772d (so-called L-shaped structure), a similar advantage can be expected. Further, in the present embodiment, in all the terminals 51, the insertion mounting members 771e and 772e are positioned at the center between the both ends of the surface mounting members 771d and 772d. Accordingly, as the reflowing heat is uniformly transmitted from the surface mounting members 771d and 772d with the insertion mounting members 771e and 772e therebetween to the insertion mounting members 771e and 772e (the junctions between the insertion mounting members 771e and 772e and the wall surface members 34b and 35b), the variation of connection status between the surface mounting members 771d and 772d and the corresponding surface members 34a and 35a can be reduced.

Note that in addition to the advantage obtained with the terminal 51 having the approximately T-shaped structure (the advantage in comparison with the structure where the insertion mounting members 771e and 772e are provided in ends of the surface mounting members 771d and 772d in their lengthwise direction), various advantages can be expected. For example, as long as the size in the thickness direction of the printed circuit board 31 is the same, the packaging density of the electronic components 32 can be further improved in the approximately T-shaped structure. Further, even when a positional shift occurs due to rotation about the insertion mounting members 771e and 772e, in the approximately T-shaped structure, the surface mounting members 771*d* and 772*d* are not easily protruded from the surface members 34*a* and 35*a*, and the connection reliability (quality) can be ensured. Further, even when the terminal is inclined with respect to the surface of the printed circuit board 31, in the approximately T-shaped structure, the connection reliability (quality) can be ensured. Further, even when the solder 70 on the surface members 34*a* and 35*a* flows in the through holes 33 upon reflowing, in the approximately T-shaped structure, approximately equal thickness of solder can be maintained on the opposed surface members 34*a* and 35*a* with the through holes 33 therebetween and the connection reliability (quality) can be ensured. Further, in the approximately T-shaped structure, the side filled can be formed in many positions of the surface mounting members 771*d* and 772*d*, thereby the connection reliability can be improved.

Further, in the present embodiment, in all the terminals 51, as shown in e.g. FIG. 57, the ends of the insertion mounting members 771*e* and 772*e*, inserted in the corresponding through holes 33, are positioned between the housing mounting surface of the printed circuit board 31 and its rear surface. In this structure, as the opposing length between the insertion mounting members 771*e* and 772*e* and the wall surfaces of the through holes 33 (wall surface members 34*b* and 35*b*) is short, the amount of the solder 70 flowing in the through holes 33 by gravity and/or the capillary phenomenon from the positions on the surface members 34*a* and 35*a* of the lands 34 and 35 upon reflowing can be smaller in comparison with the structure where the ends of the insertion mounting members 771*e* and 772*e* are projected to the rear surface side of the housing mounting surface. Accordingly, the solder 70 on the surface members 34*a* and 35*a* is ensured, and excellent fillets can be formed in the surface mounting members 771*d* and 772*d* of the terminal 51. Further, the probability of occurrence of void in the through holes 33 can be reduced. Thus the connection reliability can be improved while upsizing of the lands 34 and 35 (the surface members 34*a* and 35*a*) on the surface of the printed circuit board 31 is suppressed. Further, upon reflowing of the rear surface of the housing mounting surface of the printed circuit board 31, as the insertion mounting members 771*e* and 772*e* do not block the heat, the connection reliability with the other electronic components 32 and the like can be improved. Note that even in the structure where the ends of the insertion mounting members 771*e* and 772*e* are provided in the same positions as the rear surface of the housing mounting surface of the printed circuit board 31, similar advantages to those described above can be expected.

As shown in FIGS. 51 to 53, the connector 50 including the above terminals 51 has a terminal block 57 as a first terminal block including only plural signal terminals 773 to 776 and a terminal block 58 as a second terminal block including plural signal terminals 773 to 776 and plural power terminals 771 and 772, in the lengthwise direction of the housing 52, as terminal blocks for connection with external connectors. In the present embodiment, the connector 50 has, as terminal blocks for connection with three external connectors electrically connected with respective engine-related systems, one terminal block 57 and two terminal blocks 58. As shown in FIG. 53, on the side of connection with the external connectors, the respective terminal blocks 57 and 58 are separated with the housing 52. Accordingly, warp of the housing 52 in its lengthwise direction can be reduced.

Note that numeral 59 in FIGS. 51 and 52 denotes a reinforcing pin as a reinforcing terminal to improve the connection reliability of the connector 50 with respect to the printed circuit board 31. In the present embodiment, the reinforcing pin 59 is provided in plural positions (four positions) away from each other in the lengthwise direction of the housing 52, thereby the effect of reinforcing can be increased. However, in the present embodiment, as the terminal 51 has the surface mounting members 771*d* and 772*d* and the insertion mounting members 771*e* and 772*e* as the mounting members for the corresponding lands 34 and 35, even in a structure without the reinforcing pin 59, the connection reliability can be ensured.

The electronic control device 1 structured as above has mainly the following advantages. First, in the present embodiment, as the first lands 34 and the second lands 35 are provided in a zigzag array, in comparison with a lattice type arrangement, the reflowing heat from a position above the housing mounting surface of the printed circuit board 31 can be excellently applied to the terminals 771, 773 and 775 connected with the first lands 34 (especially, the mounting members).

Further, in the terminal 51 (772, 774 and 776) connected with the second land 35, the first parallel member 772*a*, then the first connection member 772*b* and the second parallel member 772*c* are connected in this order. As shown in FIG. 58A, the second parallel member 772*c*, out of the first parallel member 772*a* and the second parallel 772*c* approximately parallel to the housing mounting surface of the printed circuit board 31, is positioned closer to the housing mounting surface of the printed circuit board 31 than the first parallel member 772*a*. On the other hand, in a conventional electronic control device, as shown in e.g. FIG. 58B, the first parallel member 772*a* and the second parallel member 772*c* are connected as one parallel member, the first connection member 772*b* is connected with the end of the second connection member 772*c* other than the end connected with the first parallel member 772*a*, and the mounting member is provided at the lower end of the first connection member 772*b*. Accordingly, as shown in ranges indicated with an alternate long and short dash line FIGS. 58A and 58B, in the structure shown in the present embodiment (the structure shown in FIG. 58A), the range of the reflowing heat supplied from the position above the housing mounting surface of the printed circuit board 31, without being blocked with the second parallel member 772*c*, to the mounting member (the surface mounting member 771*d*) of the terminal 51 (771) connected with the first land 34 (the surface member 34*a*), can be wider. Note that in FIG. 58B, constituent elements identical to those in the present embodiment have the same reference numerals for the sake of convenience.

In this manner, according to the electronic control device 1 according to the present embodiment, with the advantage obtained with the above-described zigzag arrangement and the advantage obtained with the second parallel member 772*c*, the reflowing heat can be efficiently applied to the mounting members 771*d* and 771*e* (junctions with the corresponding land 34) of the terminal 51 (771, 773 and 775) connected with the first land 34 close to the housing 52. Accordingly, the occurrence of connection failure due to shortage of heat can be suppressed, and the connection reliability can be improved.

Further, in the terminal 51, the reflowing heat from the position above the housing mounting surface of the printed circuit board 31 is more easily applied to the parallel portion approximately parallel to the housing mounting surface of the printed circuit board 31 in comparison with the vertical portion. Accordingly, in the conventional electronic control device in which the parallel portion extended from the housing 52 is long, there is a probability of adverse effect by the heat applied to the parallel portion and transmitted to the housing 52 (for example, the resin housing 52 is melted). On the other hand, in the present embodiment, as shown in FIG.

57, the entire length of the first parallel member 772a is within the housing 52, or the length of the portion extended from the housing 52 is shorter than the second parallel member 772c, and the second parallel member 772c and the first parallel member 772a are connected via the first connection member 772b. Accordingly, even when the reflowing heat is applied to the first parallel member 772a, the amount of heat is small, and the heat applied to the second parallel member 772c is transmitted through the long transmission route. Accordingly, the adverse effect on the housing 52 by the reflowing heat can be suppressed.

Note that in the present embodiment, as shown in FIG. 57, the first parallel member 772a is positioned farther away from the housing mounting surface of the printed circuit board 31 than the third parallel 771a, thereby the transmission route from the second parallel member 772c to the first parallel member 772a is long. Accordingly, the adverse effect on the housing 52 by the reflowing heat can be effectively suppressed.

Further, in the present embodiment, as shown in FIG. 57, the third parallel member 771a of the terminal 51 (771, 773 and 775) connected with the first land 34 is positioned farther away from the housing mounting surface of the printed circuit board 31 than the second parallel member 772c on the same side with respect to the housing mounting surface of the printed circuit board 31. In other words, in comparison with the structure where the third parallel member 771a is positioned closer to the housing mounting surface of the printed circuit board 31 than the second parallel member 772c, the reflowing heat is excellently applied to the second connection member 771b of the terminal 51 (771, 773 and 775) connected with the first land 34. Accordingly, the connection reliability can be further improved.

Figure 59A:
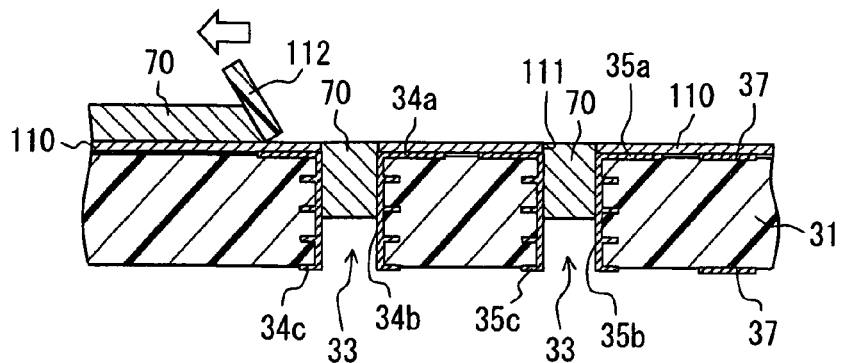
FIGS. 59A to 59C are explanatory views of a coating process as a feature of manufacture of the electronic control device, showing a first process of the coating process, a second process of the coating process, and a status after the completion of the coating process.
Figure 59B:
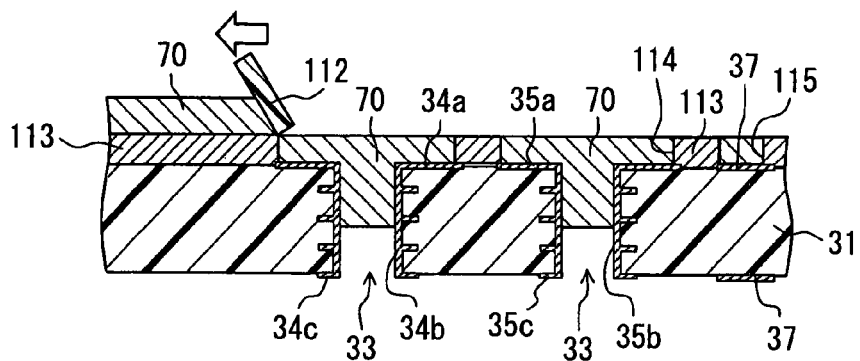
Figure 59C:
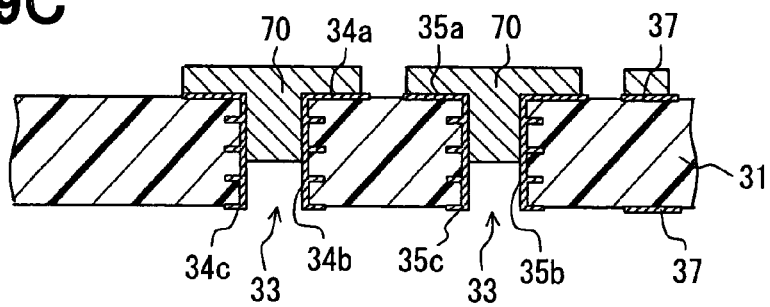
Figure 60:
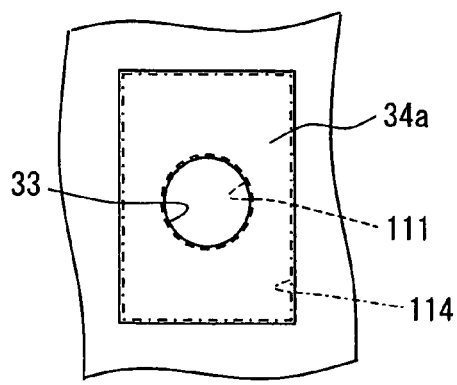
FIG. 60 is a plan view showing positional relation between a land connected with a terminal and an opening of a screen used in the coating process, corresponding to the land.

Note that the electronic control device 1 structured as above is formed by e.g. the following manufacturing method. FIGS. 59A to 59C are explanatory views of a coating process as a feature of the manufacture of the electronic control device. FIG. 59A shows a first process of the coating process; FIG. 59B, a second process of the coating process; and FIG. 59C, a status after the completion of the coating process. FIG. 60 is a plan view showing positional relation between a land connected with a terminal and an opening of a screen used in the coating process, corresponding to the land. The following method is an example of those methods.

In manufacture of the electronic control device 1, first, the printed circuit board 31 having the above-described structure and the connector 50 having the above-described structure are prepared using publicly-known manufacturing methods. For example, the through holes 33 can be formed by machine work using a drill or the like or laser machining, in positions in the printed circuit board 31 corresponding to the insertion mounting members 771e and 772e of the terminals 51, in correspondence with the thickness of the printed circuit board 31 and the diameters of the through holes 33. Further, the respective lands 34 and 35 can be formed by publicly-known techniques such as plating, metal foil etching or the like. Note that in the present embodiment, upon formation of the terminals 51 by stamping a metal plate, the length of the insertion mounting members 771e and 772e is set such that the ends of the insertion mounting members 771e and 772e are not projected to the rear surface side of the housing mounting surface of the printed circuit board 31 while the connector 50 is mounted on the printed circuit board 31. Further, the surface mounting members 771d and 772d and the insertion mounting members 771e and 772e corresponding to the same one terminal 51 are integrally formed.

Next, mounting on the housing mounting surface side is performed with respect to the prepared printed circuit board 31. First, as shown in FIGS. 59A to 59C, by using screen printing, solder paste 70 with controlled predetermined viscosity is applied on the lands 34 and 35 (on the surface members 34a and 35a and on the wall surface members 34b and 35b inside the through holes 33). In the coating process, the solder paste 70 can be applied on the surface members 34a and 35a and on the wall surface members 34b and 35b inside the through holes 33 at once. However, in the present embodiment, the coating is performed in first process and second process using screens with different mask shapes.

In the first process, as shown in FIGS. 59A and 60, a first screen 110 having openings 111 approximately corresponding to the through holes 33 (in size and shape) in positions corresponding to the through holes 33 is used. The solder paste 70 is supplied on the first screen 110, and a squeegee 112 is moved, thus screen printing is performed. The solder paste 70 is transferred through the openings 111 to the printed circuit board 31 side, and the solder paste 70 is filled in the through holes 33 from the housing mounting surface side. At this time, as air inside the through holes 33 escapes from the openings on the rear surface side of the printed circuit board 31 to the outside, the solder paste 70 can be efficiently filled in the through holes 33. Note that it is preferable that the first screen 110 has a thickness (mask thickness) as thin as possible for filling the solder paste 70 in the through holes 33.

After the completion of the first process, the second process is performed. In the second process, as shown in FIGS. 59B and 60, a second screen 113 having openings 114 approximately corresponding to the outer shape of the surface members 34a and 35a (in size and shape) in positions corresponding to the surface members 34a and 35a and the through holes 33, and openings 115 approximately corresponding to the lands 37 (in size and shape) in positions corresponding to the lands 37 is used. The solder paste 70 is supplied on the second screen 113, and the squeegee 112 is moved, thus screen printing is performed. The solder paste 70 is transferred through the openings 114 and 115 to the printed circuit board 31 side, and the solder paste 70 is provided from the housing mounting surface side on the surface members 34a and 35a and on the lands 37, and on the solder 70 provided in the first process. Note that it is preferable that the second screen 113 has a thickness (mask thickness) as thick as possible for providing the solder paste 70 on the surface members 34a and 35a. In the present embodiment, as the thickness of the first screen 110 is thinner than that of the second screen 113, the solder paste 70 can be efficiently filled in the through holes 33 and the thickness of the solder on the surface members 34a and 35a can be ensured.

In this manner, as the coating process includes plural screen printing processes, more solder paste 70 can be supplied in the through holes 33 without partial mask thickness control and print pressure control as in the case of a screen printing process which is performed once, and by extension, the thickness of the solder paste 70 on the surface members 34a and 35a can be increased. Accordingly, the contact area between the surface mounting members 771d and 772d and the insertion mounting members 771e and 772e and the solder 70, and between the respective lands 34 and 35 and the solder 70 can be increased. Further, although the screen printing is performed plural times, contamination of the rear surface of the screen (transfer from the printed circuit board side) can be prevented. Further, as the through holes 33 are previously filled with the solder 70, in the reflow process to be described later, the solder 70 which flows in the through holes 33 from the surface members 34*a* and 35*a* can be reduced or prevented.

Note that when the screen printing is performed plural times, there is a probability of inconvenience such as contamination when the solder 70 transferred to the printed circuit board 31 in the previous screen printing (the first process) is attached to the rear surface of the screen in the subsequent screen printing (the second process). In the present embodiment, as shown in FIG. 60, the openings 114 of the second screen 113 used in the second process are larger than the openings 111 of the first screen 110 used in the first process such that the openings 111 are included in the openings 114. Accordingly, the above problem of contamination can be prevented. Further, as described above, as the surface members 34*a* and 35*a* are integrated with the wall surface members 34*b* and 35*b*, the number of openings is small in comparison with a structure where the both members are separated, thereby the occurrence of contamination can also be suppressed. Further, in the second process, as the solder paste 70 is applied on the lands 37 corresponding to the other electronic components 32 than the connector 50, the number of printing steps is reduced, thereby the occurrence of contamination can also be suppressed. Further, the thickness of the solder on the lands 37 is ensured.

When the first process and the second process (the coating process) have been completed, as shown in FIG. 59C, the printed circuit board 31, in which the solder 70 is provided on the surface members 34*a* and 35*a*, on the wall surface members 34*b* and 35*b* in the through holes 33, and on the lands 37, is prepared. Then, positioning of the electronic components 32 including the connector 50 is performed on the housing mounting surface of the printed circuit board 31. Then the respective insertion mounting members 771*e* and 772*e* of the terminals 51 are inserted through the solder 70 in the through holes 33. Further, the respective surface mounting members 771*d* and 772*d* of the terminals 51 are brought into contact with the solder 70 provided on the opposed surface members 34*a* and 35*a* on the corresponding lands 34 and 35. In this manner, in the present embodiment, as the insertion mounting members 771*e* and 772*e* are inserted in the through holes 33, the positioning of the connector 50 with respect to the printed circuit board 31 is facilitated. Further, as the insertion mounting members 771*e* and 772*e* function as anchors, positional shift between the terminals 51 and the corresponding lands 34 and 35 in the vertical direction to the thickness direction of the printed circuit board 31 can be suppressed.

Then, in a status where the electronic components 32 including the connector 50 are mounted on the printed circuit board 31, the reflow process is performed. The molten solder 70 is spread, and preferably, forms a fillet with respect to the surface mounting members 771*d* and 772*d*, and cooled and solidified in that state.

In the present embodiment, the ends of the insertion mounting members 771*e* and 772*e* are positioned between the housing mounting surface of the printed circuit board 31 and its rear surface in a status where the ends of the insertion mounting members 771*e* and 772*e* are inserted in the through holes 33. Further, in the coating process, the solder 70 is filled part of the through holes 33. Further, the surface members 34*a* and 35*a*, the wall surface members 34*b* and 35*b* and the rear surface members 34*c* and 35*c* forming the respective lands 34 and 35 are respectively integrated. Accordingly, when the surface mounting members 771*d* and 772*d* are in contact with the solder 70 on the surface members 34*a* and 35*a*, then upon reflowing, a part of the solder 70 on the surface members 34*a* and 35*a* flows into gaps formed with the opposed wall surface members 34*b* and 35*b* and the insertion mounting members 771*e* and 772*e* (hereinbelow, gaps between the through holes 33 and the insertion mounting members 771*e* and 772*e*) by the capillary phenomenon and/or gravity. FIG. 57 shows a structure where the solder 70 in this state is cooled and solidified. Further, when the contact between the surface mounting members 771*d* and 772*d* and the solder 70 on the surface members 34*a* and 35*a* is not sufficient before the reflowing due to variation of the height of the terminals 51 to the housing mounting surface, the surface mounting members 771*d* and 772*d* become wet with the molten solder 70 by the capillary phenomenon via the gaps between the through holes 33 and the insertion mounting members 771*e* and 772*e*, thereby a desired contact area between the terminals 51 and the solder 70 to ensure the connection reliability can be ensured. That is, in any case, the terminals 51 can be electrically and mechanically connected (bonded) with the respective lands 34 and 35 via the solder 70. Especially, in the present embodiment, as the solder 70 is efficiently filled in the through holes 33 and the thickness of the solder 70 on the surface members 34*a* and 35*a* can be ensured in the coating process, the connection reliability can be further improved. Further, as the solder 70 is previously filled in the through holes 33, the amount of solder 70 flowing from the surface members 34*a* and 35*a* in the through holes 33 in the reflow process can be reduced in comparison with a case where the solder 70 is not previously filled in the through holes 33. Accordingly, this also ensures the thickness of the solder 70 on the surface members 34*a* and 35*a*, and further improves the connection reliability. Further, as a sufficient amount of solder 70 is provided in the through holes 33, the occurrence of void can be suppressed.

Note that upon reflowing, there is a probability of occurrence of deformation such as warp in at least one of the printed circuit board 31 and the housing 52 before cooling and solidification of the solder 70 (molten state) due to the difference between liner expansion coefficients of the printed circuit board 31 and the housing 52 of the connector 50. Especially, as in the case of the connector 50 shown in the present embodiment, in a structure having a shape long in the vertical direction to the thickness direction of the printed circuit board 31 and plural terminals 51 are arrayed in the lengthwise direction, the amount of above deformation is increased on the end side in the lengthwise direction. That is, in connection between the terminals 51 and the corresponding lands 34 and 35, the connection reliability is easily lowered on the end side. However, in the present embodiment, as described above, as the insertion mounting members 771*e* and 772*e* inserted in the through holes 33 function as anchors, the positional shift between the terminals 51 and the corresponding lands 34 and 35 before cooling and solidification of the solder 70 (molten state) can be prevented.

After the completion of reflowing on the housing mounting surface side of the printed circuit board 31, reflow mounting of the electronic components 32 is similarly performed on the rear surface of the printed circuit board 31. Thus the electronic control device 1 as shown in FIG. 50 can be formed.

As described above, in the present embodiment, the terminal 51 is a branch terminal having the surface mounting members 771*d* and 772*d* and the insertion mounting members 771*e* and 772*e*. The reflowing is performed while the insertion mounting members 771*e* and 772*e* are inserted in the through holes 33. Accordingly, the connection reliability can be improved.

Further, in the structure where the insertion mounting members 771*e* and 772*e* are inserted in the through holes 33, as flow soldering is unnecessary, the mounting disabled area for the electronic components 32 can be reduced on the rear surface of the housing mounting surface of the printed circuit board 31. That is, the packaging density can be improved.

Note that in the present embodiment, the coating process includes the first process and the second process using the screens 110 and 113 having different musk shapes. However, the number of the screen printing is not limited to two. The screen printing may be performed thrice or more. Further, it may be arranged such that the solder 70 is applied on the wall surface members 34b and 35b of the lands 34 and 35, on the surface members 34a and 35a and on the lands 37 in one screen printing. For example, the thickness of the screen (mask thickness) may be partially changed. Further, the connection reliability can be improved by controlling the running speed of the squeegee 112 (to a lower speed on the lands 34 and 35 than that on the surface lands 37) or controlling the print pressure (to higher pressure on the lands 34 and 35 than that on the surface lands 37).

Further, in the present embodiment, the openings 114 of the second screen 113 are approximately the same as the surface members 34a and 35a of the lands 34 and 35. However, it is conceivable that in comparison with a structure having only the surface members 34b and 35b as the lands 34 and 35, in the structure shown in the present embodiment having the wall surface members 34b and 35b of the through holes 33, the amount of solder on the surface members 34a and 35a becomes short. Accordingly, the openings 114 may include the surface members 34a and 35a and may be larger than the surface members 34a and 35a within a range where short circuit does not occur between adjacent lands 34 and 35. In this structure, the thickness of the solder 70 on the surface members 34a and 35a can be ensured without changing the thickness of the holder 70.

Figure 61:
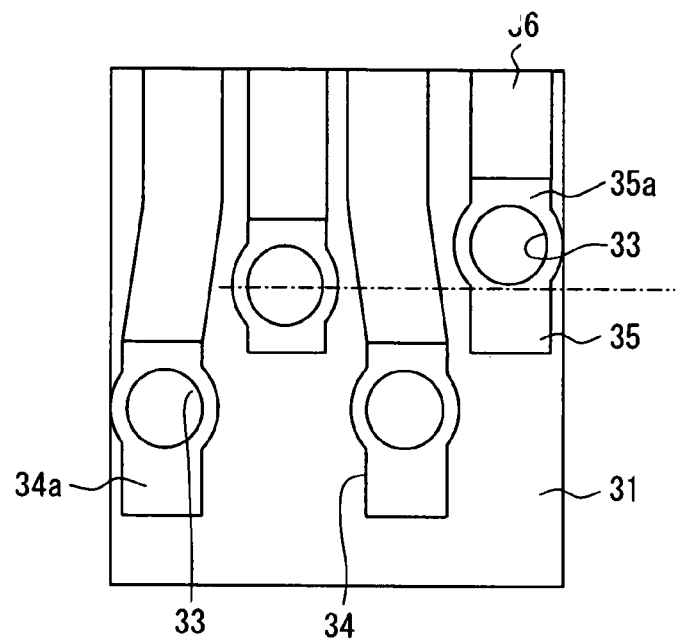
FIG. 61 is a plan view of the printed circuit board showing a modification.

Further, in the present embodiment, as shown in e.g. FIG. 55, the external shape of the surface members 34a and 35a of the lands 34 and 35 is rectangle in the direction vertical to the thickness direction of the printed circuit board 31. However, as shown in FIG. 61, it may be arranged such that, in the surface members 34a and 35a of the lands 34 and 35, only the peripheral portion of the through hole 33 is larger than the other portions in the array direction of the terminals 51, in accordance with the diameter of the terminals 51 (the diameter of the through holes 33). In this case where only the peripheral portion of the through hole 33 is thick in the surface members 34a and 35a, the amount of solder on the surface members 34a and 35a can be optimum so as to form appropriate side fillets in the surface mounting members 771d and 772d, and the amount of solder in the through hole 33 and the insertion mounting members 771e and 772e can be increased. More particularly, it is preferable that the width of the surface members 34a and 35a (the width of a portion except the peripheral portion of the through hole 33 in the array direction of the terminals 51) is about the hole diameter of the through hole 33. Note that as shown in FIG. 61, in a structure where the second land 35 (the through hole 33 and the surface member 35a) far from the housing 52 is shifted in the direction away from the housing 52, the printed circuit board 31 in the lengthwise direction of the housing, and by extension, the electronic control device 1 can be downsized. However, as the lengths of the terminals 51 extended from the housing 52 are different, the number of types of terminals is increased. FIG. 61 is a plan view of the printed circuit board 31 showing the modification. Note that in FIG. 61, the solder and solder resist are omitted for the sake of convenience.

Further, in the present embodiment, after the completion of the reflowing on the housing mounting surface side in the printed circuit board 31, the reflowing is performed on the rear surface side. However, the reflow mounting may be performed on the side of the housing mounting surface after the completion of the reflowing on the rear surface side of the housing mounting surface of the printed circuit board 31. In this case, even when the insertion mounting members 771e and 772e are projected to the rear surface side of the housing mounting surface of the printed circuit board 31, the insertion mounting members 771e and 772e do not prevent the reflowing heat to the electronic components 32 on the rear surface side of the housing mounting surface of the printed circuit board 31.

Figure 62:
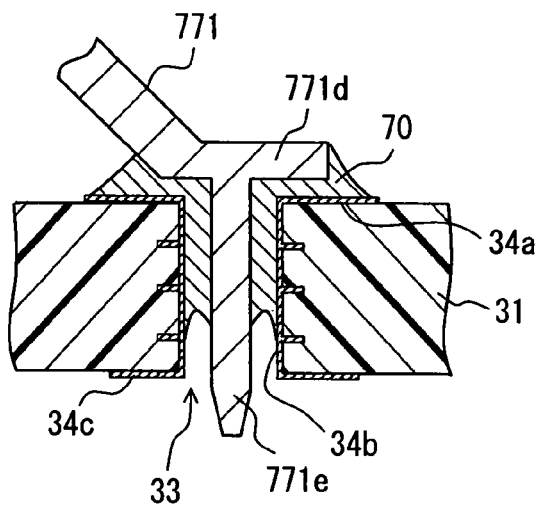
FIG. 62 is a cross-sectional view showing another modification.

Further, in the present embodiment, the solder 70 is provided on the surface members 34a and 35a of the lands 34 and 35 provided on the housing mounting surface side of the printed circuit board 31, and the connector 50 is mounted on the printed circuit board 31 by reflowing on the housing mounting surface side. However, in the structure where the terminal 51 has the insertion mounting members 771e and 772e as the mounting members (the structure where the printed circuit board 31 has through holes 33), the reflowing heat on the rear surface side of the housing mounting surface may be utilized for mounting. That is, the connector 50 may be mounted on the printed circuit board 31 by the reflowing from the both surface sides. In this case, sufficient heat is supplied especially to the junctions of the terminal 51 (771, 773 and 775) corresponding to the first land 34, the solder 70 is melted, and the connection reliability between the land 34 and the terminal 51 can be improved. As shown in FIG. 62, in a structure where at least the insertion mounting member 771e, out of the insertion mounting members 771e and 772e, is projected to the rear surface side of the housing mounting surface of the printed circuit board 31, the projected portion of the insertion mounting member 771e receives the reflowing heat on the rear surface side of the housing mounting surface. Accordingly, even when sufficient heat is not supplied to the mounting members of the terminal 51 (especially the insertion mounting member 771e) by reflowing on the housing mounting surface side, the connection reliability can be ensured. Further, in a structure where the insertion mounting members 771e and 772e are projected to the rear surface side of the housing mounting surface of the printed circuit board 31, even when deformation such as warp occurs in at least one of the printed circuit board 31 and the housing 52 upon e.g. reflowing, connection between the terminal 51 and the corresponding lands 34 and 35 can be more reliably ensured. FIG. 62 is a cross-sectional view showing the modification.

Further, when the connector 50 is mounted on the printed circuit board 31 by utilizing reflowing on the rear surface side of the housing mounting surface, it is preferable that in the lands 34 and 35, the size of the rear surface members 34c and 35c is larger than the maximum tolerance of the hole diameter of the through hole 33 within a range satisfying the relation that the size is smaller than that of the surface members 34a and 35a. For example, in FIG. 62, the size of the rear surface member 34c is slightly larger than that of the surface member 34a. In this structure, as the amount of heat received by the rear surface members 34c and 35, and by extension, by the lands 34 and 35 is increased, the connection reliability can be improved.

Figure 63:
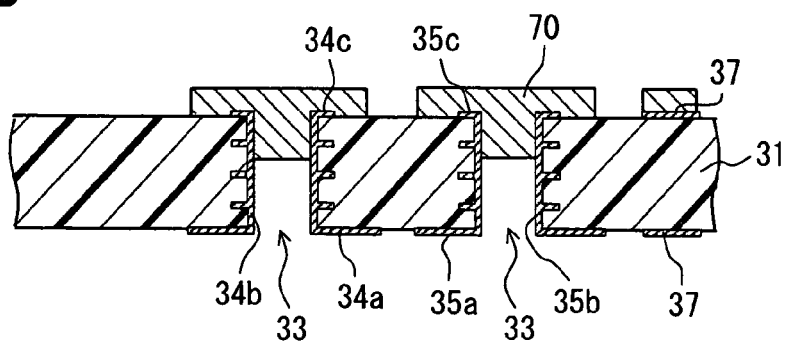
FIG. 63 is a cross-sectional view showing another modification.

Further, when the connector 50 is mounted on the printed circuit board 31 by utilizing reflowing on the rear surface side of the housing mounting surface, the members to which the solder 70 is applied are not limited to the surface members 34a and 35a of the lands 34 and 35. For example, as shown in FIG. 63, on the rear surface side of the housing mounting surface of the printed circuit board 31, the solder 70 is applied on the rear surface members 34c and 35c provided around the openings of the through holes 33. Then, while the housing 52 including the terminals 51 is fixed (for example, bonded, engaged, or clipped) on the housing mounting surface of the printed circuit board 31 such that the insertion mounting members 771e and 772e are inserted in the through holes 33 and the surface mounting members 771d and 772d are provided opposite to each other on the surface members 34a and 35a, reflowing is performed from the rear surface side of the housing mounting surface faced downward. In this case, the solder 70 flows in the through holes 33 by its dead weight, and thereby connects the wall surface members 34b and 35b with the insertion mounting members 771e and 772e. Further, when the surface mounting members 771d and 772d are provided, as the surface mounting members 771d and 772d receive the solder 70, the surface members 34a and 35a are connected with the surface mounting members 771d and 772d. Note that in the above structure, when the ends of the insertion mounting members 771e and 772e are projected to the rear surface side of the housing mounting surface while the housing 52 is fixed to the printed circuit board 31 (see FIG. 62), the advantage obtained by the capillary phenomenon is added to the advantage obtained by dead weight, and the solder 70 can be easily flow in the through holes 33. FIG. 63 is a cross-sectional view showing the modification.

Further, in the present embodiment, as the terminal 51 (771, 773 and 775) connected with the first land 34, the second connection member 771b is connected with the mounting member for the first land 34 (the surface mounting member 771d). However, it may be arranged such that a parallel member, approximately parallel to the housing mounting surface of the printed circuit board 31, exposed from the housing 52 and in a position closer to the housing mounting surface of the printed circuit board 31 than the third parallel member 771a, is connected with the lower end of the second connection member 771b, and the mounting member for the first land 34 is connected with the end of the parallel member on the side far from the housing 52. That is, the second connection member 771b may be connected with the mounting member via the parallel member.

Eighth Embodiment

Figure 64:
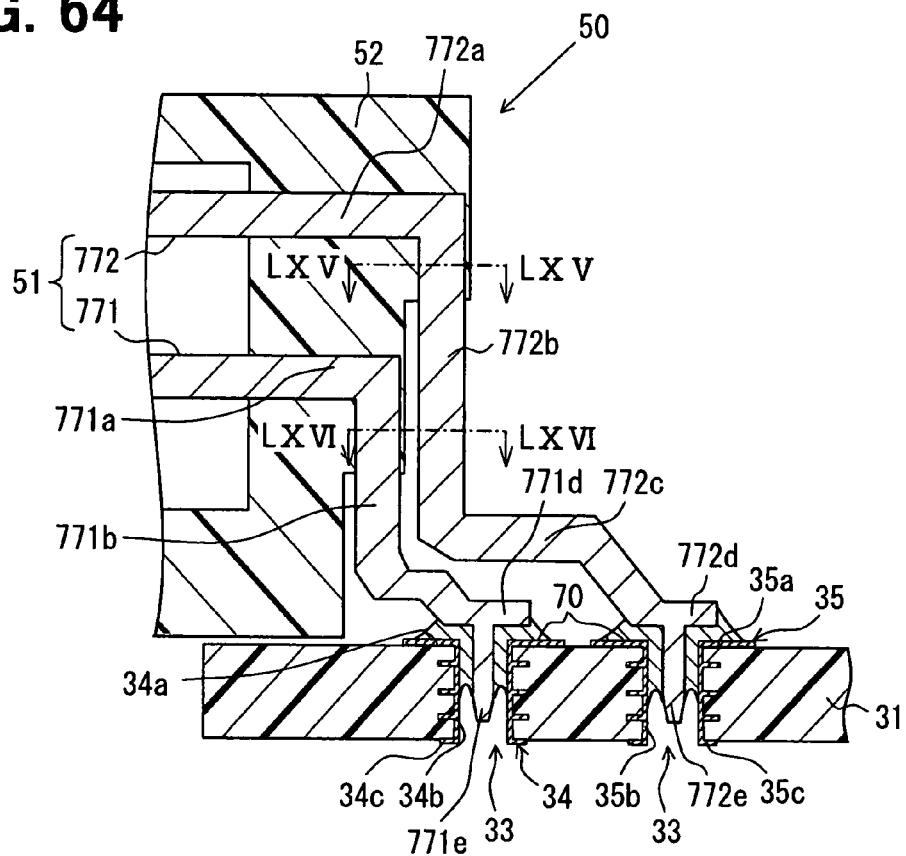
FIG. 64 is an expanded cross-sectional view of the peripheral portion of the connector mounted on the printed circuit board in the electronic control device according to a second embodiment.
Figure 65:
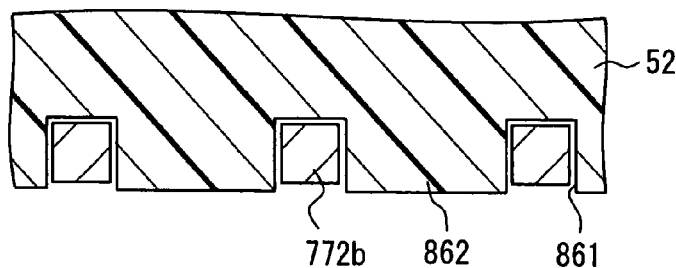
FIG. 65 is a cross-sectional view along a line LXV-LXV in FIG. 64.
Figure 66:
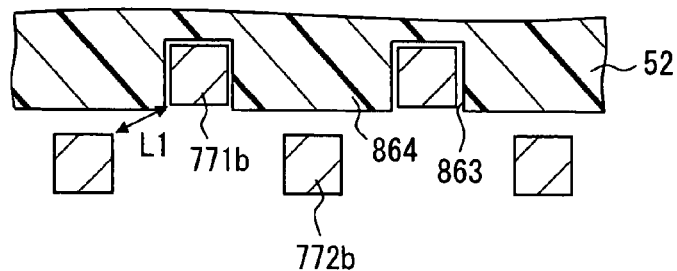
FIG. 66 is a cross-sectional view along a line LXVI-LXVI in FIG. 64.
Figure 67:
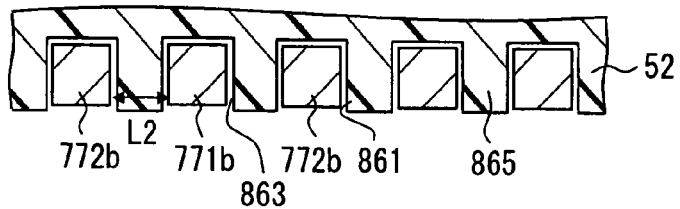
FIG. 67 is a cross-sectional view as a comparative example.
Figure 68:
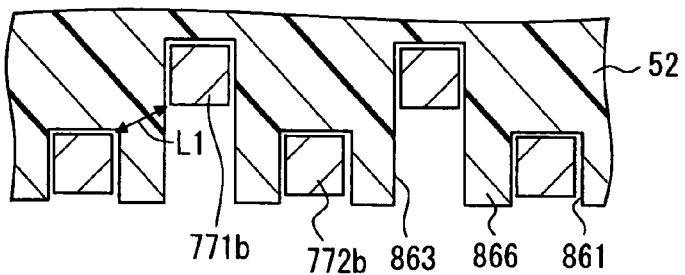
FIG. 68 is a cross-sectional view as a comparative example.

Next, an eighth embodiment of the present invention will be described based on FIGS. 64 to 68. FIG. 64 is an expanded cross-sectional view of the peripheral portion of the connector mounted on the printed circuit board in the electronic control device according to the eighth embodiment. FIG. 65 is a cross-sectional view along a line LXV-LXV in FIG. 64. FIG. 66 is a cross-sectional view along a line LXVI-LXVI in FIG. 64. FIGS. 67 and 68 are cross-sectional views as comparative examples. Note that FIG. 64 corresponds to FIG. 57 shown in the seventh embodiment.

The electronic control device according to the eighth embodiment has many commonalities with those in the seventh embodiment, accordingly, the detailed explanations of such commonalities will be omitted, and the difference will be mainly described. Further, in the present embodiment, constituent elements identical to those in the seventh embodiment have the same reference numerals.

In the seventh embodiment, in the terminal 51 (771, 773 and 775) connected with the first land 34 and the terminal 51 (772, 774 and 776) connected with the second land 35, the first connection members 772b and the second connection members 771b are alternately provided in line along the array direction of the terminals 51. On the other hand, in the present embodiment, as shown in e.g. FIG. 66, the first connection members 772b and the second connection members 771b are provided respectively in one line along the array direction of the terminals 51, and the first connection members 772b and the second connection members 771b are provided in a zigzag array. Further, the first parallel members 772a are positioned farther away from the housing mounting surface of the printed circuit board 31 than the third parallel members 771a.

Note that numeral 861 in FIG. 65 denotes a groove to hold the first connection member 772b provided in the housing 52, and numeral 862, a wall member between the grooves 861 (between the first connection members 772b). Numeral 863 in FIG. 66 denotes a groove to hold the second connection member 771b provided in the housing 52, and numeral 864, a wall member between the grooves 863 (between the second connection members 771b). In the present embodiment, the respective terminals 51 are inserted and fixed in concave members provided in the housing 52 (including the above-described grooves 861 and 862). More particularly, the housing 52 has the grooves 861 and 862 provided in one surface on the side of lands 34 and 35, and through holes connected with the grooves and communicate with the rear surface of the groove formation surface. The respective terminals 51 are inserted from the groove formation surface side with connection ends for external connectors as the forefront, in the through holes. The entire first parallel members 772a and the third parallel member 771a are inserted and fixed in the through holes of the housing 52. Further, in this fixed status, the first connection member 772b and the second connection member 771b are accommodated in the corresponding grooves 861 and 862, and held (not fixed) with the housing 52.

As shown in the present embodiment, when the first connection members 772b and the second connection members 771b are provided in a zigzag array, the distance between the first connection member 772b and the second connection member 771b of the adjacent terminals 51 is L1 as shown in FIG. 66. On the other hand, when the first connection members 772b and the second connection members 771b are alternately provided in one line along the array direction of the terminals 51, the distance between the first connection member 772b and the second connection member 771b of adjacent terminals 51 is L2 shorter than L1, as shown in FIG. 67. In this manner, in the electronic control device 1 according to the present embodiment, as the distance between adjacent terminals 51 can be increased, crosstalk can be suppressed. Accordingly, the size in the array direction of the terminals 51 can be reduced while the quality is ensured (crosstalk is suppressed). Note that numeral 865 shown in FIG. 67 denotes a wall member between the grooves 861 and 863 (between the connection members 771b and 772b). In FIG. 67, constituent elements identical to those in the present embodiment have the same reference numerals.

Further, as in the case of the seventh embodiment, in the present embodiment, as shown in FIG. 64, the first parallel member 772a is positioned farther away from the housing mounting surface of the printed circuit board 31 than the third parallel member 771a. Further, in the direction vertical to the array direction of the terminals 51 and along the housing mounting surface of the printed circuit board 31, the first connection member 772b is closer to the second land 35 than the second connection member 771b. That is, in addition to the array direction of the terminals 51, in the direction vertical to the housing mounting surface of the printed circuit board 31 and the direction vertical to the array direction of the terminals 51 and along the housing mounting surface of the printed circuit board 31, the terminals 771 and the terminals 772 are not overlapped with each other (not crossed). Accordingly, crosstalk caused between the terminal 51 (771, 773 and 775) connected with the first land 34 and the adjacent terminal 51 (772, 774 and 776) connected with the second land 35 can be more effectively suppressed.

Further, in the present embodiment, as shown in FIGS. 64 to 66, in the first connection member 772b, out of the second connection member 771b and the first connection member 772b, positioned closer to the second land 35, a predetermined range from the junction with the first parallel member 772a (more particularly, a range higher than the third parallel member 771a with respect to the housing mounting surface of the printed circuit board 31) is held in the housing 52 with the groove 861, as described above. In this structure, in comparison with a structure as shown in the seventh embodiment where the entire first connection member 772b is exposed from the housing 52 (a part of the first parallel member 772a is also exposed from the housing 52), the length of exposed part of the terminal 772 from the housing 52 is shorter. Accordingly, in comparison with the structure where the first connection member 772b is not held in the housing 52, the positional precision between the surface mounting member 772d and the insertion mounting 772e and the corresponding second land 35 (the through hole 33) can be improved. Further, in the first connection member 772b, as a predetermined range from the junction with the second parallel member 772c is not held in the housing 52, in comparison with a structure where the entire first connection member 772b is held in the housing 52, stress acting on the junction between the surface mounting member 772d and the insertion mounting member 772b and the second land 35 can be effectively mitigated with the first connection member 772b. Note that in the present embodiment, as shown in FIG. 64, as a predetermined range from the junction between the second connection member 771b and the third parallel member 771a (in other words, a portion of junction between the surface mounting member 771d and the insertion mounting member 771e except a predetermined range) is also held in the housing 52, the advantage equivalent to or similar to that by the first connection member 772b can be expected. Further, in the signal terminals 773 to 776 (not shown), the terminals 773 and 775 in the lower two steps (lower half) connected with the first lands 34 have a similar structure to that of the terminal 771. The terminals 774 and 776 in the upper two steps (upper half) connected with the second lands 35 have a similar structure to that of the terminal 772.

Note that as described above, when the housing 52 has a groove (a wall member formed with the grooves) to hold a connection member, it is necessary to set the wall member to have a predetermined thickness so as to ensure strength and ensure an electric insulating property. However, when the first connection member 772b and the second connection member 771b having the same height are held in the housing 52 as shown in FIG. 67, the thickness of the wall member 865 between the grooves 861 and 863 (between the connection members 771b and 772b) is thinner than the thickness of the wall members 862 and 64 shown in FIGS. 65 and 66. Especially as shown in the present embodiment, in the arrangement in which the first connection members 772b and the second connection members 771b are provided in a zigzag array, when the first connection member 772b is held in the housing 52 at a lower position than the third parallel member 771a with respect to the housing mounting surface of the printed circuit board 31, the thickness of the wall member 866 between the grooves 861 and 863 (between the connection members 771b and 772b) is thin and the groove 863 is deep and long, as shown in FIG. 68. Accordingly, in the structures shown in FIGS. 67 and 68, the size in the array direction of the terminals 51 cannot be made without difficulty due to the wall members 865 and 866. On the other hand, in the present embodiment, in the direction vertical to the housing mounting surface of the printed circuit board 31, when the positions of the first connection member 772b and the second connection member 771b held in the housing 52 are not overlapped with each other, the size in the array direction of the terminals 51 can be further reduced than the structures shown in FIGS. 67 and 68.

Ninth Embodiment

Figure 69:
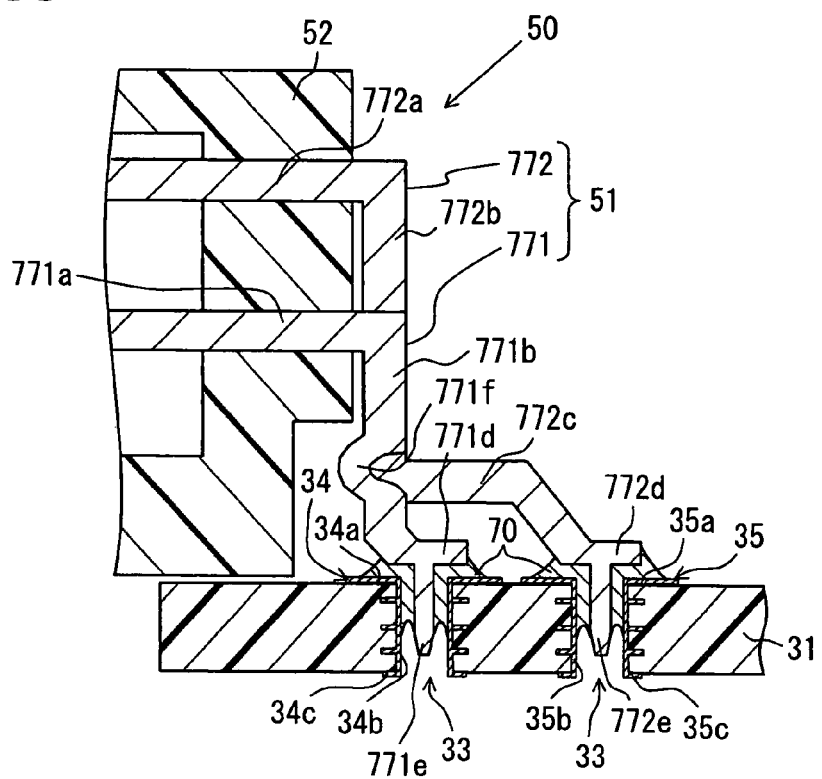
FIG. 69 is an expanded cross-sectional view of the peripheral portion of the connector mounted on the printed circuit board in the electronic control device according to a third embodiment.

Next, a ninth embodiment of the present invention will be described based on FIG. 69. FIG. 69 is an expanded cross-sectional view of the peripheral portion of the connector mounted on the printed circuit board in the electronic control device according to the ninth embodiment. Note that FIG. 69 corresponds to FIG. 57 shown in the seventh embodiment.

The electronic control device according to the ninth embodiment has many commonalities with those in the seventh and eighth embodiments, accordingly, the detailed explanations of such commonalities will be omitted, and the difference will be mainly described. Further, in the present embodiment, constituent elements identical to those in the seventh embodiment have the same reference numerals.

In the above-described respective embodiments, the first parallel member 772a of the terminal 51 (772, 774 and 776) connected with the second land 35 is positioned farther away from the housing mounting surface of the printed circuit board 31 than the third parallel member 771a of the terminal 51 (771, 773 and 775) connected with the first land 34. In this arrangement, in the terminal 51 (771, 773 and 775) connected with the first land 34, a portion exposed from the housing 52 is shorter than a portion exposed from the housing 52 in the terminal 51 (772, 774 and 776) connected with the second land 35, in the direction vertical to the housing mounting surface of the printed circuit board 31 and the direction vertical to the array direction of the terminals 51 and along the housing mounting surface. That is, the terminal 51 (771, 773 and 775) connected with the first land 34 is disadvantages in comparison with the terminal 51 (772, 774 and 776) connected with the second land 35 in the point of connection reliability.

In the present embodiment, the second connection member 771b of the terminal 51 (771, 773 and 775) connected with the first land 34 is provided with a stress mitigation member to mitigate the stress acting on the junction between the first land 34 and the surface mounting member 771d and the insertion mounting member 771e. For example, in FIG. 69, to mitigate the stress in the direction vertical to the housing mounting surface of the printed circuit board 31, a projected U-shaped bend member 771f as a stress mitigation member is provided in the middle of the second connection member 771b on the side of engagement with an external connector, such that the second connection member 771b is easily spring-deformed. In this manner, when the stress mitigation member is provided, the stress acting on the junction between the first land 34 and the surface mounting member 771e and the insertion mounting member 771e can be efficiently mitigated with the second connection member 771b, thereby the connection reliability can be improved.

Note that in the present embodiment, the stress mitigation member is provided in the second connection member 771b of the terminal 51 (771, 773 and 775) connected with the first land 34, however, the stress mitigation member may be also provided in the first connection member 772b of the terminal 51 (772, 774 and 776) connected with the second land 35.

Figure 70:
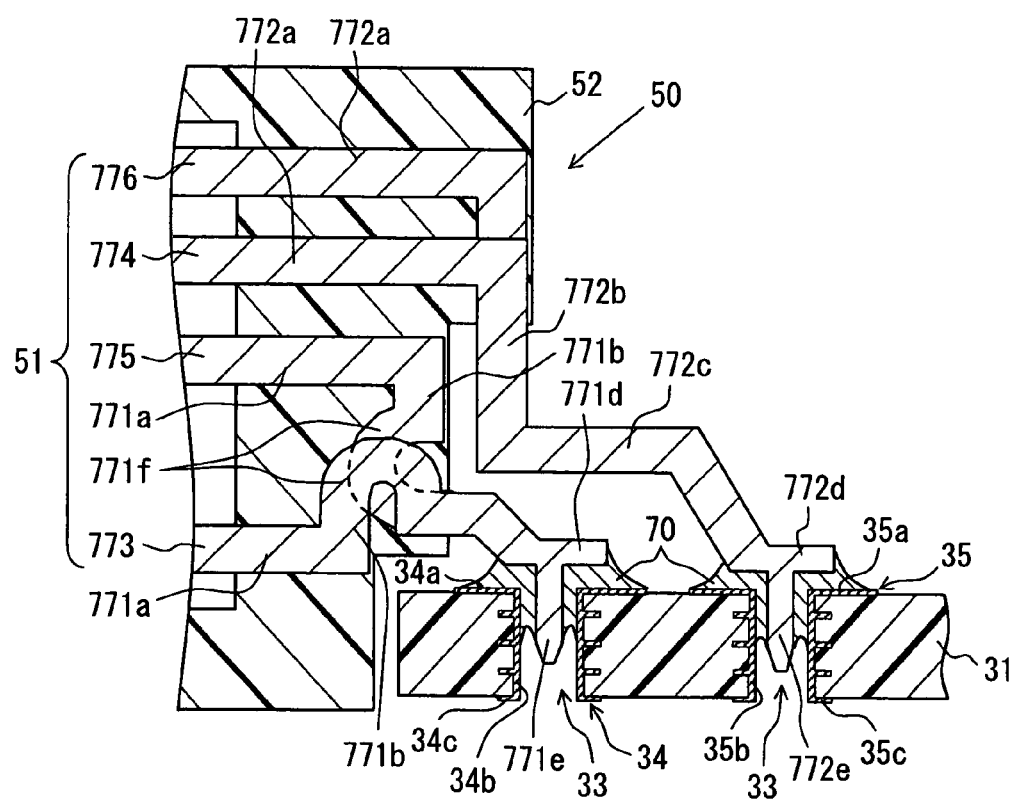
FIG. 70 is a cross-sectional view showing a modification.

Further, in an arrangement in which the terminals 51 are provided in plural steps with respect to the housing 52, when the stress mitigation member is provided in the terminal 51 in the lowest step and the second step, it is preferable that the in the terminal 51 in the lowest step and the terminal 51 in the second step, the directions of the projections of the bend members 771*f* are different. For example, in FIG. 70, in the above-described signal terminals 773 to 776, in the terminals 773 and 775 connected with the first lands 34, the bend member 771*f* in the terminal 773 in the lowest step in the position held in the housing 52 has a U-shaped projection in a direction away from the housing mounting surface of the printed circuit board 31. The bend member 771*f* of the terminal 775 in the second step in the position held in the housing 52 has a U-shaped projection toward the side of engagement with an external connector. In this structure, in the terminal 51 (773) in the lowest step with respect to the housing 52, the stress mitigation member is formed in a status where the length of the second connection member 771*b*, i.e., the length in the direction vertical to the housing mounting surface of the printed circuit board 31, is shorter than that in the arrangement in which the bend member 771*f* is projected in the direction away from the housing mounting surface. That is, in an arrangement having a large number of steps, the connection reliability can be improved by providing a stress mitigation member while the size in the connector 50 height direction is suppressed. FIG. 70 is a cross-sectional view showing the modification. In this manner, in the structure having he bend member 771*f*, it may be arranged such that as shown in the seventh embodiment, a parallel member approximately parallel to the housing mounting surface of the printed circuit board 31 is provided between the second connection member 771*b* having the bend member 771*f* and the mounting member (the surface mounting member 771*d*), and the parallel member connects the second connection member 771*b* with the mounting member.

Note that in the present embodiment, the stress mitigation member has the U-shaped bend member 771*f*, however, the shape of the bend member 771*f* is not limited to the above U-shape. Further, a notch or the like may be formed in place of the bend member so as to facilitate spring deformation of the connection member.

Tenth Embodiment

Figure 71:
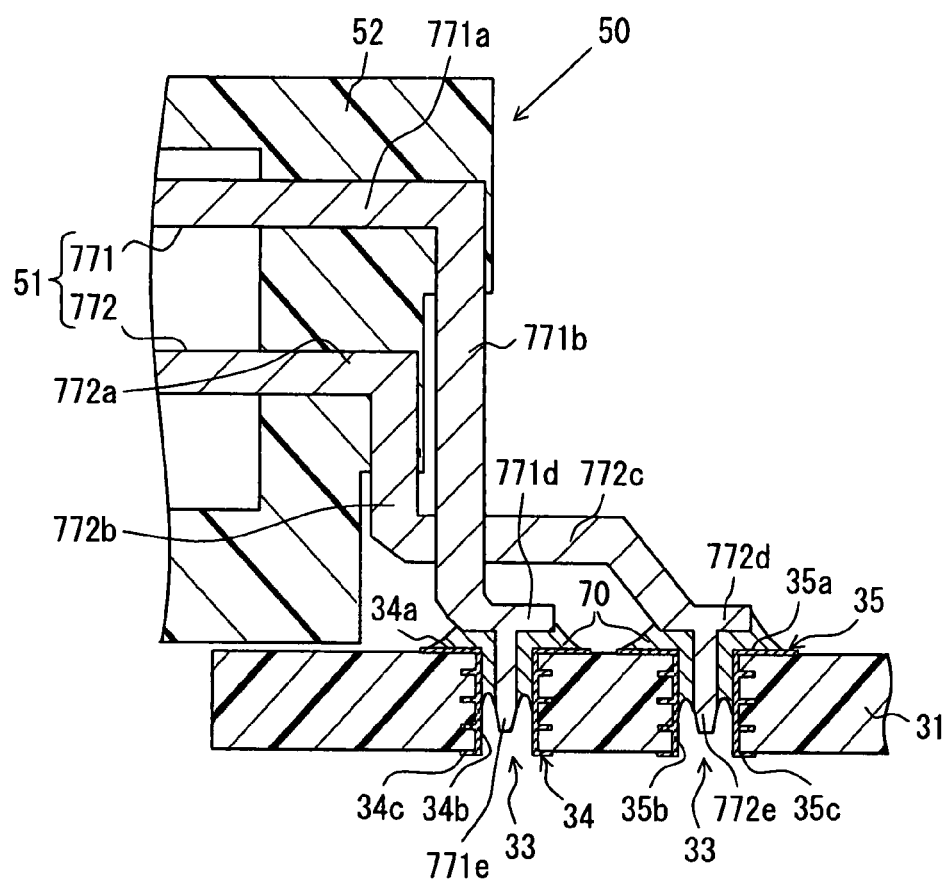
FIG. 71 is an expanded cross-sectional view of the peripheral portion of the connector mounted on the printed circuit board in the electronic control device according to a fourth embodiment.

Next, a tenth embodiment of the present invention will be described based on FIG. 71. FIG. 71 is an expanded cross-sectional view of the peripheral portion of the connector mounted on the printed circuit board in the electronic control device according to the tenth embodiment. Note that FIG. 71 corresponds to FIG. 57 shown in the seventh embodiment.

The electronic control device according to the tenth embodiment has many commonalities with those in the seventh to ninth embodiments, accordingly, the detailed explanations of such commonalities will be omitted, and the difference will be mainly described. Further, in the present embodiment, constituent elements identical to those in the seventh embodiment have the same reference numerals.

In the above-described respective embodiments, the first parallel member 772*a* is positioned farther away from the housing mounting surface of the printed circuit board 31 than the third parallel member 771*a*. On the other hand, as a feature of the present embodiment, as shown in e.g. FIG. 71, the third parallel member 771*a* is positioned farther away from the housing mounting surface of the printed circuit board 31 than the first parallel member 772*a*.

In this arrangement, in the terminal 51 (771, 773 and 775) connected with the first land 34, the length of a portion extended from the housing 52 can be longer than that in the above-described respective embodiments, and the length of the portion extended from the housing 52 in the terminal 51 (771, 773 and 775) connected with the first land 34 and that of the portion of the terminal 51 (772, 774 and 776) connected with the second land 35 can be mutually close to each other. Accordingly, the reliability of the junction between the first land 34 and the terminal 51 (771, 773 and 775) can be improved.

Further, in comparison with the above-described respective embodiments, as the reflowing heat is excellently applied to the second connection member 771*b*, the connection reliability can also be improved with this application of reflowing heat. Note that in the present embodiment, as in the case of the eighth embodiment, the first connection members 772*b* and the second connection members 771*b* are provided in a zigzag array. In the direction vertical to the array direction of the terminals 51 and along the housing mounting surface of the printed circuit board 31, the second connection member 771*b* is positioned closer to the second land 35 than the first connection member 772*b*. Accordingly, the reflowing heat is further excellently applied to the second connection member 771*b*.

Further, in the present embodiment, as described above, as the first connection members 772*b* and the second connection members 771*b* are provided in a zigzag array, crosstalk is suppressed although the third parallel member 771*a* is positioned farther away from the housing mounting surface of the printed circuit board 31 than the first parallel member 772*a*. However, in the arrangement where the third parallel member 771*a* is positioned farther away from the housing mounting surface of the printed circuit board 31 than the first parallel member 772*a*, there are not a few cross positions between the terminal 51 (771, 773 and 775) connected with the first land 34 and the terminal 51 (772, 774 and 776) connected with the second land 35. Accordingly, the structure shown in the eighth embodiment is more preferable in the point of suppression of crosstalk.

Eleventh Embodiment

Figure 72:
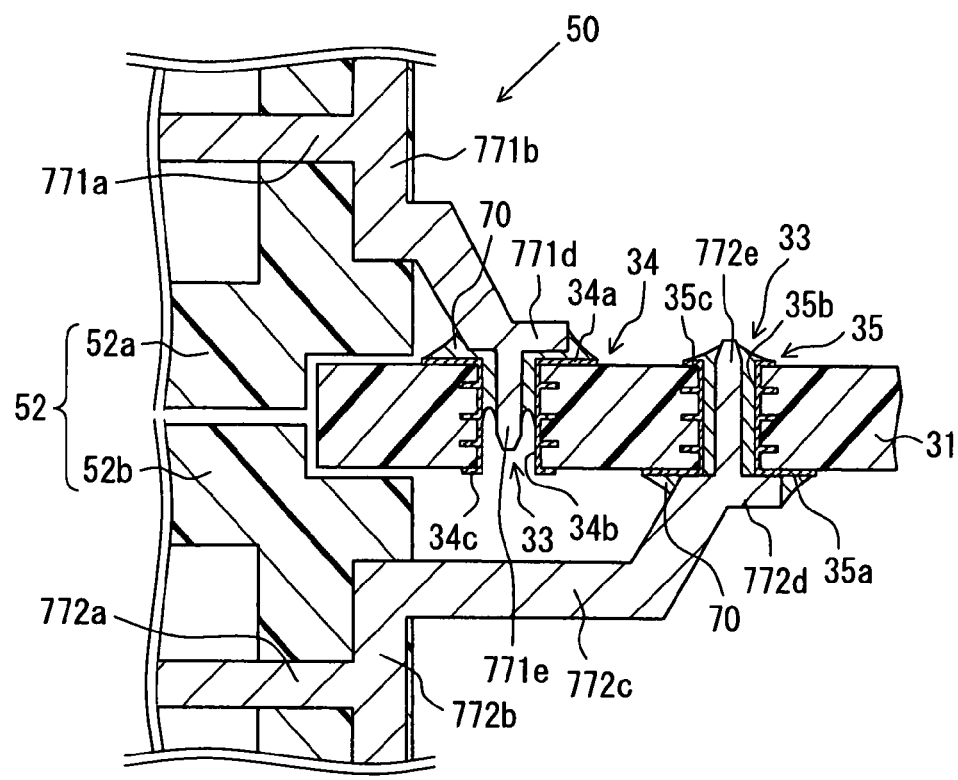
FIG. 72 is an expanded cross-sectional view of the peripheral portion of the connector mounted on the printed circuit board in the electronic control device according to a fifth embodiment.
Figure 73:
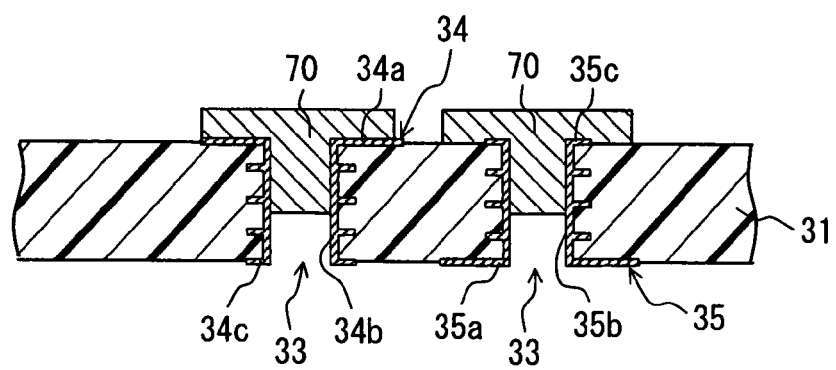
FIG. 73 is a cross-sectional view showing the coating process.

Next, an eleventh embodiment of the present invention will be described based on FIGS. 72 and 73. FIG. 72 is an expanded cross-sectional view of the peripheral portion of the connector mounted on the printed circuit board in the electronic control device according to the tenth embodiment. FIG. 73 is a cross-sectional view showing the coating process. Note that FIG. 72 corresponds to FIG. 57 shown in the seventh embodiment.

The electronic control device according to the eleventh embodiment has many commonalities with those in the above-described respective embodiments, accordingly, the detailed explanations of such commonalities will be omitted, and the difference will be mainly described. Further, in the present embodiment, constituent elements identical to those in the seventh embodiment have the same reference numerals.

In the above-described respective embodiments, the housing 52 is mounted on only one surface of the printed circuit board 31. On the other hand, in the present embodiment, the housing 52 is mounted on both surfaces of the printed circuit board 31, and a terminal held in one housing is connected with the first land 34, and a terminal held in the other housing is connected with the second land 35. As a feature of the present embodiment, in the terminal connected with the first land 34 and the terminal connected with the second land 35, the end of the insertion mounting member of the one terminal is provided in the same position as the rear surface of the housing mounting surface or a position between the housing mounting surface and its rear surface while it is inserted in the through hole 33. Further, the end of the insertion mounting member of the other terminal is projected to the rear surface side of the mounting surface of the corresponding main body.

FIG. 72 shows an example of the structure. In FIG. 72, the structure is the same as that shown in the above described embodiments except that two housings 52 are used as a housing to hold the terminal connected with the first land 34 and a housing to hold the terminal connected with the second land 35. More particularly, as one housing 52, a housing 52a is mounted on one surface of the printed circuit 31. In the housing 52a, the terminals 771 connected with the first lands 34 on the closer side to the housing 52 (one end surface of the printed circuit board 31) are arrayed. Further, as the other housing 52, a housing 52b is mounted on the rear surface of the mounting surface of the housing 52a of the printed circuit board 31. In the housing 52b, the terminals 772 connected with the second lands 35 are arrayed. The terminals 51 (771 and 772) has the surface mounting members 771d and 772d and the insertion mounting members 771e and 772e as mounting members for the lands 34 and 35. In the terminals 771 connected with the first lands 34 and the terminals 772 connected with the second lands 35, the end of the insertion mounting member 771e of the terminal 771 is provided in a position between the mounting surface of the housing 52a and its rear surface while it is inserted in the through hole 33. Further, the end of the insertion mounting member 772e of the terminal 772 is projected to the rear surface (the mounting surface for the housing 52a) side of the mounting surface for the housing 52b while it is inserted in the through hole 33.

In this structure, for example, as shown in FIG. 73, when the solder 70 is applied on portions of the lands 34 and 35 on the side of the mounting surface for the housing 52a (the surface member 34a and the rear surface member 35c) and reflowing is performed from the side of the mounting surface for the housing 52a, as the reflowing heat to the terminal 771 connected with the first land 34 is not disturbed with the terminal 772 connected with the second land 35, the connection reliability can be improved. Further, as the end of the insertion mounting member 771e is not projected through the through hole 33 to the side of the mounting surface for the housing 52b, similar advantages to those shown in the seventh embodiment can be expected.

Further, in the terminal 772 connected with the second land 35, the end of the insertion mounting member 772e is projected through the through hole 33 to the side of the mounting surface for the housing 52a. Accordingly, as shown as the modifications of the seventh embodiment (see FIGS. 62 and 63), the solder 70 on the rear surface member 35c flows in the through hole 33 by the capillary phenomenon and/or gravity. Accordingly, the connection reliability between the wall surface member 35b and the insertion mounting member 772e and between the surface member 35a and the surface mounting member 772d can be ensured.

Further, as in the case of the above-described embodiments, in the terminal 772 connected with the second land 35, the second parallel member 772c is positioned closer to the mounting surface for the housing 52b of the printed circuit board 31 than the first parallel member 772a. Accordingly, when reflowing is performed also from the housing mounting surface side for the housing 52b (reflowing from both surface sides), the influence on the connection reliability due to disturbance of the reflowing heat to the terminal 771 connected with the first land 34 with the terminal 772 connected with the second land 35 can be reduced.

Note that in the present embodiment, the housing 52a and the housing 52b are integrated by e.g. engagement, as one connector 50. Further, the housings 52a and 52b may be fixed using another member as one connector 50.

Note that even when the housing 52a including the terminal 771 connected with the first land 34 is first reflow-mounted on the printed circuit board 31 then the housing 52b including the terminal 772 connected with the second land 35 is reflow-mounted on the printed circuit board 31, the above-described electronic control device 1 can be obtained.

The preferred embodiments of the present invention have been described above, however, the present invention is not limited to the above-described embodiments. Various modifications can be performed within a scope not departing from the subject matter of the present invention.

In the above described respective embodiments, in the direction vertical to the array direction of the terminals 51 and along the housing mounting surface of the printed circuit board 31, the printed circuit board 31 has two lands in different positional relations. One of these lands, the one closer to the housing 52 (closer to the one end surface on the side of the printed circuit board 31 where the connector 50 is mounted) is used as the first land 34, and the other land far from the housing 52 is used as the second land 35. However, the number of lines of plural lands is not limited to two lines. For example, in the lands provided in a three-line array, a land closest to the main body may be used as the first land, and a land farthest away from the main body may be used as the second land. Further, the land closest to the main body may be used as the first land, and a land in the middle line may be used as the second land. Further, the land in the middle line may be used as the first land, and the land farthest away from the main body may be use as the second land.

In the above described respective embodiments, the first parallel member 772a and the third parallel member 771a are provided in different positions in the direction vertical to the housing mounting surface of the printed circuit board 31. The first parallel members 772a are provided in at least one-step array, and the third parallel members 771a are provided in at least one-step array, with respect to the housing 52. However, the first parallel members 772a and the third parallel members 771a may be provided in one line with respect to the housing 52 in the direction vertical to the housing mounting surface of the printed circuit board 31.

In the above described respective embodiments, the connector 50 is shown as an example of an electronic component, and the electronic control device 1 in which the connector 50 is mounted on the printed circuit board 31 is shown as an example of an electronic device in which electronic components are mounted on a printed circuit board. However, the above-described structure can be employed as long as an electronic component has plural terminals extended from a main body, and equivalent or similar advantages to those shown in the above-described respective embodiments can be expected. For example, the structure and the manufacturing method may be applied to other electronic component 32 (e.g., a microcomputer) than the connector 50 shown in FIG. 50.

Further, in the above described respective embodiments, the end of the terminal 51 on the side mounted on the printed circuit board 31 is extended from one surface of the housing 52 (main body) of the connector 50 (electronic component). However, even in a structure where the end of the terminal on the side mounted on the printed circuit board 31 is extended from plural surfaces of the main body, the above-described structure and the manufacturing method can be employed.

In the above described respective embodiments, the power terminals 771 and 772 and the signal terminals 773 to 776 are included in the terminals 51. However, the types of the terminal 51 are not particularly limited. The terminals 51 may include any other type of terminals as long as the terminals 51 include at least a terminal connected with the first land 34 and a terminal connected with the second land 35.

In the above described respective embodiments, the electronic control device 1 has a non-watertight structure. However, the invention is applicable to an electronic control device having a watertight structure.

In the above described respective embodiments, the solder 70 is filled in the through holes 33 in the coating process. However, when the surface members 34a and 35a and the wall surface members 34b and 35b are integrally formed as lands 34 and 35, it may be arranged such that the solder 70 is not filled in the through holes 33 but provided only on the surface members 34a and 35a. In this case, in the reflow process, the solder 70 on the surface members 34a and 35a flows into the through holes 33 by the capillary phenomenon/gravity, thereby the wall surface members 34b and 35b and the insertion mounting members 771e and 772e are solder-bonded. However, since it is difficult to ensure excellent junction status between the surface members 34a and 35a and the surface mounting members 771d and 772d and between the fall surface members 34b and 35b and the insertion mounting members 771e and 772e only with the solder 70 on the surface members 34a and 35b, it is preferable as described above that the solder 70 is filled in the through holes 33 in the coating process.

Figure 74A:
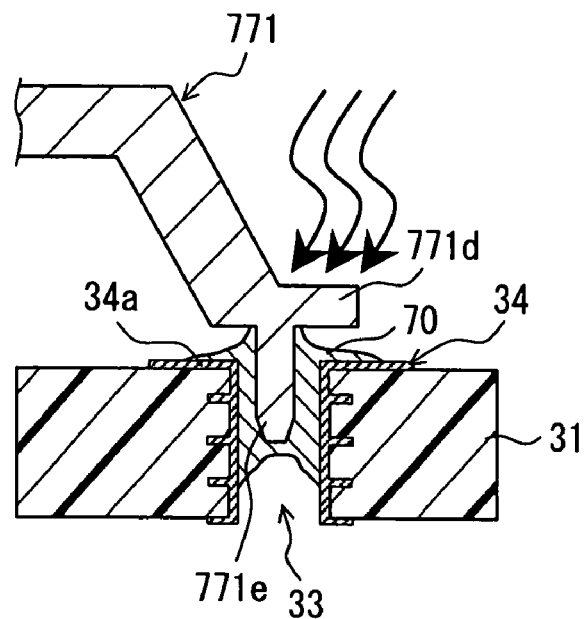
FIG. 74A is a cross-sectional view as a comparative example.
Figure 74B:
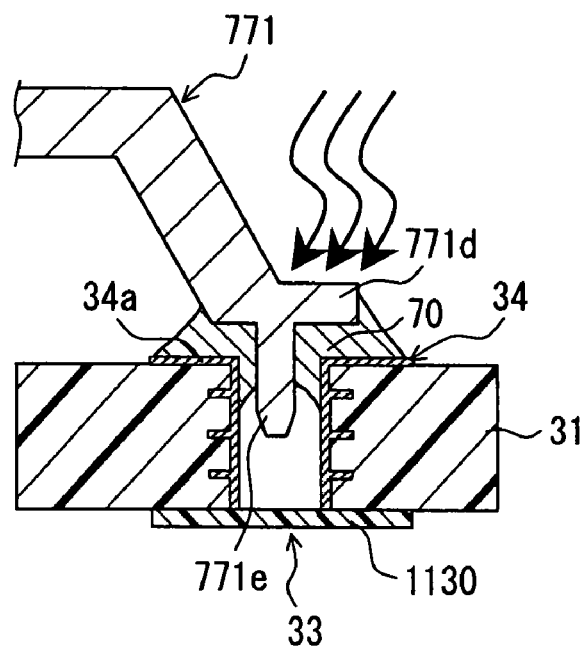
FIG. 74B is a cross-sectional view showing a modification.

In the above described respective embodiments, the solder 70 is filled in the through holes 33 in the coating process. In this manner, the solder 70 can be easily filled in the through holes 33. However, it is conceivable that as shown in e.g. FIG. 74A, upon reflow-mounting, when the terminal 771 is floated, the contact area between the surface mounting member 771d and the solder 70 is reduced and the connection reliability is lowered. When the terminal 771 is floated upon reflow-mounting, as shown in e.g. FIG. 74B, after the coating process, a cover member 1130 (e.g., a seal member having thermal resistance) may be fixed to the rear surface side of the housing mounting surface of the printed circuit board 31 so as to cover the openings of the through holes 33. In this case, the air enclosed in the through holes 33 is expanded with the reflowing heat, and the solder 70 in the through holes 33 is pushed up toward the housing mounting surface side. Accordingly, the contact area between the solder 70 and the mounting members (the surface mounting member 771d and the insertion mounting member 771e) of the terminal 771 can be ensured, and by extension, the connection reliability can be ensured. Note that when the cover member 1130 is remained fixed to the printed circuit board 31, the air in the through holes 33 may be expanded and contracted by temperature changes in the environment, which may influence the connection reliability. Accordingly, it is preferable that the cover member 1130 is removed after the reflowing. FIGS. 74A is a cross-sectional view as a comparative example. FIG. 74B is a cross-sectional view showing a modification.

The above disclosure has the following aspects.

According to a first aspect of the present disclosure, an electronic device includes: a printed circuit board having a first side and a second side; and an electronic element having a body and a plurality of terminals. The plurality of terminals is aligned along with an alignment direction. The electronic element is disposed on the first side of the printed circuit board. The printed circuit board further includes a plurality of through holes and a plurality of lands. Each through hole penetrates the printed circuit board from the first side to the second side. Each terminal is coupled with a corresponding land through a solder. The plurality of lands includes at least one surface land disposed on the first side and an insertion land integrally disposed on a sidewall of the through hole and on a periphery around the through hole. The plurality of terminals includes a branch terminal having an insertion member and a surface member. The insertion member is inserted in the through hole in such a manner that the insertion member is coupled with the insertion land through the solder, which is supplied from the first side. The surface member is coupled with the surface land through the solder. The surface member is substantially parallel to a surface of the printed circuit board. The insertion member is perpendicular to the surface of the printed circuit board. The insertion member extends from a part of the surface member, which faces the surface land and disposed above the through hole.

In the above device, since the insertion member provides to position the electronic element on the printed circuit board, the connection reliability between the electronic element and the printed circuit board is improved. Since the solder is supplied in the through hole by, for example, a screen printing method, a flow soldering process is not necessary. Thus, the packing density can be improved.

Alternatively, the branch terminal may further include a plurality of long branch terminals and a plurality of short branch terminals. Each long branch terminal includes a long insertion member and a first surface member, and each short branch terminal includes a short insertion member and a second surface member. The short insertion member has a second end in the through hole, the second end which is disposed on a same plane as the second side, or disposed between the first side and the second side. The long insertion member has a first end, which protrudes from the second side. The number of the plurality of long branch terminals is smaller than the number of the plurality of short branch terminals.

Further, at least one of the plurality of long branch terminals may have a distance between the body and the long insertion member, the distance which is larger than a distance between the body and each short insertion member.

Further, at least one of the plurality of long branch terminals may provides a reinforcing terminal, which reinforces a connection between the electronic element and the printed circuit board, and the reinforcing terminal does not provide electric connection between the electronic element and the printed circuit board.

Alternatively, the insertion member may have an end in the through hole, the end which is disposed on a same plane as the second side, or disposed between the first side and the second side. Further, the solder disposed between the insertion member and the insertion land in the through hole may have an arc shape, which dents toward the first side, and a distance between the end of the insertion member and the second side is smaller than a distance between a bottom of the arc shape of the solder and the second side.

Alternatively, the plurality of lands may further include a plurality of surface lands disposed on the first side, and the plurality of surface lands is arranged to be a zigzag pattern along with the alignment direction. Further, the plurality of surface lands may include a closest surface land, which is the closest to the body. The closest surface land is coupled with a corresponding terminal. The corresponding terminal protrudes from the body at a first position. Another terminal protrudes from the body at a second position, and a distance between the first position and the first side is equal to or larger than a distance between the second position and the first side. Further, at least one of the plurality of terminals may have a first end and a second end. The first end is coupled with a corresponding land through the solder. The second end is coupled with an external connector so that the electronic element provides a connector. The second end has a multi-stage arrangement with a plurality of stages, which are arranged in a direction perpendicular to the surface of the printed circuit board. The zigzag pattern of the plurality of surface lands has a multi-stage arrangement with a plurality of stages, which are arranged in a direction parallel to the surface of the printed circuit board, and the number of the plurality of stages of the second end is equal to the product of an integer equal to or larger than two and the number of the plurality of stages of the zigzag pattern.

According to a second aspect of the present disclosure, an electronic device includes: a printed circuit board having a first side and a second side; and an electronic element having a body and a plurality of terminals. The electronic element is disposed on the first side of the printed circuit board. The printed circuit board further includes a plurality of through holes and a plurality of lands. Each through hole penetrates the printed circuit board from the first side to the second side. Each terminal is coupled with a corresponding land through a solder. At least one of the lands includes a surface land disposed on the first side and an insertion land integrally disposed on a sidewall of the through hole and on a periphery around the through hole. The plurality of terminals includes a branch terminal having an insertion member and a surface member. The insertion member is inserted in the through hole in such a manner that the insertion member is coupled with the insertion land through the solder, which is supplied from the first side. The surface member is coupled with the surface land through the solder, and the insertion member has an end in the through hole, which is disposed on a same plane as the second side, or disposed between the first side and the second side.

In the above device, since the insertion member provides to position the electronic element on the printed circuit board, the connection reliability between the electronic element and the printed circuit board is improved. Since the solder is supplied in the through hole by, for example, a screen printing method, a flow soldering process is not necessary. Thus, the packing density can be improved.

According to a third aspect of the present disclosure, an electronic device includes: a printed circuit board having a first side and a second side; and an electronic element having a body and a plurality of terminals. The electronic element is disposed on the first side of the printed circuit board. The printed circuit board further includes a plurality of through holes and a plurality of lands. Each through hole penetrates the printed circuit board from the first side to the second side. Each terminal is coupled with a corresponding land through a solder. At least one of the lands includes a surface land disposed on the first side and an insertion land integrally disposed on a sidewall of the through hole and on a periphery around the through hole. The plurality of terminals includes a branch terminal having an insertion member and a surface member. The insertion member is inserted in the through hole in such a manner that the insertion member is coupled with the insertion land through the solder, which is supplied from the first side. The surface member is coupled with the surface land through the solder. The branch terminal further includes a plurality of long branch terminals and a plurality of short branch terminals. Each long branch terminal includes a long insertion member and a first surface member, and each short branch terminal includes a short insertion member and a second surface member. The short insertion member has a second end in the through hole, which is disposed on a same plane as the second side, or disposed between the first side and the second side. The long insertion member has a first end, which protrudes from the second side, and the number of the plurality of long branch terminals is smaller than the number of the plurality of short branch terminals.

In the above device, since the insertion member provides to position the electronic element on the printed circuit board, the connection reliability between the electronic element and the printed circuit board is improved. Since the solder is supplied in the through hole by, for example, a screen printing method, a flow soldering process is not necessary. Thus, the packing density can be improved.

According to a fourth aspect of the present disclosure, a method for manufacturing an electronic device having a printed circuit board and an electronic element, the method includes: preparing the printed circuit board having a first side and a second side, wherein the preparing the printed circuit board includes: forming a through hole in the printed circuit board to penetrate the printed circuit board from the first side to the second side; forming a surface land on the first side; and forming an insertion land on a sidewall of the through hole and on a periphery around the through hole; preparing the electronic element having a body and a plurality of terminals, wherein the preparing the electronic element includes: forming a branch terminal as one of the terminals on the electronic element; forming an insertion member in the branch terminal, the insertion member being to be inserted in the through hole and to be coupled with the insertion land; and forming a surface member in the branch terminal, the surface member being to be disposed on the surface land and to be coupled with the surface land; applying a solder, which includes: forming a solder on the surface land by a screen printing method; and inserting the solder in the through hole from the first side by the screen printing method so that the solder is formed on at least a part of the insertion land; and reflowing the solder, which includes: arranging the electronic element on the first side; inserting the insertion member in the through hole from the first side; and heating the solder to melt the solder so that the surface member is bonded to the surface land with the solder and the insertion member is bonded to the insertion land with the solder.

The above method provides the electronic device. In the device, since the insertion member provides to position the electronic element on the printed circuit board, the connection reliability between the electronic element and the printed circuit board is improved. Since the solder is supplied in the through hole by, for example, a screen printing method, a flow soldering process is not necessary. Thus, the packing density can be improved.

Alternatively, the screen printing method may be performed with a plurality of screens, each of which has a different mask shape. The applying the solder includes: filling a solder paste in the through hole by using a first screen; and applying the solder paste on the surface land and over the through hole by using a second screen. The first screen has a first opening corresponding to the through hole. The second screen has a second opening corresponding to the through hole, and the second opening is larger than the first opening so that the first opening is included in the second opening when the first screen is overlapped on the second screen.

Alternatively, during the reflowing the solder and after the reflowing the solder, a top of the insertion member in the through hole may be disposed on a same plane as the second side, or disposed between the first side and the second side.

Further, the method may further include: covering a second opening of the through hole on the second side with an insulation member before the reflowing the solder; and removing the insulation member after the reflowing the solder. Furthermore, the insulation member may include a ventilation portion, which corresponds to the second opening of the through hole, and the ventilation portion provides to ventilate air from an outside of the printed circuit board into the through hole without passing the solder paste.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An electronic device comprising:
   a printed circuit board having a first side and a second side; and
   an electronic element having a body and a plurality of terminals, wherein the plurality of terminals is aligned along with an alignment direction,
   the electronic element is disposed on the first side of the printed circuit board,
   the printed circuit board further includes a plurality of through holes and a plurality of lands,
   each through hole penetrates the printed circuit board from the first side to the second side,
   each terminal is coupled with a corresponding land through a solder,
   the plurality of lands includes at least one surface land disposed on the first side and an insertion land integrally disposed on a sidewall of the through hole and on a periphery around the through hole,
   the plurality of terminals includes a branch terminal having an insertion member and a surface member,
   the insertion member is inserted in the through hole in such a manner that the insertion member is coupled with the insertion land through the solder, which is supplied from the first side,
   the surface member is coupled with the surface land through the solder,
   the surface member is substantially parallel to a surface of the printed circuit board,
   the insertion member is perpendicular to the surface of the printed circuit board, and
   the insertion member extends from a part of the surface member, which faces the surface land and disposed above the through hole, wherein
   the insertion member and the surface member provide a T-shape, and
   the branch terminal is a stamped terminal.

2. The device according to claim 1, wherein
   the part of the surface member is disposed at a center of the surface member.

3. The device according to claim 1, wherein
   the insertion member has an end in the through hole, the end which is disposed on a same plane as the second side, or disposed between the first side and the second side.

4. The device according to claim 1, wherein
   the electronic element further includes a positioning pin for positioning the electric element on the first side of the printed circuit board,
   the printed circuit board further includes a positioning through hole,
   the positioning pin is inserted in the positioning through hole, and
   the positioning pin has an end, which protrudes from the second side.

5. The device according to claim 1, wherein
   the branch terminal further includes a plurality of long branch terminals and a plurality of short branch terminals,
   each long branch terminal includes a long insertion member and a first surface member, and each short branch terminal includes a short insertion member and a second surface member,
   the short insertion member has a second end in the through hole, the second end which is disposed on a same plane as the second side, or disposed between the first side and the second side,
   the long insertion member has a first end, which protrudes from the second side, and
   the number of the plurality of long branch terminals is smaller than the number of the plurality of short branch terminals.

6. The device according to claim 1, wherein
   the plurality of lands further includes a plurality of surface lands disposed on the first side, and
   the plurality of surface lands is arranged to be a zigzag pattern along with the alignment direction.

7. The device according to claim 1, wherein
   the surface land corresponding to the branch terminal is disposed near the through hole, in which the branch terminal is inserted, and
   the surface land and the insertion land are integrated into one body on the first side.

8. The device according to claim 1, wherein
   the surface land corresponding to the branch terminal is separated from the insertion land corresponding to the same branch terminal.

9. The device according to claim 1, wherein
   the surface land corresponding to the branch terminal includes a first side surface land and a second side surface land, and
   the first side surface land is larger than the second side surface land.

10. The device according to claim 1, wherein
    each terminal provides the branch terminal.

11. The device according to claim 1, wherein
    the plurality of terminals includes a surface mounting terminal, which includes only the surface member.

12. The device according to claim 1, wherein
    the branch terminal is prepared in such a manner that a rod member is formed on the body, and bent to provide the branch terminal,
    the surface member has a diameter, which is larger than a diameter of the insertion member.

13. The device according to claim 5, wherein
    each short insertion member has a length, which is smaller than a thickness of the printed circuit board, and
    each long insertion member has a length, which is larger than the thickness of the printed circuit board.

14. The device according to claim 13, wherein
    the length of each long insertion member is equal to or smaller than a total length of the length of each short insertion member and the thickness of the printed circuit board.

15. The device according to claim 5, wherein
at least one of the plurality of long branch terminals is disposed on a periphery of the plurality of terminals in the alignment direction.

16. The device according to claim 5, wherein
at least one of the plurality of long branch terminals is disposed on a middle of the plurality of terminals in the alignment direction.

17. The device according to claim 5, wherein
at least one of the plurality of long branch terminals has a distance between the body and the long insertion member, the distance which is larger than a distance between the body and each short insertion member.

18. The device according to claim 5, wherein
at least one of the plurality of long branch terminals provides a reinforcing terminal, which reinforces a connection between the electronic element and the printed circuit board, and
the reinforcing terminal does not provide electric connection between the electronic element and the printed circuit board.

19. The device according to claim 3, wherein
the solder disposed between the insertion member and the insertion land in the through hole has an arc shape, which dents toward the first side, and
a distance between the end of the insertion member and the second side is smaller than a distance between a bottom of the arc shape of the solder and the second side.

20. The device according to claim 6, wherein
the plurality of surface lands includes a closest surface land, which is the closest to the body,
the closest surface land is coupled with a corresponding terminal,
the corresponding terminal protrudes from the body at a first position,
another terminal protrudes from the body at a second position, and
a distance between the first position and the first side is equal to or larger than a distance between the second position and the first side.

21. The device according to claim 6, wherein
at least one of the plurality of terminals has a first end and a second end,
the first end is coupled with a corresponding land through the solder,
the second end is coupled with an external connector so that the electronic element provides a connector,
the second end has a multi-stage arrangement with a plurality of stages, which are arranged in a direction perpendicular to the surface of the printed circuit board,
the zigzag pattern of the plurality of surface lands has a multi-stage arrangement with a plurality of stages, which are arranged in a direction parallel to the surface of the printed circuit board, and
the number of the plurality of stages of the second end is equal to the product of an integer equal to or larger than two and the number of the plurality of stages of the zigzag pattern.

22. The device according to claim 11, wherein
the surface mounting terminal is sandwiched between a pair of branch terminals in the alignment direction.

23. The device according to claim 10, wherein
the plurality of terminals in the alignment direction has two ends, and
the branch terminal is disposed on each end.

24. The device according to claim 23, wherein
at least one branch terminal is disposed on a middle of the plurality of terminals in the alignment direction, and
the through hole corresponding to the branch terminal disposed on each end has a diameter, which is larger than a diameter of the through hole corresponding to the branch terminal disposed on the middle.

25. The device according to claim 24, wherein
the plurality of terminals further includes a first terminal and a second terminal,
the second terminal has a diameter, which is larger than a diameter of the first terminal, and
the second terminal provides the branch terminal disposed on each end.

26. A method for manufacturing an electronic device having a printed circuit board and an electronic element, the method comprising:
preparing the printed circuit board having a first side and a second side, wherein the preparing the printed circuit board includes:
forming a through hole in the printed circuit board to penetrate the printed circuit board from the first side to the second side;
forming a surface land on the first side; and
forming an insertion land on a sidewall of the through hole and on a periphery around the through hole;
preparing the electronic element having a body and a plurality of terminals, wherein the preparing the electronic element includes:
forming a branch terminal as one of the terminals on the electronic element;
forming an insertion member in the branch terminal, the insertion member being to be inserted in the through hole and to be coupled with the insertion land; and
forming a surface member in the branch terminal, the surface member being to be disposed on the surface land and to be coupled with the surface land;
applying a solder, which includes:
forming a solder on the surface land by a screen printing method; and
inserting the solder in the through hole from the first side by the screen printing method so that the solder is formed on at least a part of the insertion land; and
reflowing the solder, which includes:
arranging the electronic element on the first side;
inserting the insertion member in the through hole from the first side; and
heating the solder to melt the solder so that the surface member is bonded to the surface land with the solder and the insertion member is bonded to the insertion land with the solder, wherein
the insertion member and the surface member are formed so as to provide a T-shape, and
the branch terminal is formed as a stamped terminal.

27. The method according to claim 26, wherein
the screen printing method is performed with a plurality of screens, each of which has a different mask shape,
the applying the solder includes:
filling a solder paste in the through hole by using a first screen; and
applying the solder paste on the surface land and over the through hole by using a second screen,
the first screen has a first opening corresponding to the through hole,
the second screen has a second opening corresponding to the through hole, and the second opening is larger than the first opening so that the first opening is included in the second opening when the first screen is overlapped on the second screen.

28. The method according to claim 26, wherein
during the reflowing the solder and after the reflowing the solder, a top of the insertion member in the through hole is disposed on a same plane as the second side, or disposed between the first side and the second side.

29. The method according to claim 27, wherein
in the forming the printed circuit board, the insertion land and the surface land corresponding to the branch terminal are integrally formed, and
the second opening covers a region including the through hole and the surface land corresponding to the branch terminal.

30. The method according to claim 27, wherein
the first screen has a thickness, which is thinner than a thickness of the second screen.

31. The method according to claim 27, wherein
the applying the solder paste on the surface land and over the through hole further includes applying the solder paste on another surface land on the first side of the printed circuit board, and
the another surface land corresponds to another electronic element, which has no branch terminal.

32. The method according to claim 28, wherein
in the forming the through hole, the through hole has a first opening on the first side and a second opening on the second side, and
the second opening is smaller than the first opening.

33. The method according to claim 28, further comprising:
covering a second opening of the through hole on the second side with an insulation member before the reflowing the solder; and
removing the insulation member after the reflowing the solder.

34. The method according to claim 33, wherein
the insulation member includes a ventilation portion, which corresponds to the second opening of the through hole, and
the ventilation portion provides to ventilate air from an outside of the printed circuit board into the through hole without passing the solder paste.

* * * * *